(12) United States Patent
Takeda et al.

(10) Patent No.: US 10,725,864 B2
(45) Date of Patent: Jul. 28, 2020

(54) MEMORY SYSTEM

(71) Applicant: TOSHIBA MEMORY CORPORATION, Minato-ku (JP)

(72) Inventors: Naomi Takeda, Yokohama (JP);
Masanobu Shirakawa, Chigasaki (JP);
Yoshihiro Ueda, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/352,882

(22) Filed: Mar. 14, 2019

(65) Prior Publication Data

US 2020/0089567 A1    Mar. 19, 2020

(30) Foreign Application Priority Data

Sep. 19, 2018 (JP) .................. 2018-174670

(51) Int. Cl.
| | | |
|---|---|---|
| G06F 11/00 | (2006.01) |
| G11C 29/00 | (2006.01) |
| G06F 11/10 | (2006.01) |
| G06F 12/10 | (2016.01) |
| G11C 29/52 | (2006.01) |

(52) U.S. Cl.
CPC .......... G06F 11/1068 (2013.01); G06F 12/10 (2013.01); G11C 29/52 (2013.01); *G06F 2212/657* (2013.01)

(58) Field of Classification Search
CPC ............. G06F 11/1068; G06F 12/10; G06F 2212/657; G06F 2212/65; G06F 2212/651; G06F 2212/652; G06F 2212/68; G06F 2212/681; G11C 29/52
See application file for complete search history.

(56) References Cited

U.S. PATENT DOCUMENTS

| | | | |
|---|---|---|---|
| 2011/0035774 A1* | 2/2011 | Parker ................ | H04N 5/44543 725/40 |
| 2015/0227400 A1* | 8/2015 | Yamashita ........... | G06F 9/4405 719/318 |
| 2016/0224242 A1 | 8/2016 | Kondo et al. | |
| 2016/0378340 A1* | 12/2016 | Amidi ..................... | G06F 3/061 711/103 |
| 2019/0287593 A1 | 9/2019 | Ueda | |

FOREIGN PATENT DOCUMENTS

| | | |
|---|---|---|
| JP | 2016-143432 | 8/2016 |
| JP | 2019-164848 A | 9/2019 |

* cited by examiner

*Primary Examiner* — Christine T. Tu
(74) *Attorney, Agent, or Firm* — Oblon, McClelland, Maier & Neustadt, L.L.P.

(57) ABSTRACT

According to one embodiment, a memory system includes a nonvolatile memory and a controller. The nonvolatile memory includes a plurality of blocks each including a plurality of layers functioning as a plurality of stages of a shift register, and performs write and read of data by a last-in first-out method. The layers of each block are logically partitioned into a plurality of pages each including a set of adjacent layers. The controller writes a plurality of data portions to which error correction codes are added, to a write destination block. The controller changes a code amount of an error correction code added to a first data portion to be written, on the basis of a position of a page in the write destination block to which the first data portion is to be written.

19 Claims, 39 Drawing Sheets

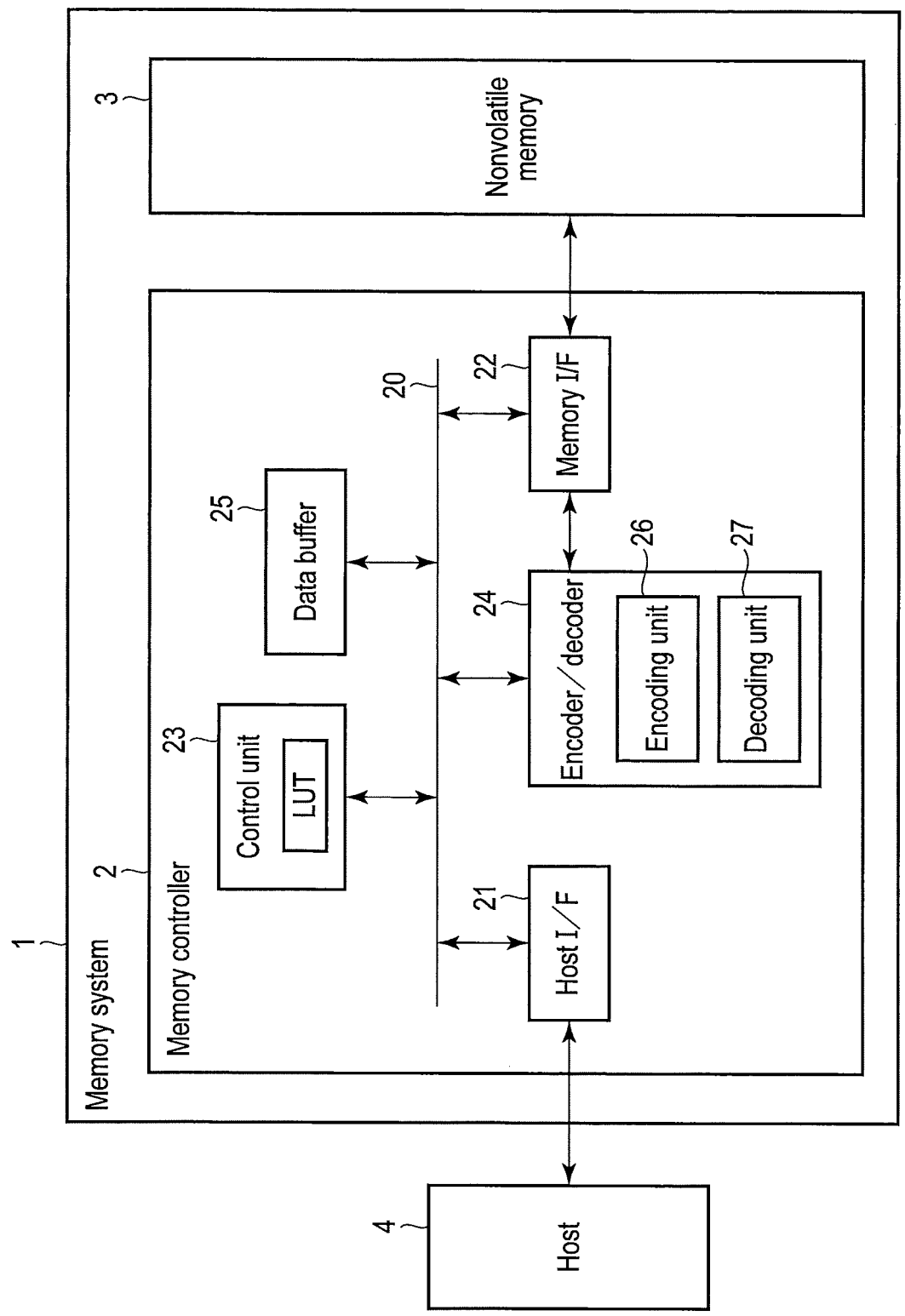
F I G. 1

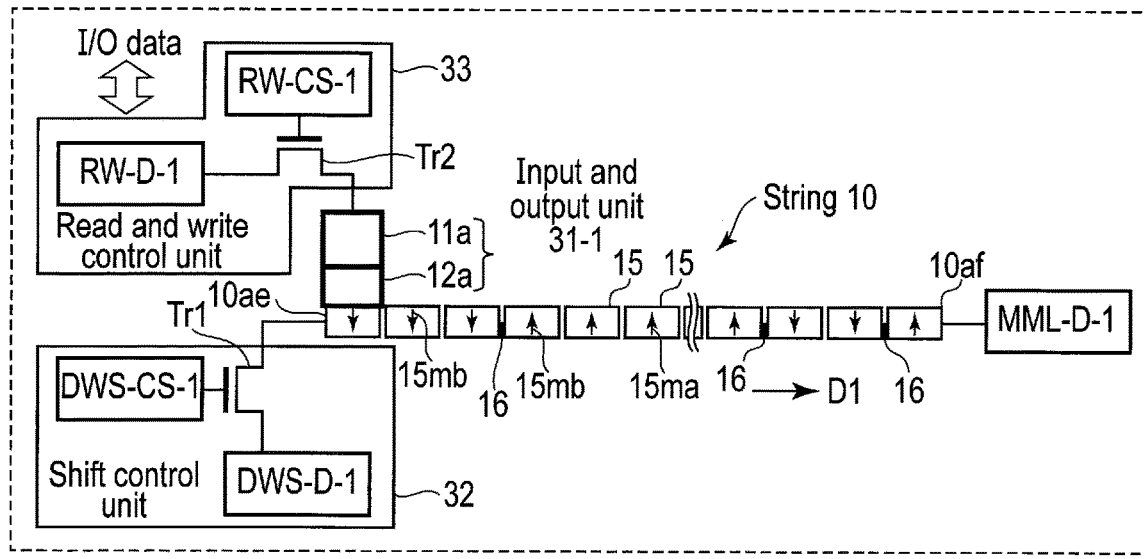
F I G. 2B
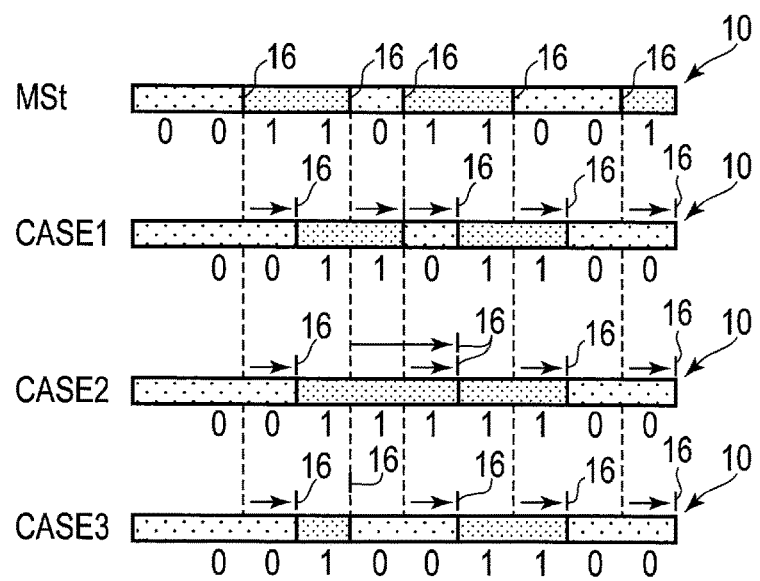
F I G. 2C

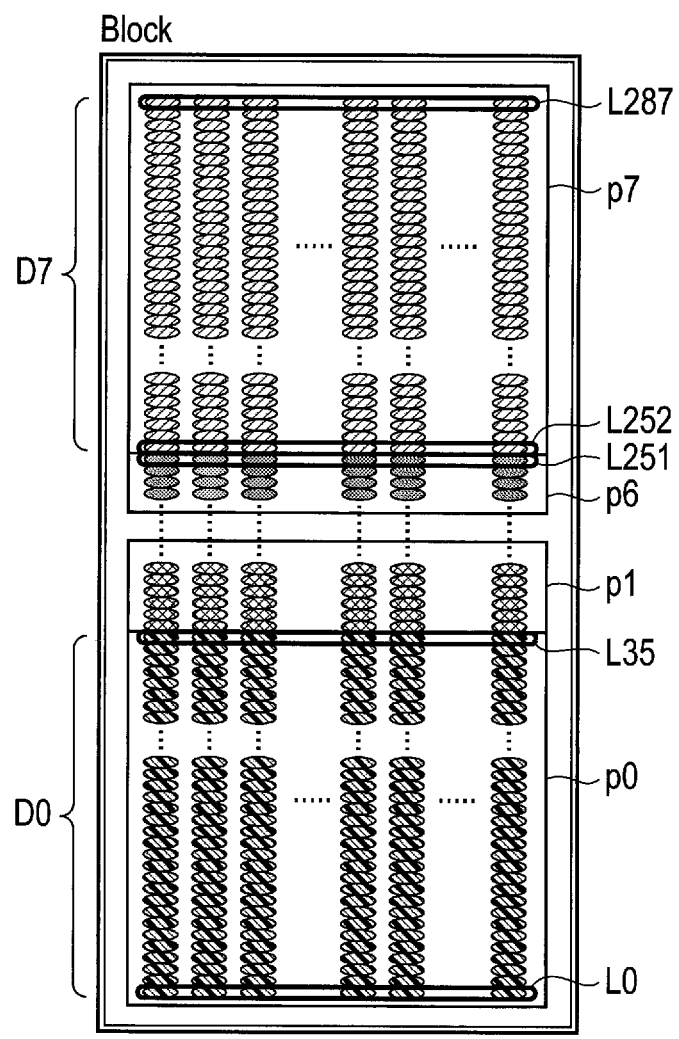
F I G. 3

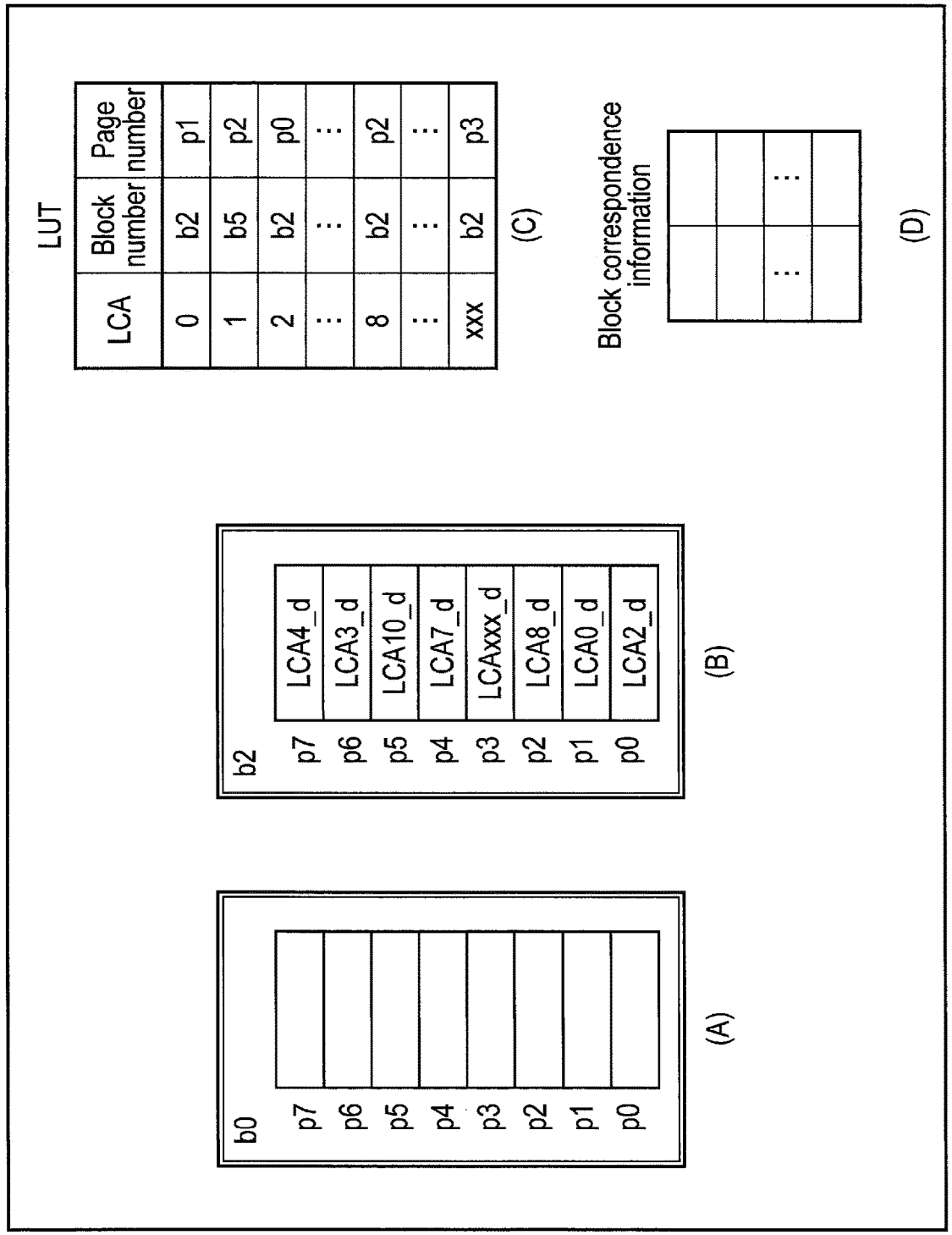
F I G. 12

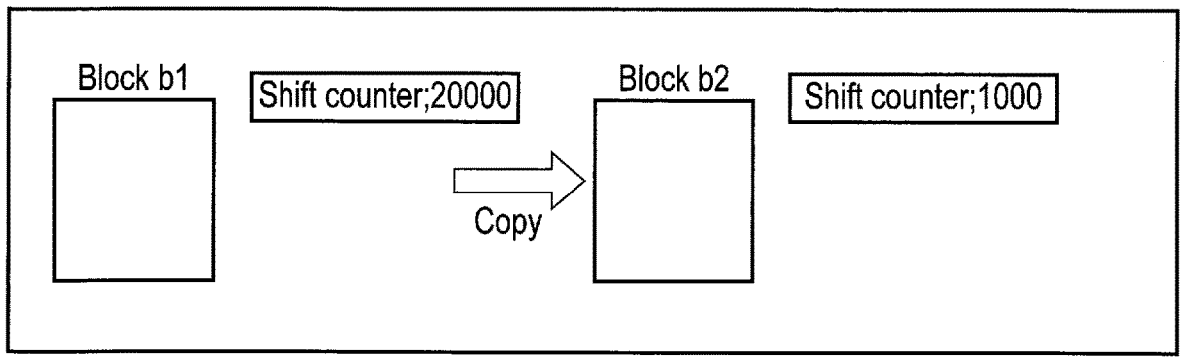
F I G. 15
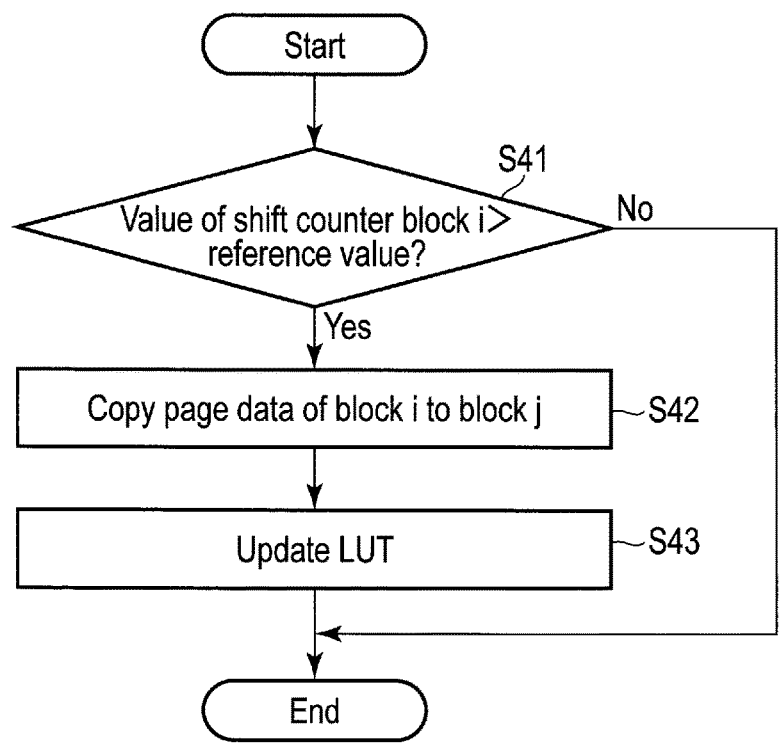
F I G. 16

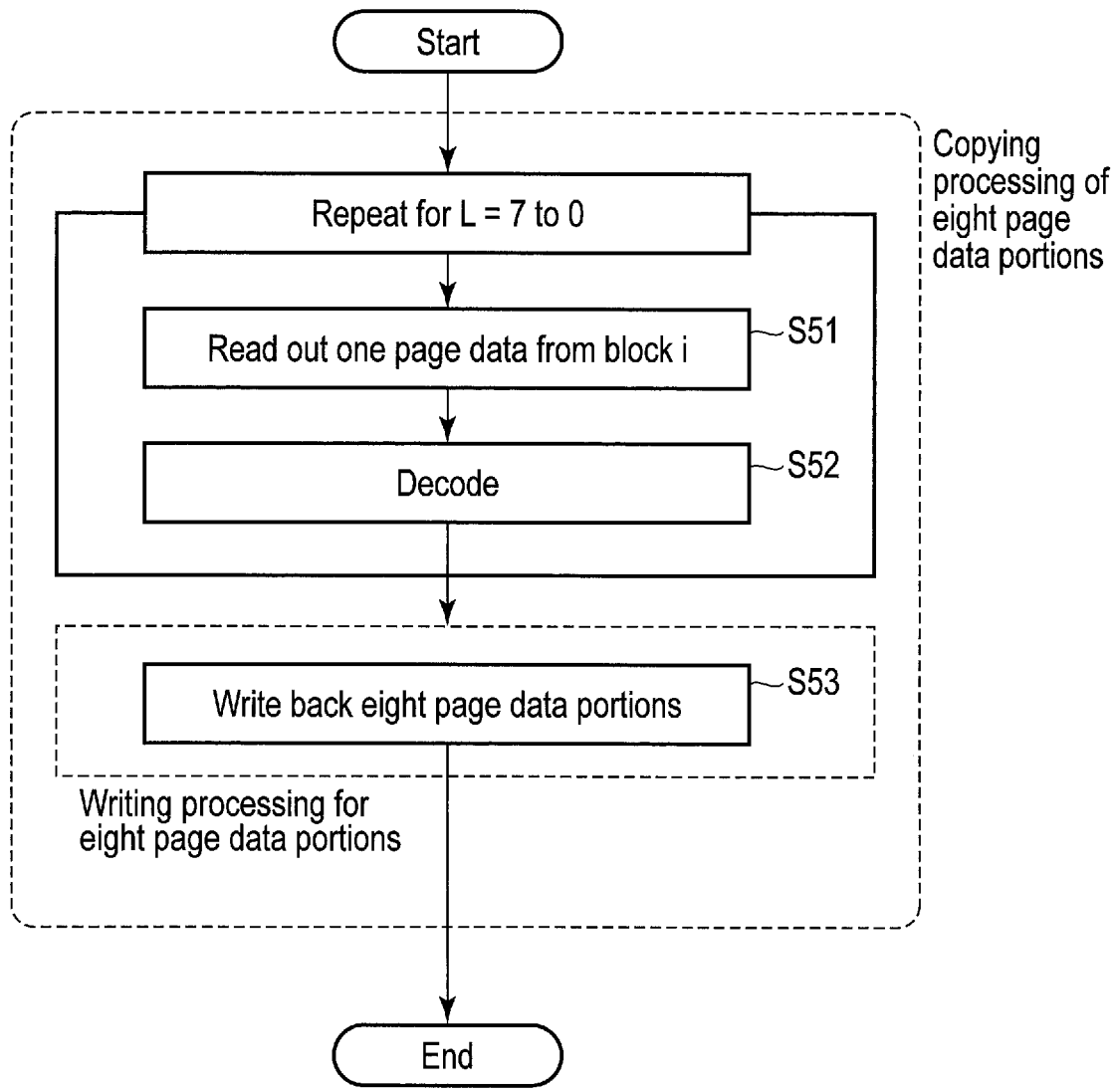
F I G. 17

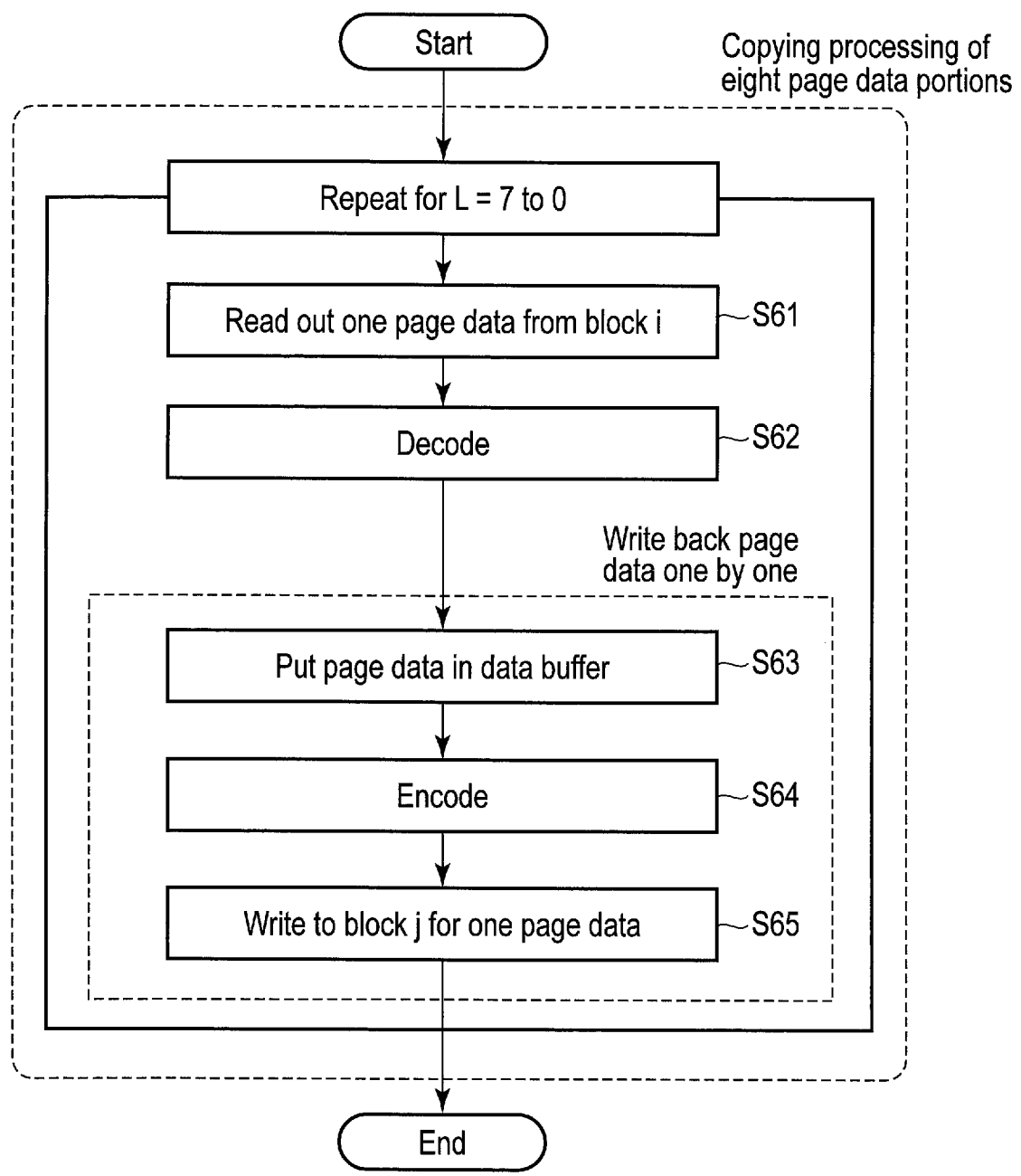
F I G. 18

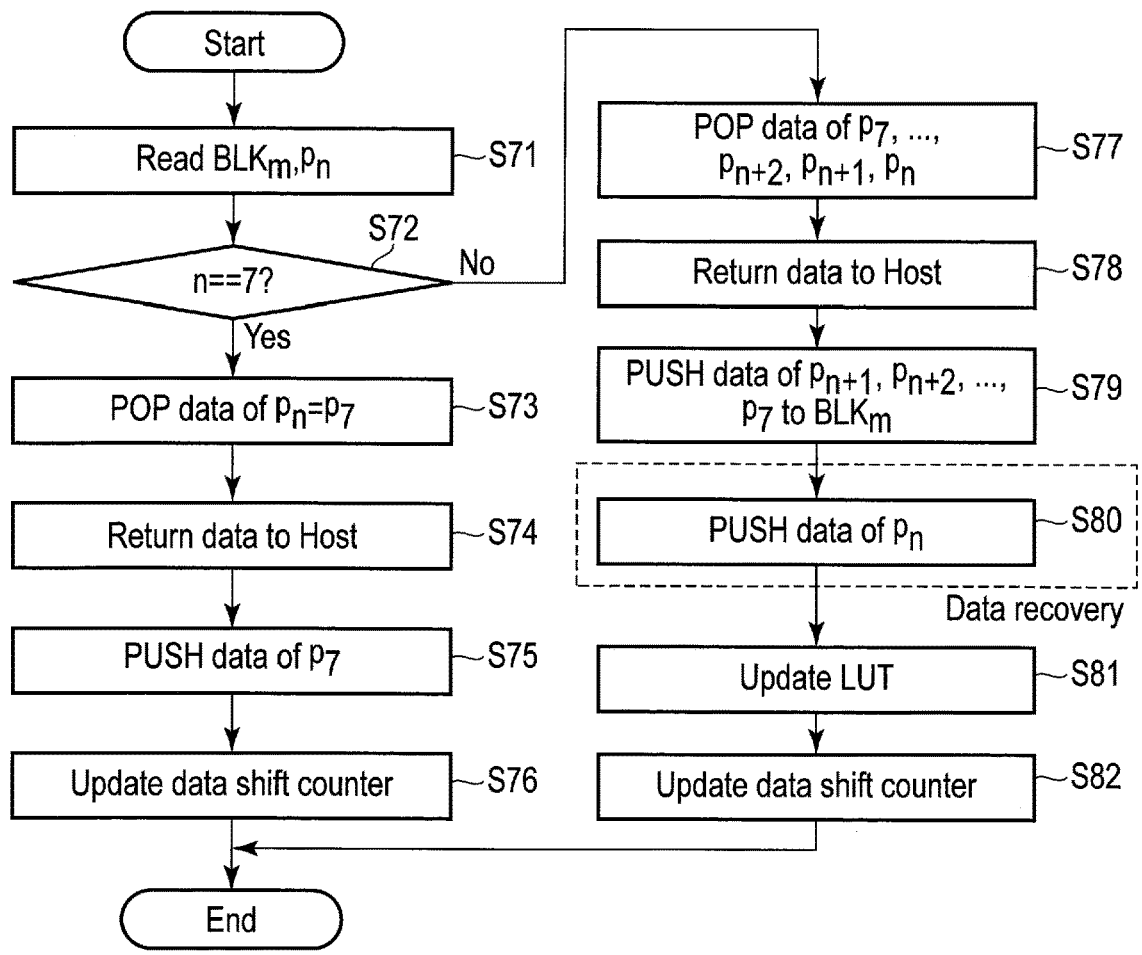
F I G. 20
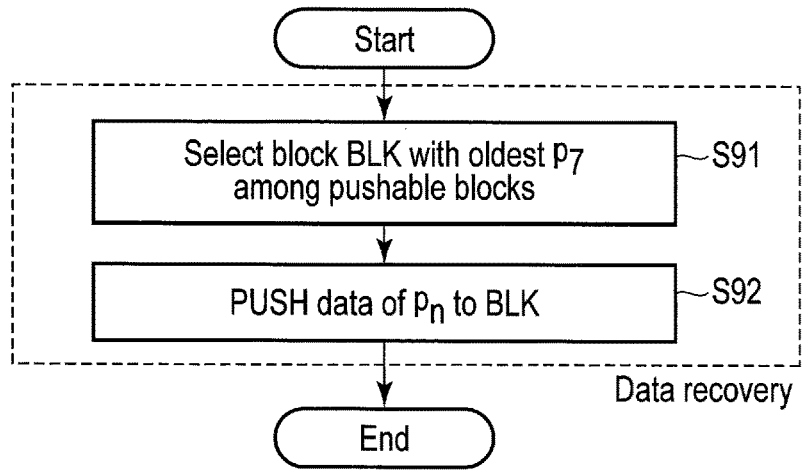
F I G. 21

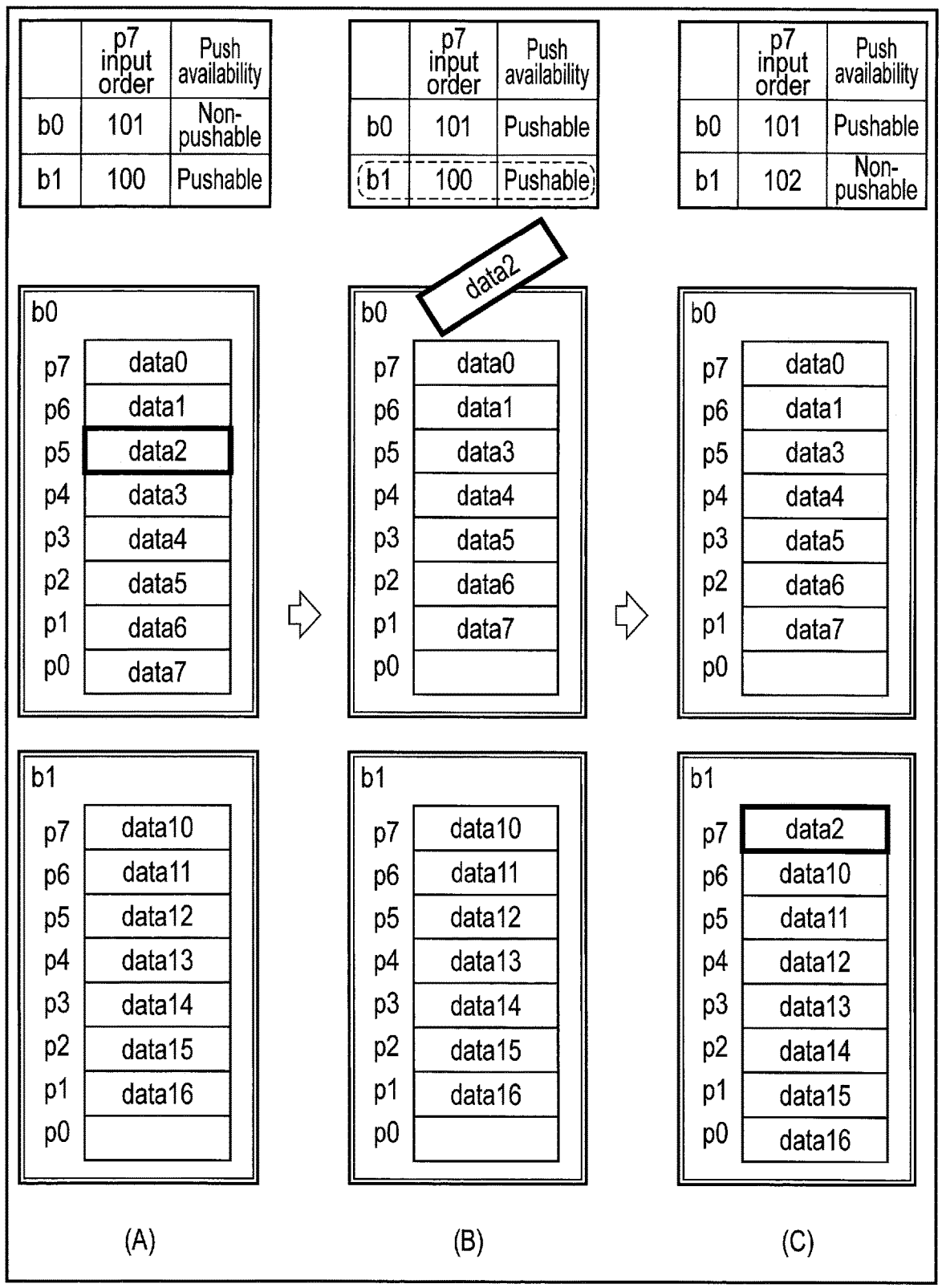
F I G. 22

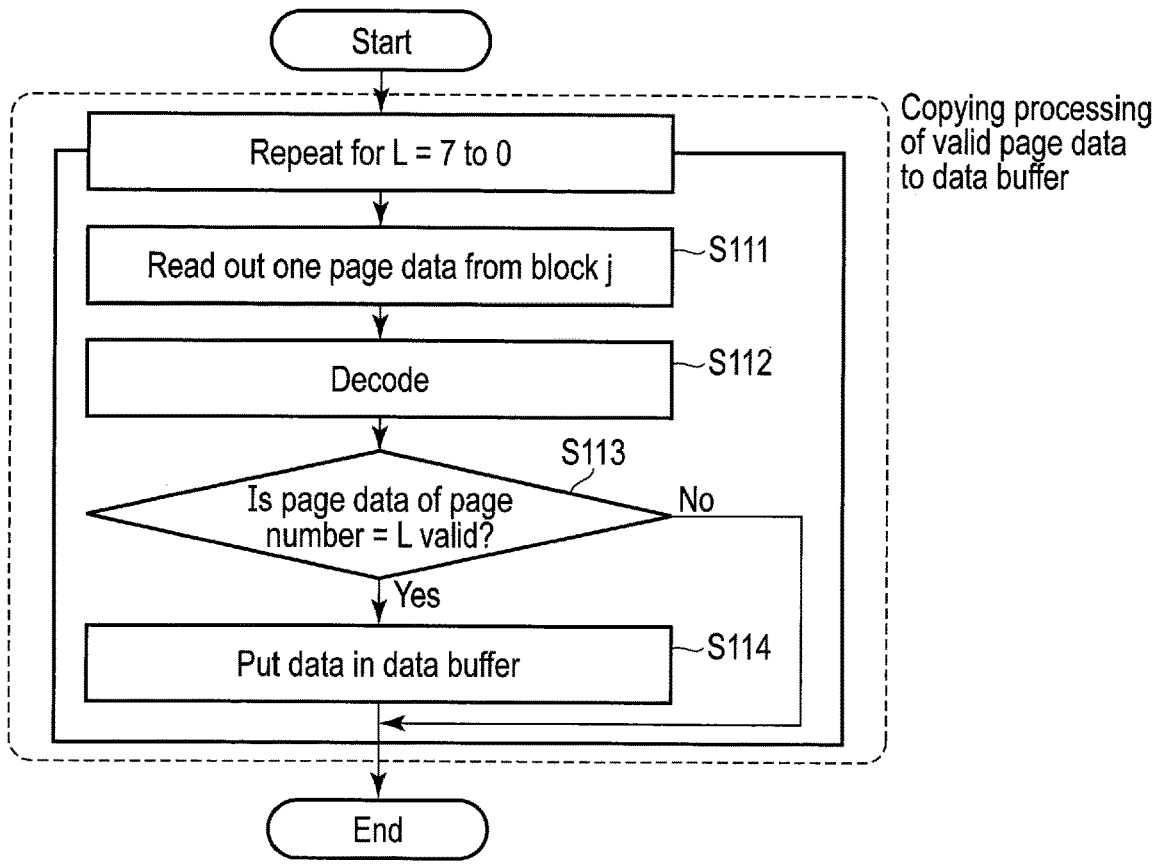
F I G. 27
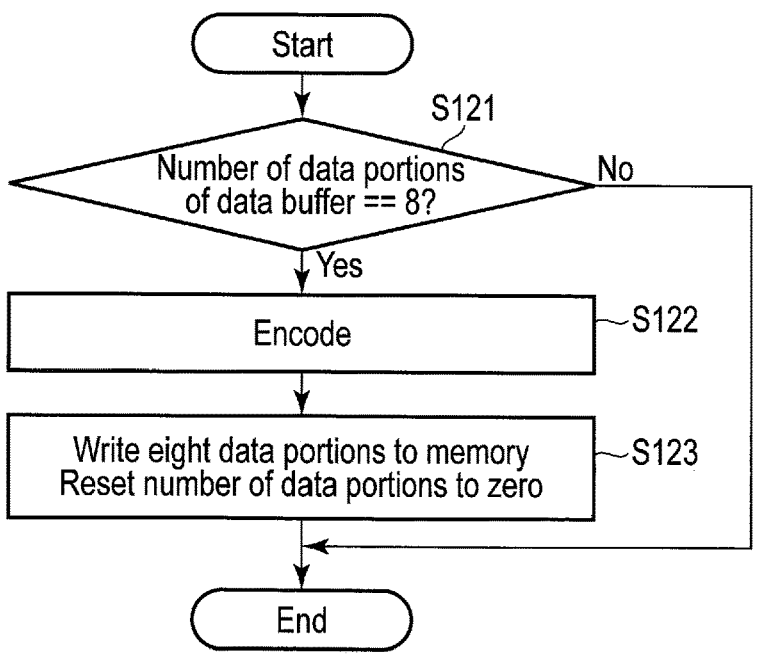
F I G. 28

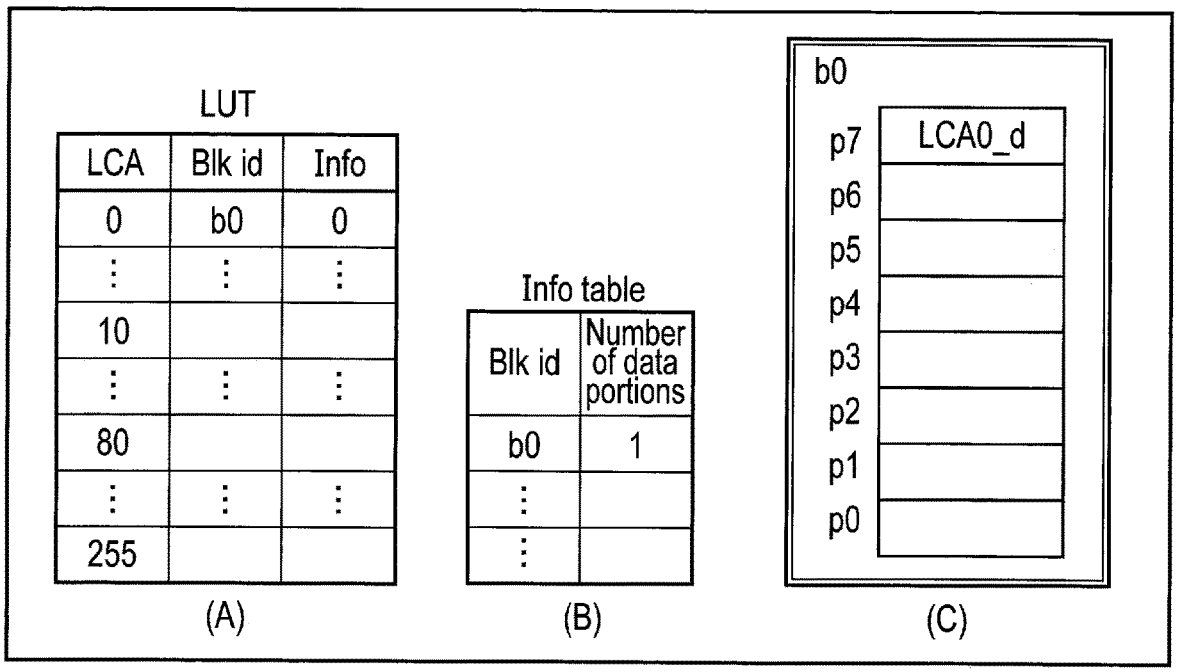
F I G. 38
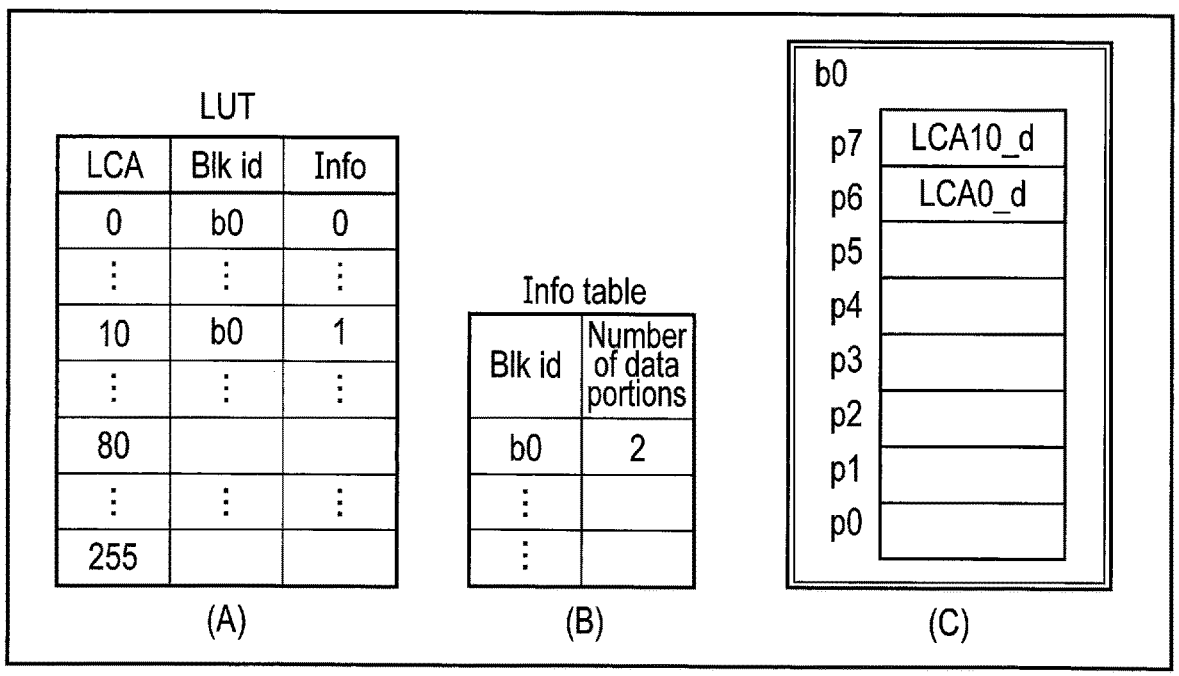
F I G. 39

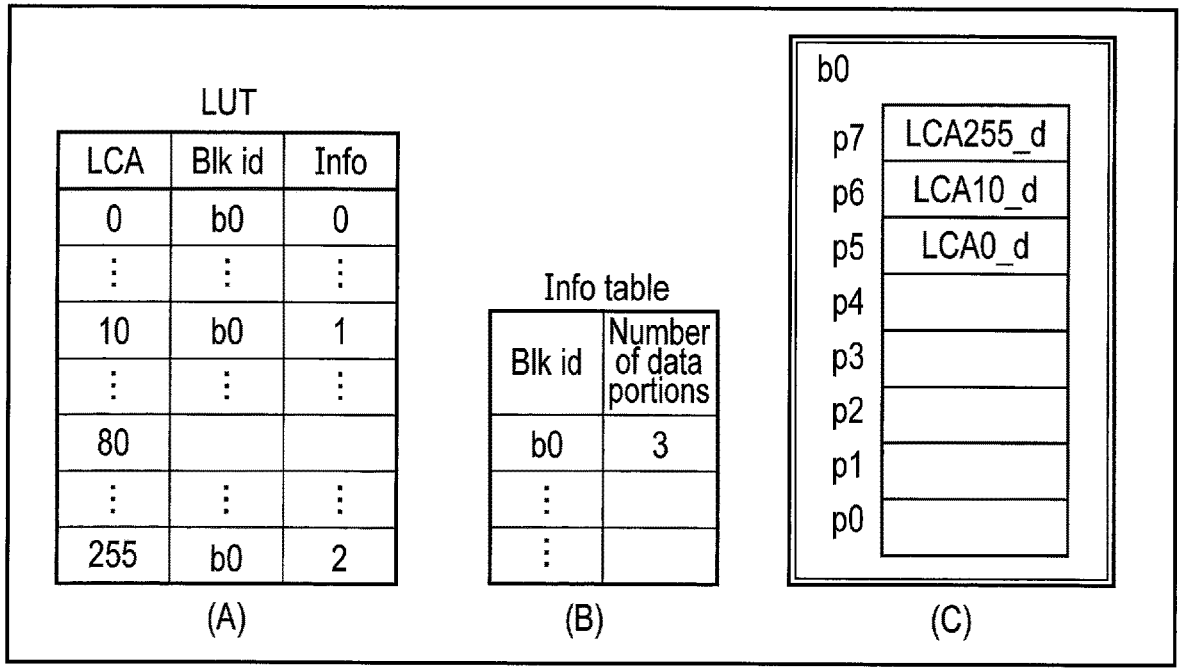
F I G. 42
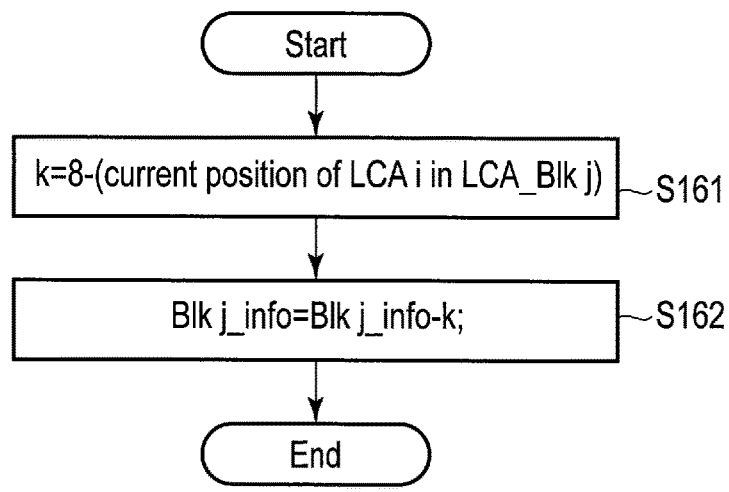
F I G. 43

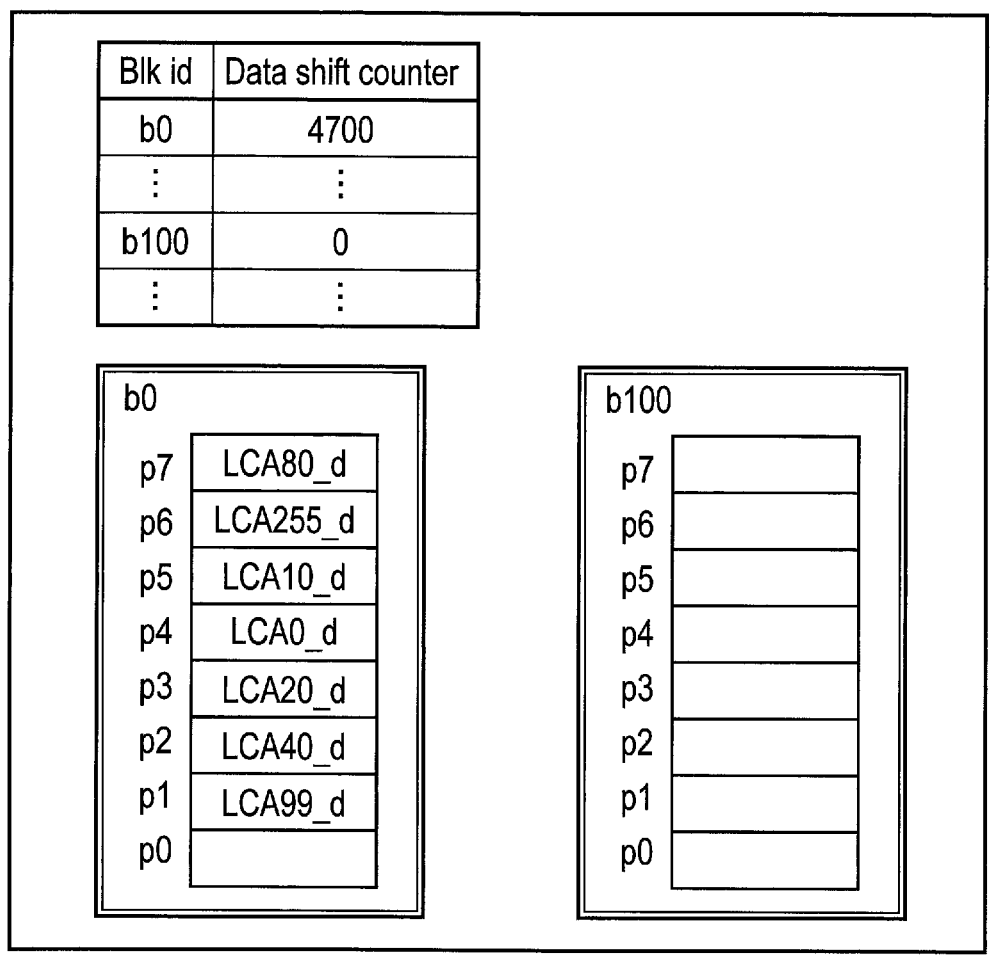
F I G. 44

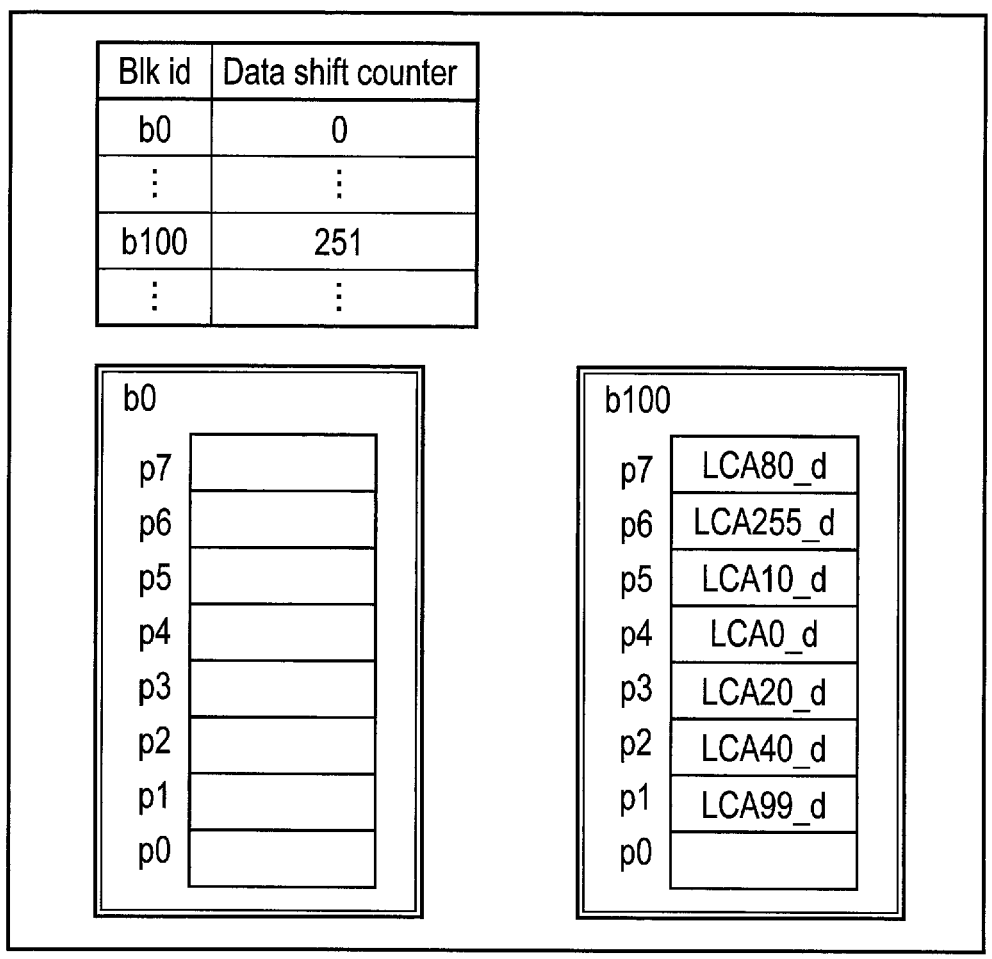
F I G. 45

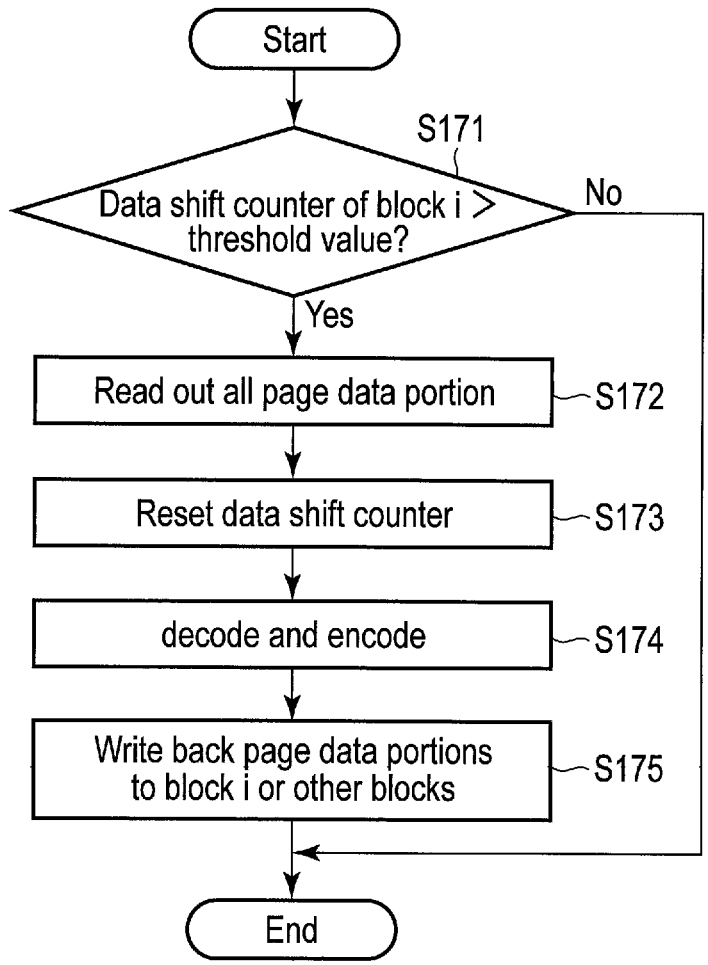
F I G. 46

MEMORY SYSTEM

CROSS-REFERENCE TO RELATED APPLICATIONS

This application is based upon and claims the benefit of priority from Japanese Patent Application No. 2018-174670, filed Sep. 19, 2018, the entire contents of which are incorporated herein by reference.

FIELD

Embodiments described herein relate generally to a control of a nonvolatile memory.

BACKGROUND

In recent years, memory systems including a nonvolatile memory have been widely spread. As one of such memory systems, a solid state drive (SSD) with a NAND flash memory is known.

Recently, non-volatile memories of the type in which write and read of data are carried out by the last-in first-out (LIFO) method are being developed as next-generation nonvolatile memories.

For this reason, there is a demand of a memory system useful for controlling a nonvolatile memory that performs write and read of data by the last-in first-out method.

BRIEF DESCRIPTION OF THE DRAWINGS

FIG. 1 is a block diagram illustrating a configuration example of a memory system according to a first embodiment.

FIG. 2B is a diagram illustrating an exemplary circuit configuration corresponding to one of a plurality of strings included in each block in the cell array.

FIG. 2C is a diagram illustrating a movement of memory states in the string (movement of magnetic domain walls).

FIG. 3 is a diagram illustrating an example of code amount distribution of error correction codes for data portions written in a block.

FIG. 12 is a diagram illustrating LUT updating processing executed before writing a new data portion in the first block of FIG. 11.

FIG. 15 is a diagram illustrating copy processing executed using a block shift counter.

FIG. 16 is a flowchart illustrating a procedure of copy processing executed using values of block shift counters of a plurality of blocks.

FIG. 17 is a flowchart illustrating a procedure of processing of copying data portions from a copy source block to a copy destination block.

FIG. 18 is a flowchart illustrating another procedure of the processing of copying data portions from the copy source block to the copy destination block.

FIG. 20 is a flowchart illustrating a procedure of read processing and write-back processing.

FIG. 21 is a flowchart illustrating a procedure of processing of writing back a data portion to a block with an oldest page p7 among a plurality of blocks.

FIG. 22 is a diagram illustrating an operation of selecting, from among a plurality of blocks, a block to which a read target data portion designated by a host is to be written back.

FIG. 27 is a flowchart illustrating a procedure of a copy operation executed using a data buffer having a size corresponding to a block size.

FIG. 28 is a flowchart illustrating a procedure of an operation of writing eight data portions in a data buffer to a copy destination block.

FIG. 38 is a diagram illustrating content of each of the LUT and the info table in a case where a first data portion is written in a block b0.

FIG. 39 is a diagram illustrating content of the LUT and the info table in a case where a second data portion is written in the block b0.

FIG. 42 is a diagram illustrating content of the LUT and the info table in a case where a data portion read from the block b0 is a data portion not requiring write-back.

FIG. 43 is a flowchart illustrating a procedure of processing for updating the info table.

FIG. 44 is a diagram illustrating an operation of managing a data shift counter for each of the plurality of blocks, the data shift counter indicating the number of times that an oldest data portion among written data portions has been shifted.

FIG. 45 is a diagram illustrating an operation of reading data portions in the block b0 in which a value of the data shift counter exceeds a threshold value and writing back data portions obtained by correcting errors in the read data portions to a block b100.

FIG. 46 is a flowchart illustrating a procedure of a refresh operation for reading data portions in a block in which a value of the data shift counter exceeds the threshold value.

DETAILED DESCRIPTION

Figure 2A:
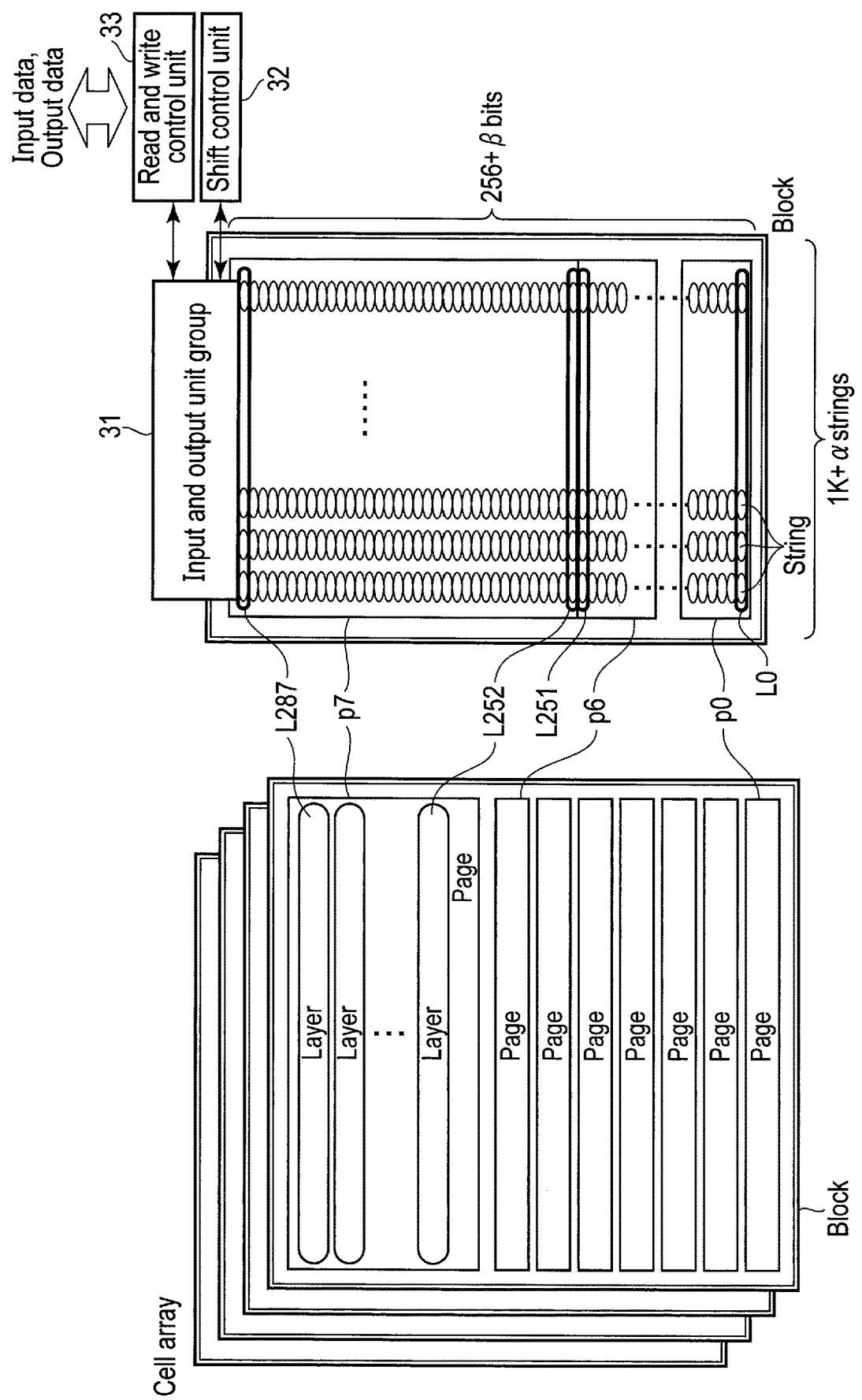
FIG. 2A is a diagram illustrating a configuration example of a cell array in a nonvolatile memory included in the memory system of the first embodiment.

Various embodiments will be described hereinafter with reference to the accompanying drawings.

In general, according to one embodiment, a memory system comprises a nonvolatile memory and a controller. The nonvolatile memory includes a plurality of blocks each including a plurality of layers functioning as a plurality of stages of a shift register. The nonvolatile memory is configured to perform write and read of data for each block by a last-in first-out method by shifting, in a unit of a layer, data stored in individual layers in a first direction from a layer corresponding to a first stage to a layer corresponding to a last stage or in a second direction opposite to the first direction. The controller is configured to write a plurality of data portions to which error correction codes are added, to write destination blocks in the blocks. The layers of each block are logically partitioned into a plurality of pages each including a set of adjacent layers. The controller changes a code amount of an error correction code added to a first data portion to be written, on the basis of a position of a page in the writing destination block where the first data portion is to be stored.

First Embodiment

FIG. 1 illustrates a configuration example of a memory system 1 according to a first embodiment. The memory system 1 includes a controller (memory controller) 2 and a nonvolatile memory 3. The memory system 1 is connectable to a host 4, and FIG. 1 illustrates that the memory system 1 is connected to the host 4. The host 4 is an electronic device such as a personal computer, a server, a portable terminal or the like.

The nonvolatile memory 3 is memory that stores data permanently. The nonvolatile memory 3 is configured to perform write and read of data in a certain capacity unit referred to as a block in a last-in first-out (LIFO) method (also referred to as a first-in last-out method). That is, the nonvolatile memory 3 includes a plurality of blocks. Each block includes a plurality of layers that function as a plurality of stages of a shift register. In other words, one layer functions as one of stages in the shift register. The nonvolatile memory 3 shifts data stored in individual layers in a first direction from a layer corresponding to a first stage to a layer corresponding to a last stage or a second direction opposite to the first direction in a unit of a layer, so as to perform write and read of data for each block by the last-in first-out method.

An example of the type of nonvolatile memory which performs write and read of data by the last-in first-out method is a magnetic domain wall memory. The magnetic domain wall memory is a type of magnetic memory that performs write and read of data while causing a current to flow through a magnetic shift register including a plurality of magnetic domains walls each storing information ("1" or "0") to shift (move) each magnetic domain.

The memory system 1 may be realized as a solid state drive (SSD), or may be realized as a memory card in which the memory controller 2 and the nonvolatile memory 3 are configured as one package.

The memory controller 2 controls writing of data to the nonvolatile memory 3 according to a write request (write command) received from the host 4. Further, the memory controller 2 controls reading of data from the nonvolatile memory 3 according to a read request (read command) received from the host 4.

The memory controller 2 may be implemented by a circuit such as SoC. The memory controller 2 includes a host interface 21, a memory interface 22, a control unit 23, an encoder/decoder 24, and a data buffer 25. The host interface 21, the memory interface 22, the control unit 23, the encoder/decoder 24, and the data buffer 25 are connected to an internal bus 20.

The host interface 21 performs processing according to an interface standard between a host and a device, and outputs a request, user data, and the like received from the host 4, to the internal bus 20. Further, the host interface 21 transmits user data read from the nonvolatile memory 3, a response received from the control unit 23, and the like to the host 4. In the present embodiment, data written to the nonvolatile memory 3 by a write request from the host 4 is referred to as user data.

The memory interface 22 performs a write operation for writing data to the nonvolatile memory 3 based on an instruction from the control unit 23. Further, based on an instruction from the control unit 23, the memory interface 22 performs a read operation for reading data from the nonvolatile memory 3.

The control unit 23 totally controls components of the memory system 1. The control unit 23 may be implemented by a CPU (processor).

When receiving a request from the host 4 via the host interface 21, the control unit 23 performs control according to the request. For example, the control unit 23 instructs the memory interface 22 to write user data and parity into the nonvolatile memory 3 according to a write request received from the host 4. Further, in accordance with a read request received from the host 4, the control unit 23 instructs the memory interface 22 to read user data and parity from the nonvolatile memory 3. Here, the parity means an error correction code (ECC) obtained by encoding user data. The write request designates a logical address, a length of write data to be written, and the like. The logical address designated by a write request indicates a logical address to which write data is to be written. The read request designates a logical address, a length of data to be read, and the like. The logical address designated by a read request indicates a logical address corresponding to data to be read.

Further, when receiving the write request from the host 4, the control unit 23 determines a storage area (memory area) on the nonvolatile memory 3 to which user data stored in the data buffer 25 is to be written. That is, the control unit 23 manages a writing destination of user data. The control unit 23 manages mapping between a logical address designated by a write request received from the host 4 and a physical address indicating a storage area on the nonvolatile memory 3 in which the user data corresponding to the logical address is stored by using a lookup table (LUT) functioning as an address translation table. The look-up table (LUT) may be stored in a RAM (dynamic RAM (DRAM) or static RAM (SRAM)) in the memory system 1, or may be stored persistently in the nonvolatile memory 3. In the latter case, when the power of the memory system 1 is turned on, the LUT may be loaded from the nonvolatile memory 3 into the RAM in the memory system 1.

Further, when receiving the read request from the host 4, the control unit 23 translates a logical address designated by the read request into a physical address using the above-mentioned LUT (address translation table), and instructs the memory interface 22 to read data from this physical address.

Each of the blocks included in the nonvolatile memory 3 includes a plurality of layers as described above. These layers are logically divided into a plurality of pages. Each page includes a set of several adjacent layers. The size of one page is predefined by the size of an ECC frame including user data and an ECC. Therefore, in the nonvolatile memory 3, writing and reading are generally performed in a unit of data which is referred to as a page (ECC frame).

The data buffer 25 temporarily stores user data received from the host 4. Further, the data buffer 25 temporarily stores user data read from the nonvolatile memory 3. Further, the data buffer 25 temporarily stores a code word (user data+ECC) generated by encoding user data. The data buffer 25 is constituted by, for example, the aforementioned RAM (SRAM or DRAM).

User data transmitted from the host 4 is transferred to the internal bus 20 and stored in the data buffer 25. The encoder/decoder 24 encodes data to be written in the nonvolatile memory 3 to generate a code word. Any coding may be used as the coding for this encoding. For example, Reed Solomon (RS) coding, Bose Chaudhuri Hocquenghem (BCH) coding, and low density parity check (LDPC) coding can be used. The encoder/decoder 24 includes an encoding unit 26 and a decoding unit 27. Details of encoding and decoding according to the present embodiment will be described later.

For simplicity of explanation, in the present embodiment, it is assumed that the nonvolatile memory 3 includes one nonvolatile memory chip. However, the present embodiment is applicable to a configuration in which the nonvolatile memory 3 includes a plurality of nonvolatile memory chips.

FIG. 2A illustrates a configuration example of a cell array included in the nonvolatile memory 3. In the following description, for ease of understanding, a configuration example of a cell array will be described using specific numerical values. However, these numerical values are merely examples, the present embodiment is not limited to these specific numerical values, and any numerical value can be applied to the configuration of the cell array of the present embodiment.

The cell array includes a plurality of blocks. Each of the plurality of blocks is a unit of writing and reading of data by the last-in first-out method.

Here, it is assumed that each block includes a total of 288 layers of layers L0 to L287. These 288 layers function as a plurality of stages of the above-described shift register. The layer L287 corresponds to a first stage of the shift register and the layer L0 corresponds to a last stage of the shift register.

The layers L0 to L287 of each block can be obtained by a plurality of strings included in each block. In each of the plurality of strings, writing and reading of data is performed in a unit of data of 1-bit width by the last-in first-out method.

Here, it is assumed that each block includes 1K+a strings. In the magnetic domain wall memory, this string is a magnetic shift register, and is implemented, for example, by a magnetic material extending in one direction. Each string of the magnetic domain wall memory may be referred to as a magnetic memory line or a magnetic narrow wire. Each string may include a plurality of magnetic domains corresponding to a plurality of stages from a first stage to a last stage. A direction of magnetization of each magnetic domain is used as information indicating "1" or "0".

Each string is accessed by the last-in first-out method in which a stored position of data previously written (programmed) is moved to a back side when a next data is written, and the data on the back side cannot be read before the data that is programmed later is read.

In the present embodiment, it is assumed that one string can store $256+\beta$ bits. This corresponds to a configuration in which one string of the magnetic domain wall memory includes $256+\beta$ magnetic domains.

In this case, the size of one block is (1K+α)×(256+β) bit=32 KB+α'. Here, it is conceivable that α, β, α' (α'=α×(256+β)+β×(1K+α)−α×β) is used as an area for storing parity, as well as an area for storing information to be stored in a manner attached to data. In the following description, α, β, and α' are used as parity for the sake of simplicity. Parity is an error correction code (ECC) added to data. The numerical values of α, β, α' described above are given as an example, and in the present embodiment, various other numerical values can be applied.

In the following description, a case where α=0 and β=32 will be described by way of example.

In FIG. 2A, a set of a plurality of ellipses continuing in a vertical direction indicates one string. A set of 1K+α strings constitutes one block. Blocks are represented by double squares. The 1K+α strings included in a block constitute the 288 (256+32) layers L0 to L287. Each of the layers L0 to L287 is represented by a rounded square.

One end of each of 1K+α strings included in each block is connected to each of 1K+α input and output units. In FIG. 2A, a set of the 1K+α input and output units is represented as an input and output unit group 31. Write and read of data for this block are performed via the input and output unit group 31.

The layer L287 closest to the input and output unit group 31 is used as a first stage of the shift register, and the layer L0 farthest from the input and output unit group 31 is used as a last stage of the shift register.

In the write operation, data stored in each layer is shifted in a unit of a layer from the layer L287 corresponding to the first stage to the layer L0 corresponding to the last stage in the first direction (the direction from the top to the bottom in FIG. 2A).

In the read operation, data stored in each layer is shifted in a unit of a layer in a second direction opposite to the first direction (direction from the bottom to the top in FIG. 2A).

The layers L0 to L287 are divided into eight layer groups each including adjacent 36 (=288/8) layers. These layer groups are referred to as pages. In other words, the layers L0 to L287 are logically divided into eight pages p0 to p7. One page includes 36 adjacent layers (=288/8). Each of the pages p0 to p7 is represented by a square. One block is constituted by eight pages p0 to p7.

The capacity of each of the pages p0 to p7 is predefined so that a data portion having a predetermined size can be stored. For example, one page may be specified to have the capacity capable of storing an ECC frame including a data portion having a predetermined size and an error correction code (ECC) corresponding to this data portion. The size of a data portion included in one ECC frame may be, for example, 4 KB. In this case, one ECC frame includes 4 KB of user data and ECC. One block can store eight data portions (eight ECC frames) corresponding to eight of the pages p0 to p7.

Hereinafter, the page p7 closest to the input and output unit group 31 is also referred to as a "beginning page", and the page p0 farthest from the input and output unit group 31 is also referred to as a "last page".

The input and output unit group 31 is connected to a shift control unit 32 and a read and write control unit 33. The shift control unit 32 shifts data of each layer in a block in the direction from the layer L287 to the layer L0 or in the direction from the layer L0 to the layer L287 in a unit of a layer.

In the magnetic domain wall memory, the shift control unit 32 shifts (moves) each magnetic domain wall in each string by supplying a current pulse to each string in a block.

In each string, each magnetic domain is shifted (moved) in a unit of a layer (that is, in a unit of one bit) by movement of magnetic domain walls.

The read and write control unit 33 controls write and read of data with respect to this block via the input and output unit group 31.

FIG. 2B illustrates an exemplary circuit configuration corresponding to one string 10 of a plurality of strings included in each block. Here, it is assumed that the non-volatile memory 3 is a magnetic domain wall memory.

The string 10 is a magnetic material referred to as a magnetic wire, a magnetic narrow wire, a magnetic memory line, or the like, and functions as a magnetic shift register. The string 10 extends in one direction and has a plurality of magnetic domains 15 arranged along a longitudinal direction of the string 10. A magnetic domain wall 16 exists between adjacent ones of the magnetic domains 15 having mutually different magnetization directions.

The string 10 has one end portion 10ae and the other end portion 10af. The one end portion 10ae is connected to an input and output unit 31-1 and also to a first transistor Tr1 of the shift control unit 32. The other end portion 10af is connected to a magnetic wire driver MML-D-1.

The input and output unit 31-1 is an input and output unit for the string 10. Write and read of data to and from the string 10 are executed via the input and output unit 31-1. In the write operation, the input and output unit 31-1 forms magnetization having a specific magnetization direction in a portion of the string 10, which is connected to the input and output unit 31-1, based on a signal from the read and write control unit 33. In the read write operation, the input and output unit 31-1 reads data from the string 10 by detecting the magnetization direction of the portion in the string 10, which is connected to the input and output unit 31-1. The input and output unit 31-1 includes, for example, a magnetic layer 11a and an intermediate layer 12a. The intermediate layer 12a is disposed between the magnetic layer 11a and the string 10. The magnetic layer 11a is connected to a transistor Tr2 of the read and write control unit 33.

The read and write control unit 33 includes, in addition to the transistor Tr2, a read and write driver RW-D-1 for driving the string 10 via the input and output unit 31-1 and a read and write selector RWCS-1 for selecting the string 10.

In order to shift the magnetization of each magnetic domain in the string 10 in a unit of one bit, the shift control unit 32 supplies a current to the string 10 in cooperation with the magnetic wire driver MML-D-1. The shift control unit 32 includes, in addition to the transistor Tr1, a shift driver (domain wall shift driver) DWS-D-1 for supplying a current to the string 10, and a shift selector (domain wall shift selector) DWS-CS-1 for selecting the string 10.

The string 10 extends in a first direction D1. The magnetization 15m of each of the magnetic domains 15 included in the string 10 is in a first magnetization direction 15ma in one state (a first state). The first magnetization direction 15ma crosses the first direction D1. The magnetization 15m of each of the magnetic domains 15 is in a second magnetization direction 15mb in another state (a second state). The second magnetization direction 15mb crosses the first direction D1 and is opposite to the first magnetization direction 15ma.

The magnetization 15m of the plurality of magnetic domains 15 of the string 10 is controlled by a signal supplied from the read and write control unit 33 to the input and output unit 31-1. As a result, the first magnetization direction 15ma and the second magnetization direction 15mb are formed. The directions of the magnetizations 15m (the first magnetization direction 15*ma* and the second magnetization direction 15*mb*) of the plurality of magnetic domains 15 in the string 10 correspond to the information (1 and 0) to be stored.

Due to the current flowing through the string 10, each of the magnetic domain walls 16 in the string 10 shifts (moves), and as a result, each of the magnetizations 15*m* of the plurality of magnetic domains 15 shifts (moves). For example, when current flows from the one end portion 10*ae* to the other end portion 10*af* in the string 10, the magnetizations 15*m* of the plurality of magnetic domains 15 moves from the one end portion 10*ae* to the other end portion 10*af*. When current flows from the other end portion 10*af* toward the one end portion 10*ae* in the string 10, the magnetizations 15*m* of the plurality of magnetic domains 15 moves from the other end portion 10*af* toward the one end portion 10*ae*. The direction of the current and the direction of shift of magnetizations 15*m* may be reversed.

In a case where information is stored (written) in the string 10, a pulse of a current flowing from the one end portion 10*ae* to the other end portion 10*af* is supplied to the string 10, and the input and output portion 31-1 forms magnetization in the first magnetization direction 15*ma* or the second magnetization direction 15*mb* in a portion in the string 10, which is connected to the input and output portion 31-1. As a result, the magnetizations 15*m* of the plurality of magnetic domains 15 move from the one end portion 10*ae* to the other end portion 10*af*, and, at the same time, information is written in the portion in the string 10, which is connected to the input and output portion 31-1.

In a case where information stored in the string 10 is reproduced (read), a pulse of a current flowing from the other end portion 10*af* to the one end portion 10*ae* is supplied to the string 10, and the input and output portion 31-1 detects a direction of the magnetization 15*m* (the first magnetization direction 15*ma* or the second magnetization direction 15*mb*) in the portion in the string 10, which is connected to the input and output portion 31-1. As a result, information is read from the portion in the string 10, which is connected to the input and output unit 31-1 and, at the same time, the magnetizations 15*m* of the plurality of magnetic domains 15 move from the other end portion 10*af* toward the one end portion 10*ae*.

In an input and output unit 3101, for example, a direction of the magnetization 15*m* in the portion in the string 10, which is connected to the input and output unit 31-1, is detected by a magnetoresistive effect or the like.

In this manner, write and read of information to and from the string 10 are performed by the last-in first-out method. Readout of information from the string 10 is destructive read.

In this example, write and read of information for one string 10 has been described. However, in actuality, write and read of information for all strings included in the same block are executed in parallel.

FIG. 2C illustrates the movement of a memory state (movement of the magnetic domain wall 16) in the string 10.

In FIG. 2C, it is assumed that information "0011011001" is stored in the string 10 in an initial memory state MSt. FIG. 2C exemplifies three states (CASE1, CASE2, CASE3) after this information is shifted by applying a current pulse for one-bit shift.

CASE1 corresponds to "correct shift operation". In this case, all the magnetic domain walls 16 move at the same speed. In this case, information of the initial memory state MSt is maintained even after the shift operation.

On the other hand, CASE2 is an example of incorrect operation. In CASE2, the second magnetic domain wall 16 moves at a faster speed than the other magnetic domain walls. The second magnetic domain wall 16 catches up with the third magnetic domain wall 16, and part of the information is lost. That is, the information of the initial memory state MSt is not maintained and the information changes.

CASE3 is also an example of incorrect operation. In CASE3, the moving speed of the second magnetic domain wall 16 is low. In this example, the second magnetic domain wall 16 is drawn as not moving. Also in this case, the information of the initial memory state MSt is not maintained and the information changes.

As described above, if there is a variation in the moving speed of the magnetic domain walls 16, an incorrect operation occurs in the magnetic memory. This incorrect operation becomes prominent when the number of times information is shifted increases. That is, as the number of times of shift operation increases, information deteriorates.

Hereinafter, details of the memory system 1 will be described. First, an outline of some features of the memory system 1 will be described. In the following description, specific numerical values will be exemplified for easy understanding. However, the present embodiment is not limited to these numerical values.

<Data Handling Unit>

Basically, write and read of data to and from a block are executed in a unit of data corresponding to a block size.

<ECC Frame>

The size of an ECC frame is 4 KB+$\alpha'$/8.

<Encoding and Decoding>

The memory controller 2 encodes a data portion to be written to a certain block of the nonvolatile memory 3 to generate a data portion to which an ECC (parity) is added, and writes the data portion to which the ECC (parity) is added to the block of the nonvolatile memory 3. The memory controller 2 decodes a data portion read from a certain block of the nonvolatile memory 3 using the ECC attached to the data portion and corrects an error of the read data portion.

<Data Read>

Even if read target data designated by the host 4 is only a part of a plurality of data portions stored in a certain block, the memory controller 2 reads all the data portions in this block from the nonvolatile memory 3. The memory controller 2 re-encodes all data portions that have been read and writes back re-encoded data portions, that is, data portions to which ECCs (parities) are added, to the same block or a different block.

<Writing Back Destination>

In a case where the data buffer 25 has a sufficient capacity, the memory controller 2 may write back each data portion read from a certain block in the nonvolatile memory 3 to the same block, or to another block. Here, the writing back is performed for recovering data portions read from the nonvolatile memory 3. This is because when data is read from each block in the nonvolatile memory 3, the data is lost from the nonvolatile memory 3.

When the capacity of the data buffer 25 is small, the memory controller 2 can write back data portions which are read one by one from a certain block in the nonvolatile memory 3 to another block one by one. In this case, arrangement of data portions in the other block is in the reverse order to arrangement of data portions in the original block from which the data portions are read.

<Block Shift Counter>

The memory controller 2 manages a counter value for each of a plurality of blocks in the nonvolatile memory 3. The counter value is indicative of a cumulative value of the number of times of performing the operation of shifting data. This counter value is used to evaluate the degree of wear of each block. This counter is referred to as a block shift counter.

<Distribution of Code Amount of Error Correction Code>

The memory controller 2 can change a code amount of an error correction code added to a data portion in accordance with a position of a page in a block to which the data portion is to be written.

Hereinafter, an example of operation of the memory system 1 will be described.

Here, it is assumed that writing/reading of data are requested from the host 4 in a unit of 4 KB (=page size), and the memory controller 2 writes and reads data to and from the nonvolatile memory 3 in a unit of a block size.

First, writing process will be described. The 4-KB data received from the host 4 is stored in the data buffer 25. An encoding unit 26 in the encoder/decoder 24 encodes the 4-KB data to generate an error correction code corresponding to the 4-KB data. This 4-KB data to which the generated error correction code is added is stored again in the data buffer 25.

When data corresponding eight pages (eight 4-KB data portions to which error correction codes are added) are stored in the data buffer 25, the memory controller 2 writes the data corresponding to eight pages into a certain block in the nonvolatile memory 3.

Figure 6:
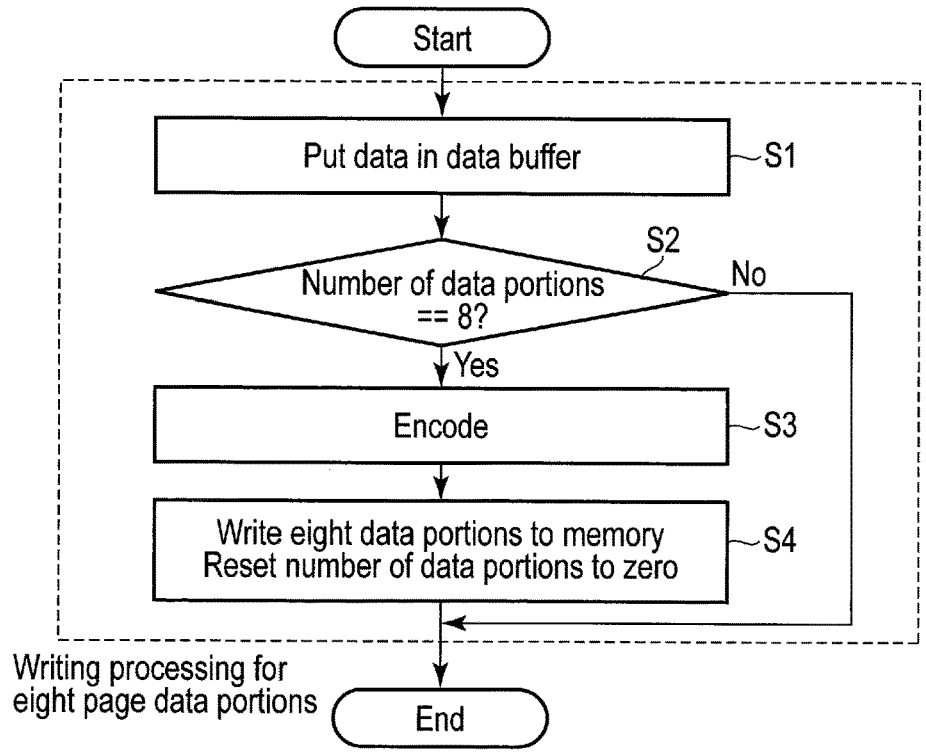
FIG. 6 is a flowchart illustrating a procedure of processing of encoding a plurality of data portions whose total sizes correspond to a block size and writing encoded data portions into the block.
Figure 7:
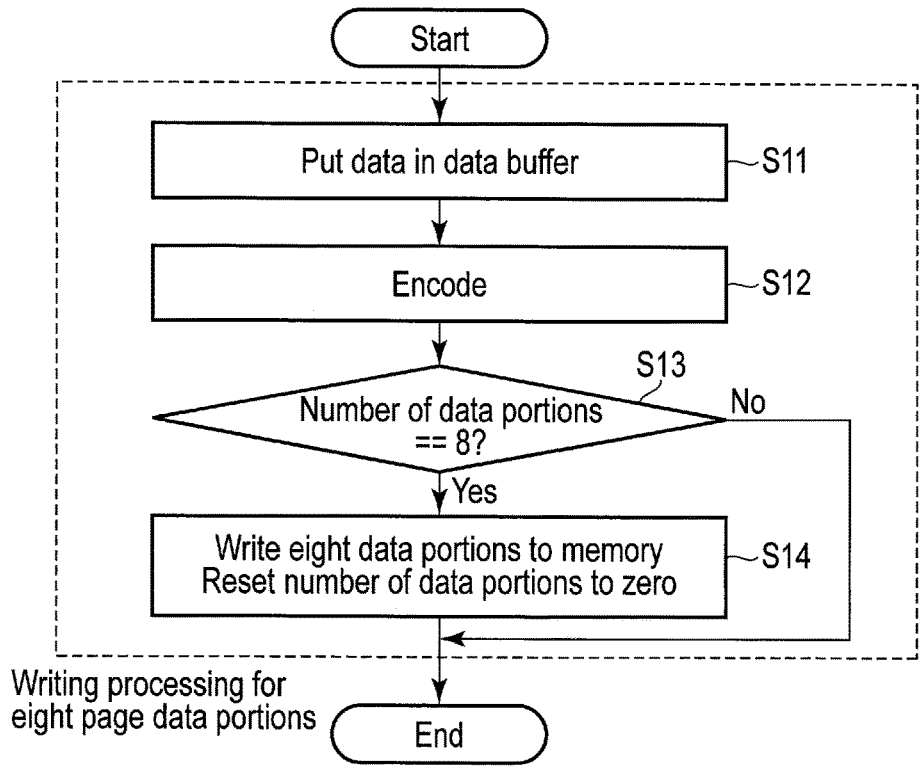
FIG. 7 is a flowchart illustrating another procedure of the processing of encoding a plurality of data portions whose total sizes correspond to the block size and writing encoded data portions into the block.

A procedure of the writing processing is illustrated in FIGS. 6 and 7. When a delay in encoding processing is sufficiently small with respect to a transfer speed from the data buffer 25 to the nonvolatile memory 3, a method of performing the encoding processing when writing data in the nonvolatile memory 3 can be employed as shown in a flowchart of FIG. 6. On the other hand, when the encoding processing is performed in advance, the writing processing is executed according to a procedure illustrated in a flowchart of FIG. 7.

First, the writing processing illustrated in the flowchart of FIG. 6 will be described.

When the memory controller 2 receives a write request from the host 4, the memory controller 2 starts the writing processing shown in the flowchart of FIG. 6.

The memory controller 2 receives 4-KB data associated with the write request from the host 4 and stores the 4-KB data in the data buffer 25 (Step S1). The memory controller 2 counts the number of data portions stored in the data buffer 25 and determines whether or not the number of data portions accumulated in the data buffer 25 has reached eight (Step S2). If the number of data portions stored in the data buffer 25 has not reached eight (NO in Step S2), the memory controller 2 ends the processing.

When the number of data portions stored in the data buffer 25 has reached eight (YES in Step S2), the memory controller 2 encodes each of the eight data portions using the encoding unit 26 to generate an error correction code, and writes the eight data portions to which the error correction codes are added to a certain block in the nonvolatile memory 3 (Step S4). In Step S4, the memory controller 2 also executes processing of resetting the number of data portions accumulated in the data buffer 25 to zero.

Next, the writing processing illustrated in the flowchart of FIG. 7 will be described.

When the memory controller 2 receives a write request from the host 4, the memory controller 2 starts the writing processing shown in the flowchart of FIG. 7.

The memory controller 2 receives 4-KB data associated with the write request from the host 4, and stores the 4-KB data in the data buffer 25 (Step S11). The memory controller 2 encodes the 4-KB data using the encoding unit 26 to generate an error correction code (Step S12), and stores the 4-KB data to which the error correction code is added in the data buffer 25.

The memory controller 2 counts the number of data portions accumulated in the data buffer 25, that is, the number of 4-KB data portions to which error correction codes are added, and determines whether the number of data portions accumulated in the data buffer 25 has reached eight (Step S13). If the number of data portions accumulated in the data buffer 25 has not reached eight (NO in Step S13), the memory controller 2 ends the processing.

When the number of data portions accumulated in the data buffer 25 has reached eight (YES in Step S13), the memory controller 2 writes eight data portions to which error correction codes are added to a certain block in the nonvolatile memory 3 (Step S14). In Step S4, the memory controller 2 also executes processing of resetting the number of data portions accumulated in the data buffer 25 to zero.

<Code Amount of Error Correction Code to be Imparted>

As described above, in the present embodiment, an error correction code (parity) is added to 4-KB data for one page. The size of the error correction code (parity) is, for example, $\alpha'/8$. As a result, the total size of data corresponding to eight pages, to which error correction codes are added, is 32 KB+$\alpha'$.

<About Write Operation>

The write operation performed in each of Step S4 in FIG. 6 and Step S14 in FIG. 7 will be described. The memory controller 2 sends out data of a first one layer of the data of 32 KB+$\alpha'$ together with a write instruction (program command) to the nonvolatile memory 3 and writes the data of this one layer to the layer L287 of a selected block. The size of the data for one layer is 1 K bits+$\alpha$.

At the same time as the data of one layer is written to the layer L287 of the selected block, data of each layer (n) of the selected block is shifted to a layer (n−1).

When this is repeated and data of a 36th layer is written to the selected block, a data portion (page data) having the size of 4 KB+$\alpha'/8$ is written to a portion of the layer L287 to the layer L252, that is, the page p7.

When processing of writing each of data portions of the remaining seven pages to the selected block is completed, as illustrated in FIG. 3, page data D0 that is input first is written to (programmed into) the page p0, and page data D7 input at last, that is, eighth, is written to (programmed into) the page p7.

In the above description, the encoding processing is executed so that parities having same size ($\alpha'/8$) are added to all the 4-KB data portions as error correction codes. Therefore, all pages are divided by boundaries of 36 layers. For example, the page p0 is constituted by the layer L0 to layer L35, and the page p7 is constituted by the layer L252 to the layer L287.

A case where an ECC of different intensity is added to a data portion depending on a position in a block where the data portion is to be written may be considered. In one example, a large amount of parity is allocated to a data portion which is finally programmed to the page p0, that is, page data input first to a block, and, conversely, a small amount of parity is allocated to a data portion which is finally programmed to the page p7, that is, page data input finally to the block. In that case, as illustrated in FIG. 4, the size of the data portion D0 with the parity (ECC) to be inputted first is 4 KB+α'/8+γ, the size of the data portion D7 with the parity (ECC) programmed at last is 4 KB+α'/8−γ, and the size of each of the other data portions D2 to D6 with the parities (ECCs) is 4 KB+α'/8.

Figure 4:
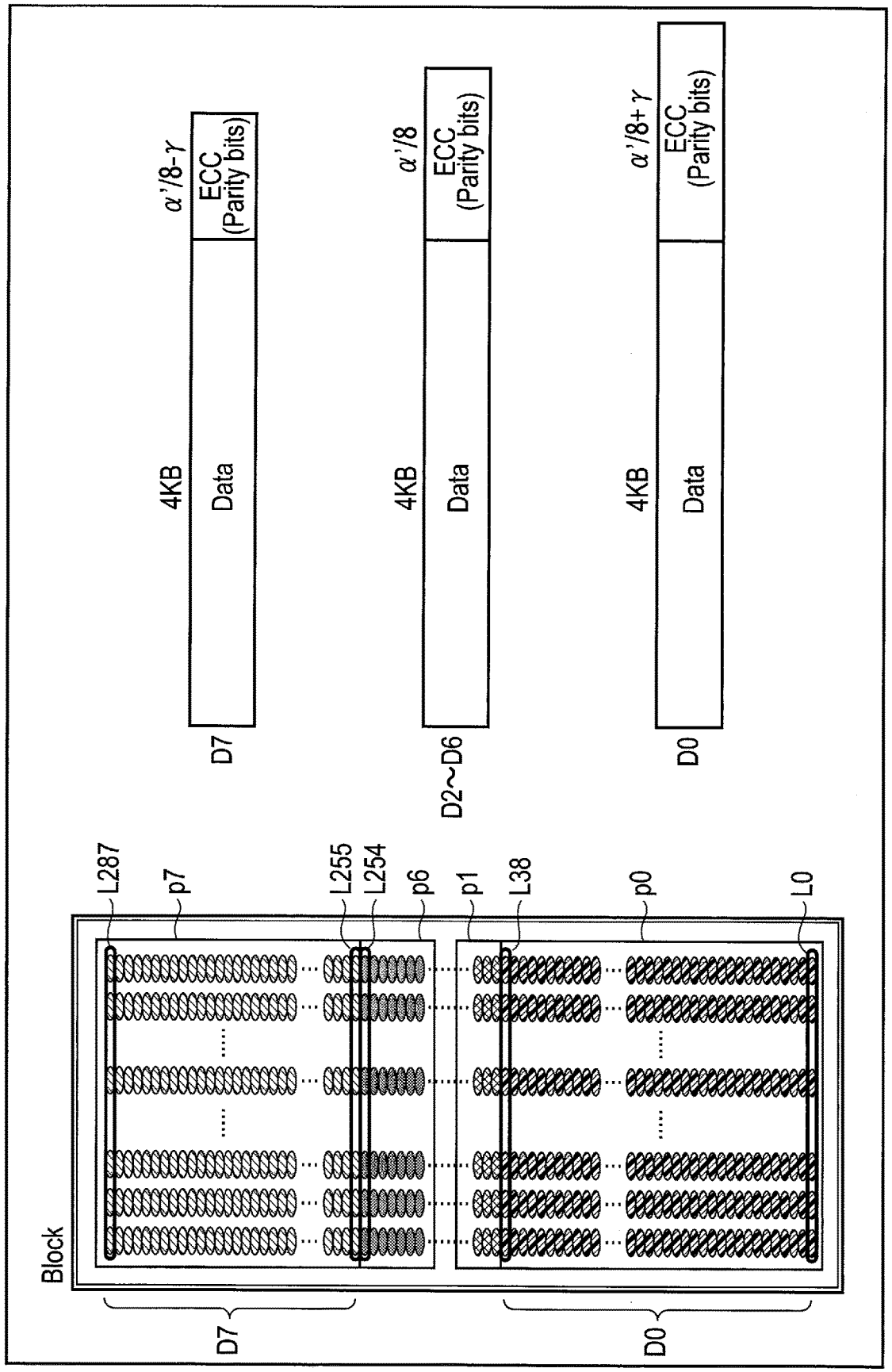
FIG. 4 is a diagram illustrating an example in which code amount distribution of an error correction code is changed according to a position of a page in a block to which a data portion is to be written.

For example, in a case where γ has a size corresponding to three layers, the page p0 is constituted by 39 layers of the layer L0 to the layer L38, and the page p7 is constituted by 33 layers of the layer L255 to the layer L287 as illustrated in FIG. 4.

The total size of the parities included in the entire data stored in one block is maintained at a'. The size of the parity included in the data D7 programmed finally into the page p7 is reduced by three layers and the size of the parity included in the data D0 programmed finally into the page p0 is increased by three layers. The above distribution of parity is just an example. For example, it is conceivable to adjust the parity size also between the page p1 and the page p6. In this case, the size of the parity included in the data programmed finally into the page p6 may be reduced by two layers, and the size of the parity included in the data programmed finally into the page p1 may be increased by two layers.

As described above, in the present embodiment, when a plurality of data portions (here, eight pieces of page data) corresponding to the capacity of the write destination block are written to this write destination block, the memory controller 2 changes a code amount of an error correction code to be added to page data to be written according to the order of input of the page data to be written to the write destination block.

In the write operation, the page data that is input first to the write destination block, that is, the data D0 that is finally programmed into the page p0 is shifted many times. On the other hand, the number of times the page data input last to the write destination block, that is, the data D7 programmed finally into the page p7 is shifted is extremely small. Also in the read operation, the number of times the data D0 is shifted is much larger than the number of times the data D7 is shifted. Therefore, errors are likely to be accumulated in the data D0 which is finally programmed into the page p0.

In the present embodiment, a code amount of an error correction code added to page data to be written is changed according to the order in which the page data is input to a write destination block. Therefore, it is possible to distribute more code amount of an error correction code to the data D0 which is finally programmed into the page p0.

Figure 5:
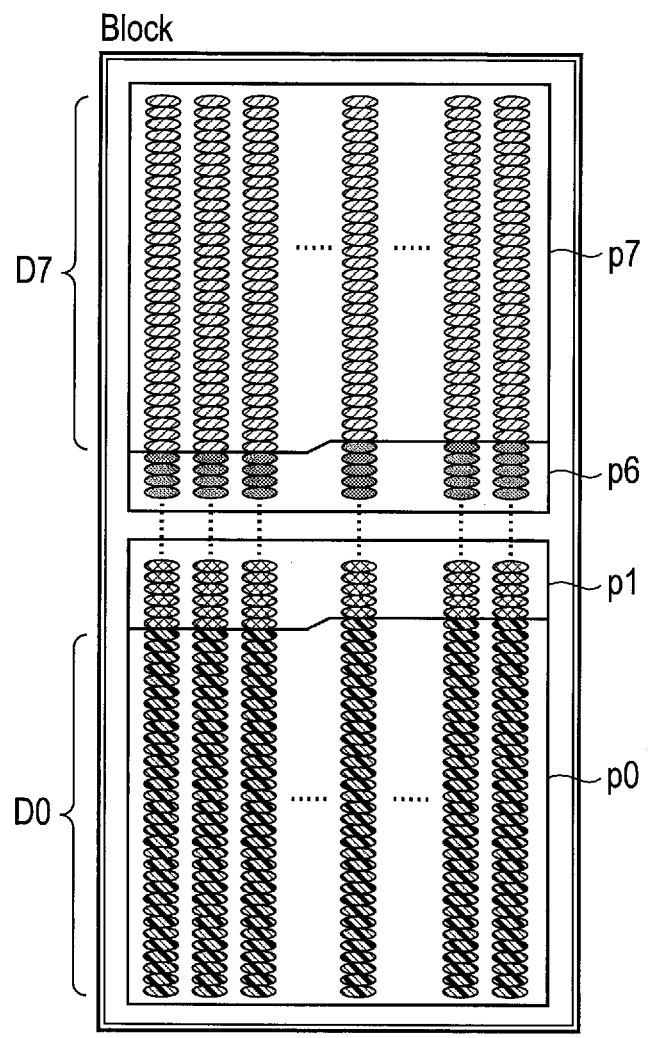
FIG. 5 is a diagram illustrating an example of changing code amount distribution of an error correction code at a boundary of strings in the same layer.

The above code amount distribution of an error correction code describes an example in which distribution of code amounts of error correction codes to the pages p0 to p7 is determined so that the pages p0 to p7 include different layer groups. However, distribution of code amounts of error correction codes to the pages p0 to p7 may be determined so that two adjacent pages are separated from each other on the boundary between strings in the same layer as illustrated in FIG. 5.

In this case, it is necessary to handle part of data read in a unit of a layer for a next page, which complicates the processing. However, a distribution amount of an error correction code to each of the pages p0 to p7 is predetermined. Therefore, for each page, a top layer, a top string in the top layer, a final layer, and a final string in the final layer are also predetermined. Therefore, by merely performing a simple operation on an identifier (for example, page number) of a page to be accessed, a top layer, a top string in the top layer, a final layer, and a final string in the final layer, which correspond to the page to be accessed, can be easily calculated.

In the present embodiment, the code amount distribution of an error correction code to each data portion is performed by the control unit 23 in FIG. 1.

When the writing of the eight data portions (eight page data portions) to a write destination block is completed, the memory controller 2 updates the LUT so that physical addresses indicating storage locations in the memory 3 where the eight page data portions are stored are mapped to logical addresses corresponding to the eight page data.

Figure 8:
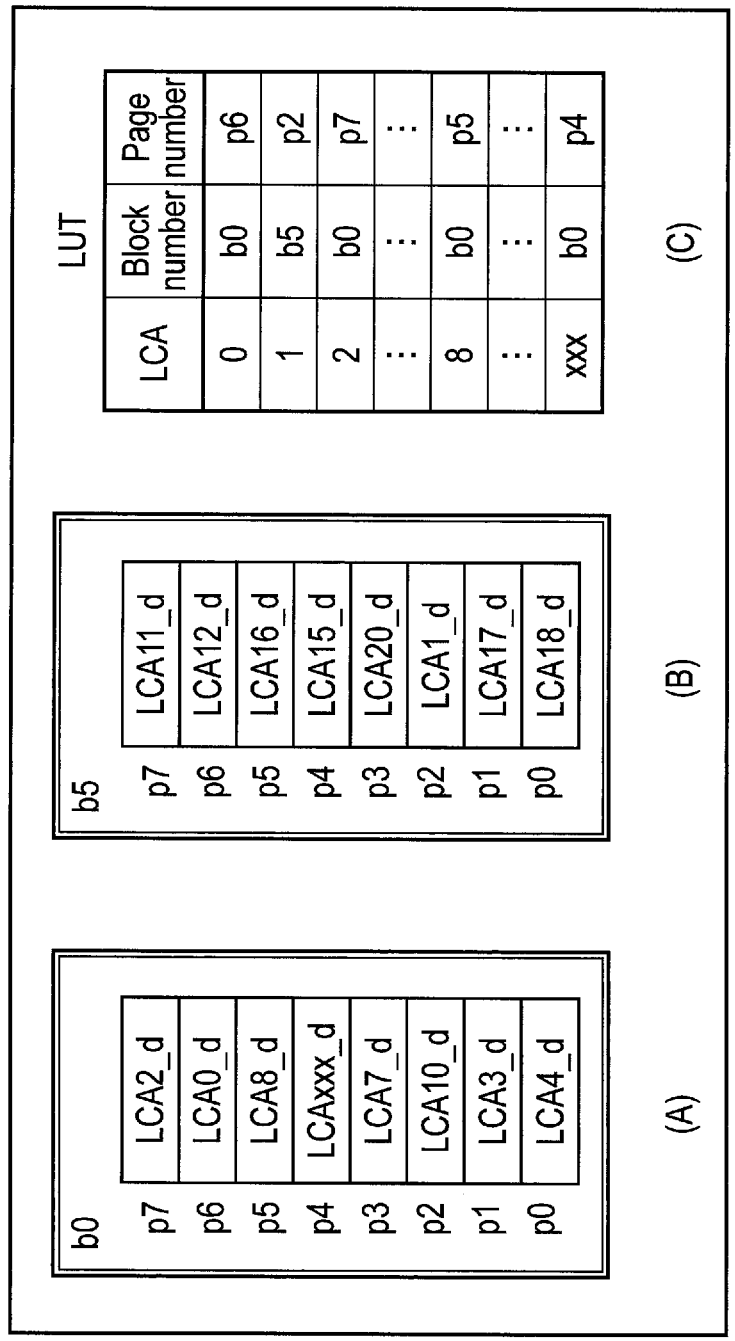
FIG. 8 is a diagram illustrating an example of mapping information in a look-up table (LUT).

As illustrated in FIG. 8, the LUT may manage mapping between each of logical addresses and each of physical addresses of the nonvolatile memory 3 where data portions corresponding to the logical addresses are written. Each physical address may be represented by a combination of a block number and a page number. A logical address may be either a logical block address (LBA) or a logical cluster address (LCA). Hereinafter, it is assumed that the LCA is used as the logical address. The LCA designates addresses in units of 4 KB. The block number is a block identifier (block id) designating a specific block, and the page number is a page identifier designating any one of the pages p0 to p7.

FIG. 8 assumes a case where page data LCA0_d corresponding to LCA0 is written to the page p6 of the block b0, page data LCA1_d corresponding to LCA1 is written to the page p2 of the block b5, page data LCA2_d corresponding to LCA2 is written to page p7 of the block b0, . . . , page data LCA8_d corresponding to LCA8 is written to the page p5 of the block b0.

In this case, in the LUT, the block number b0 and the page number p6 are stored in an entry corresponding to LCA0, the block number b5 and page number p2 are stored in an entry corresponding to LCA1, the block number b0 and the page number p7 are stored in an entry corresponding to LCA2, and similarly, the block number b0 and the page number p5 are stored in an entry corresponding to LCA8.

For example, when LCA2 is designated by a read request received from the host 4, the memory controller 2 can acquire the block number b0 and the page number p7 as a storage location in the nonvolatile memory 3 where the page data LCA2_d corresponding to LCA2 is stored, by referring to the LUT.

When receiving a read request from the host 4, the memory controller 2 executes processing described below.

Using the LUT, the memory controller 2 obtains a block number and a page number where page data corresponding to LCAi designated by the read request from the host 4 is stored. Next, the memory controller 2 sequentially reads page data portions corresponding to all pages of the block one by one page from the page p7.

The block b0 of FIG. 8 is taken as an example, when the page data LCA2_d in the page p7 of the block b0 is read, the page data LCA2_d is taken to the outside of the block b0, the page data LCA0_d located in the page p6 of the block b0 moves (shifts) to the page p7 of the block b0, the page data LCA8_d located in the page p5 of the block b0 moves (shifts) to the page p6 of the block b0, . . . , and the page data LCA4_d located in the page p0 of block b0 moves (shifts) to the page p1 of the block b0.

When the page data LCA0_d moved to the page p7 of the block b0 is read, the page data LCA0_d is taken to the outside of the block b0, the page data LCA8_d which has been moved to the page p6 of the block b0 moves to the page p7 of the block b0, page data LCAxxx_d which has been moved to the page p5 of the block b0 moves to the page p6 of the block b0, . . . , the page data LCA4_*d* which has been moved to the page p1 of the block b0 moves to the page p2 of block b0.

In this way, the memory controller 2 sequentially reads eight page data portions stored in the block b0 of FIG. 8 from the nonvolatile memory 3. Note that, in practice, the movement (shift) operation of data as described above is executed in a unit of a layer. When one page includes 36 layers, data of each page is shifted by one page by 36 shift operations.

Then, the memory controller 2 decodes each of read page data portions by the decoding unit 27 of the encoder/decoder 24 in order to correct an error of each of the read page data portions. At that time, if the read page data portion is data requested from the host 4, the memory controller 2 returns this read and decoded page data portion to the host 4 via the host interface 21 and also puts this read and decoded page data portion in the data buffer 25. The memory controller 2 does not return read and decoded page data portions not requested from the host 4 to the host 4, and puts each of these read and decoded page data portions in the data buffer 25.

Each of page data portions put in the data buffer 25 is encoded again by the encoding unit 26 of the encoder/decoder 24, and is programmed into the nonvolatile memory 3.

At this time, if the data buffer 25 has a sufficient capacity and a 32-KB area for reading can be reserved in the data buffer 25, the memory controller 2 puts all page data portions for one block in the data buffer 25. After the above, the memory controller 2 sequentially re-encodes the page data portions of the data buffer 25 and programs (writes back) the page data portions into the nonvolatile memory 3. This method is similar the writing processing described in FIGS. 6 and 7. At this time, a block to which the page data portions are written back may be the same block as the block from which the page data portions is read out, or may be another block. Whether to write back to the same block or another block is determined based on a value of a block shift counter of these blocks. When these page data portions are written back to the same block in such a manner that the page positions are the same, the storage positions of these page data portions are not changed, and updating of the LUT is unnecessary. When writing back these page data portions to another block, the block number on the LUT is updated so that the block number corresponding to each of these page data portions is changed to a block number of the other block.

It is now assumed that the memory controller 2 writes the eight page data portions, which are read from the block b0 of FIG. 8 and stored in the data buffer 25, back to the block b0. First, the page data LCA4_*d* originally in the page p0 of the block b0 is written to the page p7 of the block b0. Next, when the page data LCA3_*d* originally in the page p1 of the block b0 is written to the page p7 of the block b0, the page data LCA4_*d* written in the page p7 of the block b0 moves to the page p6 of the block b0. Next, when page data LCA10_*d* originally in the page p2 of the block b0 is written to the page p7 of the block b0, the page data LCA4_*d* moved to the page p6 of the block b0 moves to the page p5 of the block b0, and the page data LCA3_*d* written in the page p7 of the block b0 moves to the page p6 of the block b0. In this way, eight page data portions are written back to the block b0.

Figure 9:
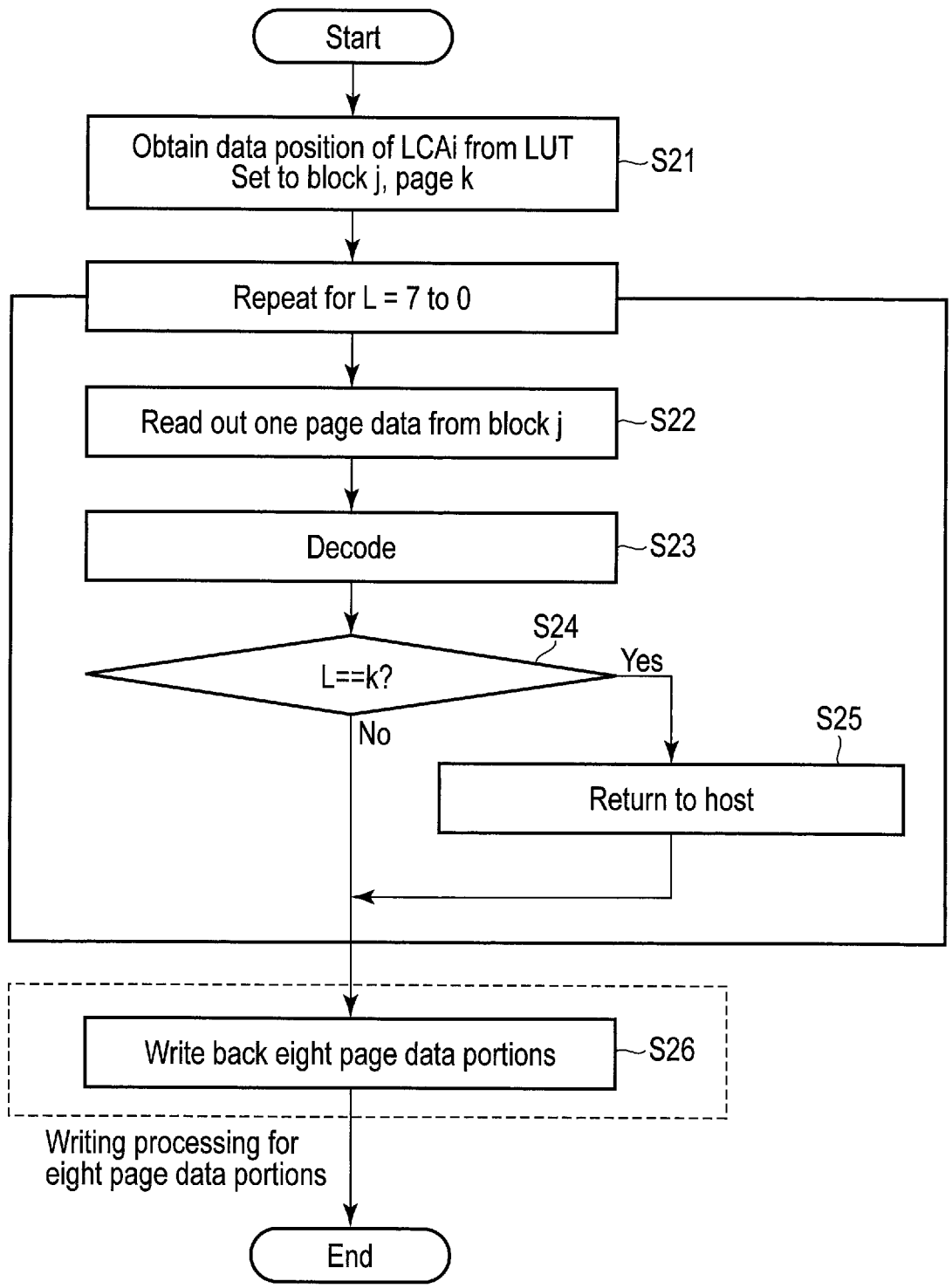
FIG. 9 is a flowchart illustrating a procedure of read and write-back processing executed in response to a read request received from a host.

A flowchart of FIG. 9 illustrates a procedure of read and write-back processing executed in response to a read request received from the host 4.

Upon receiving a read request from the host 4, the memory controller 2 acquires, from the LUT, a storage location (block number, page number) in the nonvolatile memory 3 in which page data corresponding to LCAi designated by the received read request is stored (Step S21). Assume that the block number is a block j and the page number is a page k.

Next, the memory controller 2 repeatedly executes the processing of Steps S22 to S25 described below while changing a variable L in the order of 7 to 0.

In Step S22, the memory controller 2 reads one page data from the block j. In Step S23, the memory controller 2 decodes the read page data, and corrects an error of the read page data. The decoded page data is put in the data buffer 25. In Step S24, the memory controller 2 determines whether or not L=k. When L=k (YES in Step S24), the memory controller 2 returns the decoded page data to the host 4 (Step S25).

Upon completion of the processing of Steps S22 to S25 with respect to L=7 to 0, the memory controller 2 re-encodes eight page data portions stored in the data buffer 25, and writes back the re-encoded eight page data portions to the same block as the block from which these page data portions are read, or another block (Step S26).

Figure 10:
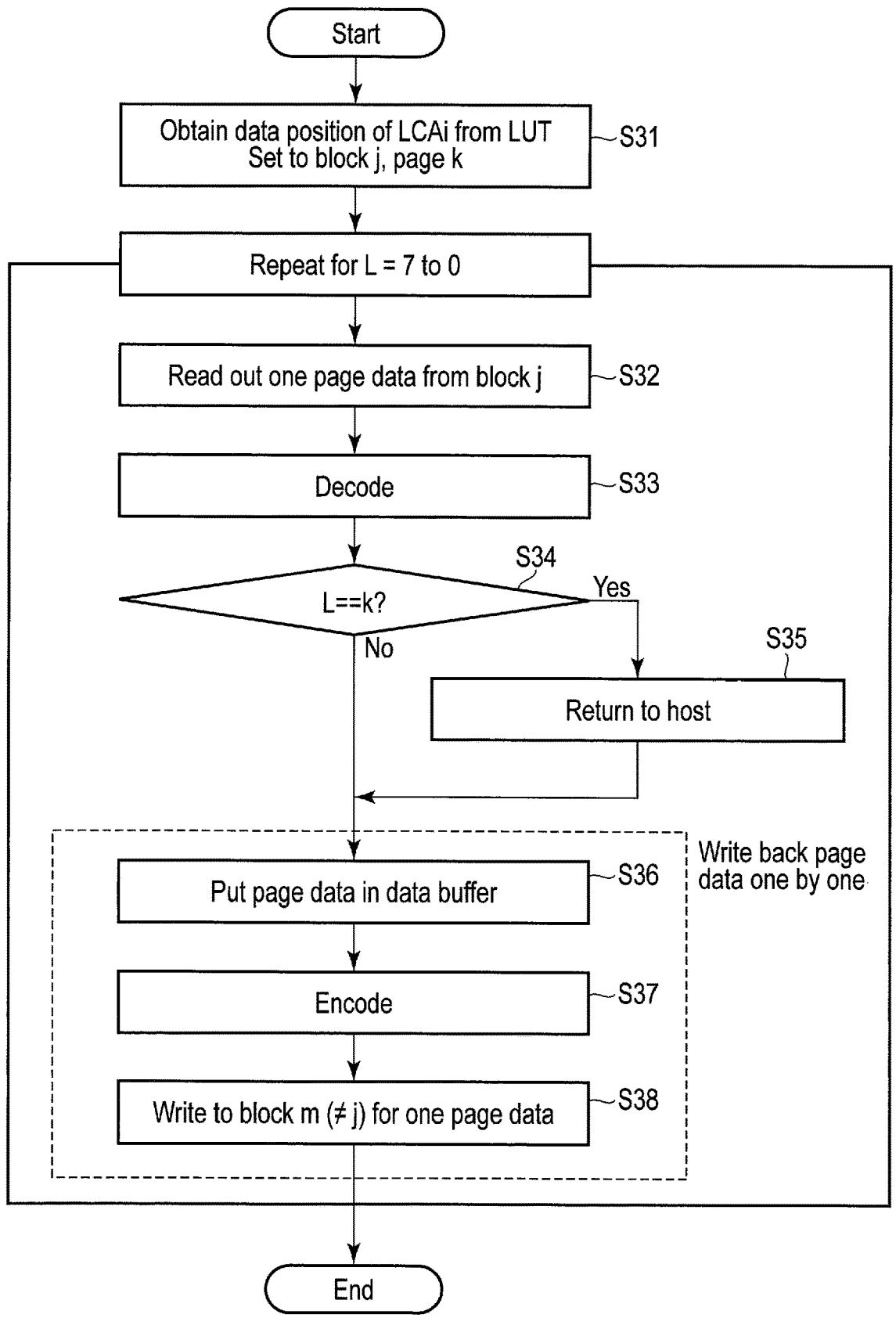
FIG. 10 is a flowchart illustrating another procedure of the read and write-back processing executed in response to a read request received from the host.

In a case where the data buffer 25 does not have sufficient capacity and only a read area of about the size of one page data (4 KB+parity) can be secured in the data buffer 25, processing described below illustrated in a flowchart of FIG. 10 is executed.

Upon receiving a read request from the host 4, the memory controller 2 acquires, from the LUT, a storage location (block number, page number) in the nonvolatile memory 3 in which page data corresponding to LCAi designated by the received read request is stored (Step S31). Assume that the block number is a block j and the page number is a page k.

Next, the memory controller 2 repeatedly executes the processing of Steps S32 to S38 described below while changing the variable L in the order of 7 to 0.

In Step S32, the memory controller 2 reads one page data from the block j. In Step S33, the memory controller 2 decodes the read page data, and corrects an error of the read page data. In Step S34, the memory controller 2 determines whether or not L=k. Only when L=k (YES in Step S34), the memory controller 2 returns the decoded page data to the host (Step S35).

In Step S36, the memory controller 2 puts the decoded page data in the data buffer 25. In Step S37, the memory controller 2 re-encodes the page data in the data buffer 25. In Step S38, the memory controller 2 writes the re-encoded page data back to another block m different from the block j from which the page data is read.

In this manner, each of data portions (page data) stored in all pages of a block in which a read target data portion designated by a read request received from the host 4 is stored is read out one by one. When the read one data portion is the read target data portion, this one data portion is returned to the host 4. Then, the data portions read out one by one from this block are written back to another block one by one. As a result, read and write-back processing can be performed merely by securing a read area for data of one page in the data buffer 25.

Hereinafter, an example of the read and write-back processing will be described.

Here, consider a case where LCA0 is designated by a read request from the host 4 in a state where data is stored in the block b0 and the block b5 in data arrangement as shown in FIG. 8.

Since there is no buffer capable of storing all data of the block b0 in which page data requested from the host 4 is stored, page data is read out for one page at a time from the block b0, and the read page data is decoded. If this page data is the page data requested from the host 4, this page data is returned to the host 4 via the host interface 21 and further stored in the data buffer 25. Page data not requested from the host 4 is not returned to the host 4 but stored in the data buffer 25. The page data stored in the data buffer 25 is re-encoded by the encoding unit 26, and the re-encoded page data is programmed into (written to) another block.

When the above processing is repeated, each of eight page data portions stored in the block b0 is placed in another block in the reverse order to the data arrangement in the block b0. Then, mapping information in the LUT relating to the eight page data portions moved to another block is updated. Here, the LUT may be updated such that a new block number and a new page number are associated with eight LCAs corresponding to eight page data portions. However, in this case, an update amount of mapping information in the LUT is increased. Therefore, it is possible to reduce an update amount of the LUT by separately managing information indicating that the block b2 has been created by reversing the data arrangement in the block b0. This state is illustrated in FIG. 11.

Figure 11:
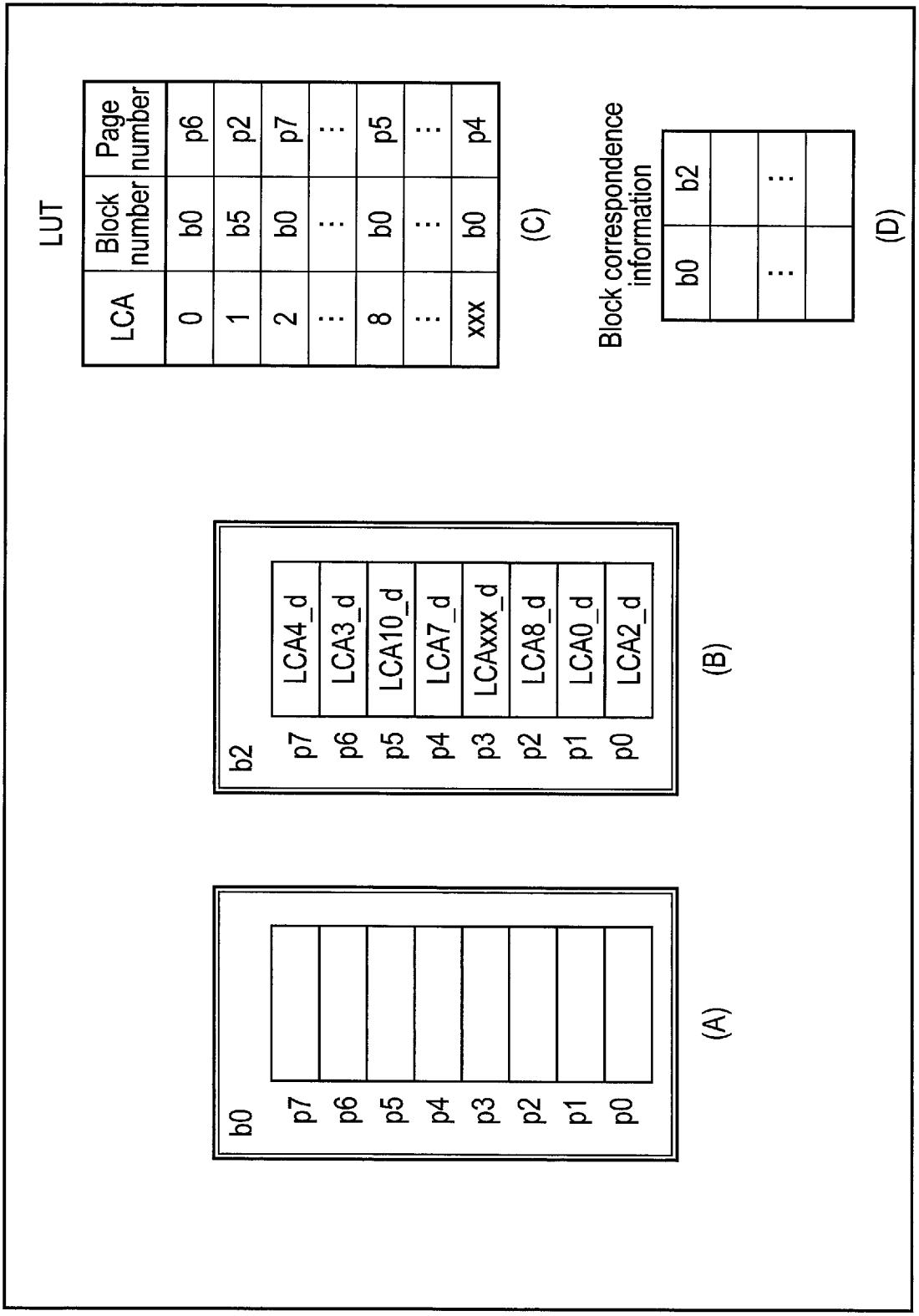
FIG. 11 is a diagram illustrating an operation of reading each of the data portions stored in a first block one by one and writing data portions read out one by one into a second block one by one, and block-to-block correspondence information indicating that data portions that have been stored in the first block are arranged in the second block in the reverse order to the arrangement of the data portions in the first block.

FIG. 11 exemplifies a case where page data portion s read out one by one from the block b0 is written back to the block b2 one by one.

(A) and (B) of FIG. 11 illustrate states of the blocks b0 and b2 after eight page data portions of the block b0 described with reference to FIG. 8 are read out page by page from the nonvolatile memory 3 in the order of pages p7 to p0, and these eight page data portions are written to the block b2 of the nonvolatile memory 3 page by page.

The operation of reading one page data from the block b0 and writing the read one page data back to the block b2 via the data buffer 25 is executed as described below.

When page data of the page p7 of the block b0 is read out and written to the block b2, the page data of the page p7 of the block b0 is taken to the outside of the block b0 and written to the page p7 of the block b2. At this time, page data originally in the page p6 of the block b0 moves to the page p7 of the block b0, the page data originally in the page p5 of the block b0 moves to the page p6 of the block b0, . . . , and the page data originally in the page p0 of the block b0 moves to the page p1 of the block b0.

When page data of the page p7 of the block b0 (page data originally in the page p6 of the block b0) is read out and written to the page p7 of the block b2, page data of the page p7 of the block b0 is taken to the outside of the block b0 and written to the page p7 of the block b2. At this time, in the block b0, page data originally in the page p5 of the block b0 moves to the page p7 of the block b0, the page data originally in the page p4 of the block b0 moves to the page p6 of the block b0, . . . , and the page data originally in the page p0 of the block b0 moves to the page p2 of the block b0. In the block b2, page data originally in the page p6 of the block b0 moves to the page p7 of the block b2, and page data originally in the page p7 of the block b0 moves to the page p6 of the block b2.

By repeating such operations, finally, page data originally in the page p0 of the block b0 moves to the page p7 of the block b2, page data originally in the page p1 of the block b0 moves to the page p6 of the block b2, page data originally in the page p2 of the block b0 moves to the page p5 of the block b2, page data originally in the page p3 of the block b0 moves to the page p4 of the block b2, the page data originally in page p4 of the block b0 moves to the page p3 of the block b2, page data originally in page p5 of the block b0 moves to the page p2 of the block b2, page data originally in the page p6 of the block b0 moves to the page p1 of the block b2, and page data originally in the page p7 of the block b0 moves to the page p0 of the block b2.

That is, in operation of each stage, page data in the page p7 of the block b0 is written to the page p7 of the block b2 at this time.

Therefore, in the block b2, these eight page data portions are arranged in the reverse order to the arrangement of these eight page data portions in the block b0 illustrated in FIG. 8.

That is, the page data (LCA2_$d$) corresponding to LCA2 is moved from the page p7 of the block b0 to the page p0 of the block b2. The page data (LCA0_$d$) corresponding to LCA0 is moved from the page p6 of the block b0 to the page p1 of the block b2. Similarly, the page data (LCA4_$d$) corresponding to LCA4 is moved from the page p0 of the block b0 to the page p7 of the block b2.

As illustrated in (C) of FIG. 11, the memory controller 2 does not update the LUT, and instead manages block correspondence information illustrated in (D) of FIG. 11. This block correspondence information indicates that the block b2 is created by reversing the data arrangement in the block b0 (reversed copy). In other words, the block correspondence information indicates that each data portion stored in the block b0 is arranged in the block b2 in the reverse order to the arrangement of the data portions in the block b0.

Note that, when a new data is programmed into the block b0, as illustrated in (C) of FIG. 12, the LUT is updated so that the block number (b2) of the block b2 and the page number in the block b2 to which each page data is written are associated with each of eight LCAs corresponding to eight page data portions moved from the block b0 to the block b2 before the new data is programmed into the block b0. Further, as illustrated in (D) of FIG. 12, block correspondence information that associates the block b0 and the block b2 is cleared.

Here, assume a case where a read request designating LCA8 is received from the host 4 after eight page data portions are moved from the block b0 to the block b2 as illustrated in FIG. 11.

The memory controller 2 can obtain the block number b0 and the page number p5 from the LUT and can further obtain information that the block b0 is reverse copied to the block b2 from block correspondence information. As a result, the memory controller 2 finds that an actual storage position of page data corresponding to LCA8 is the page p2 of the block b2.

The memory controller 2 reads out eight page data portions stored in the block b2 one by one from the nonvolatile memory 3. The read one page data is decoded. If this read one page data is data corresponding to LCA8 (data of the page p2 of the block b2), this read one page data is returned to the host 4 and put in the data buffer 25. If this one page data is not data corresponding to LCA8, this one page data is put in the data buffer 25 without being returned to the host 4. This one page data in the data buffer 25 is re-encoded and programmed into (written back to) another block.

When this operation is repeated, eight page data portions stored in the block b2 are arranged in another block in the reverse order to the data arrangement within the block b2. This state is illustrated in FIG. 13.

Figure 13:
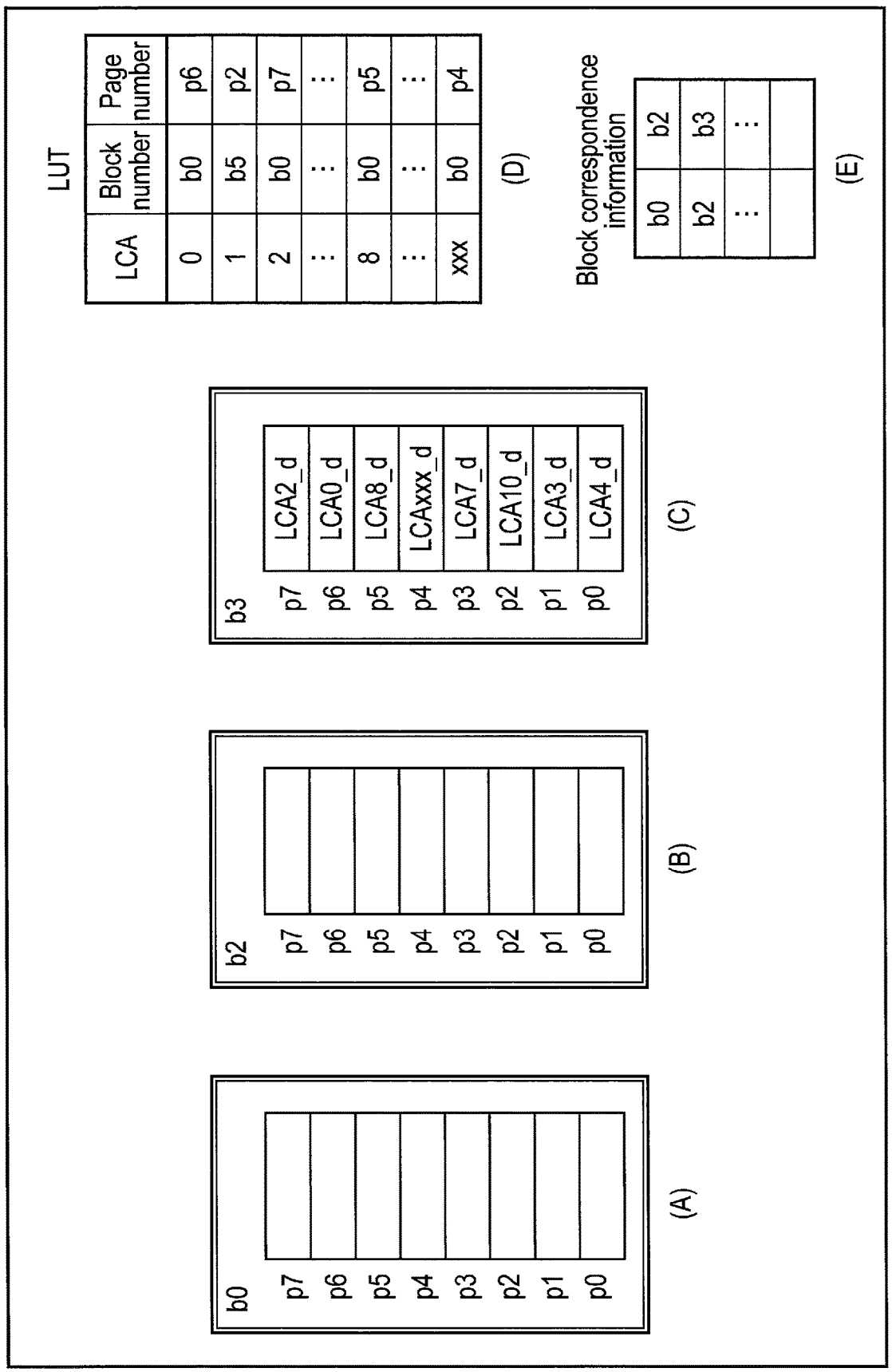
FIG. 13 is a diagram illustrating an operation of reading data portions stored in the second block of FIG. 11 one by one and writing the data portions read out one by one into a third block one by one, and block correspondence information indicating that the data portions that have been stored in the second block is further arranged in the third block in the reverse order to the arrangement of the data portions in the second block.

FIG. 13 exemplifies a case where page data portions read out one by one from the block b2 are written back to the block b3 one by one.

(B) and (C) of FIG. 13 illustrate states of the blocks b2 and b3 after eight page data portions of the block b2 described with reference to FIG. 11 are read out page by page from the nonvolatile memory 3 in the order of pages p7 to p0, and these eight page data portions are written to the block b3 of the nonvolatile memory 3 page by page.

The operation of reading one page data from the block b2 and writing the read one page data back to the block b3 via the data buffer 25 is executed in a procedure similar to that described with reference to FIG. 11. Therefore, in the block b3, these eight page data portions are arranged in the reverse order to the arrangement of these eight page data portions in the block b2 illustrated in FIG. 11.

As illustrated in (D) of FIG. 13, the memory controller 2 does not update the LUT, and, instead, adds (reversed copy) information indicating that block b3 is created by reversing the data arrangement in the block b2 to block correspondence information as illustrated in (E) of FIG. 13. This makes it possible to reduce an update amount of the LUT.

After the above, when receiving a read request designating LCA2 from the host 4, the memory controller 2 can obtain the block number b0 and the page number p7 from the LUT, and can find from block correspondence information that the block b0 is reverse copied to the block b2 and also the block b2 is reverse copied to the block b3. Combining these pieces of information, the memory controller 2 can find that the LCA2 is in the block b3 and, since the data is reversed twice, the page number corresponding to LCA2 is the page p7 that is the same as the value written in the LUT.

Figure 14:
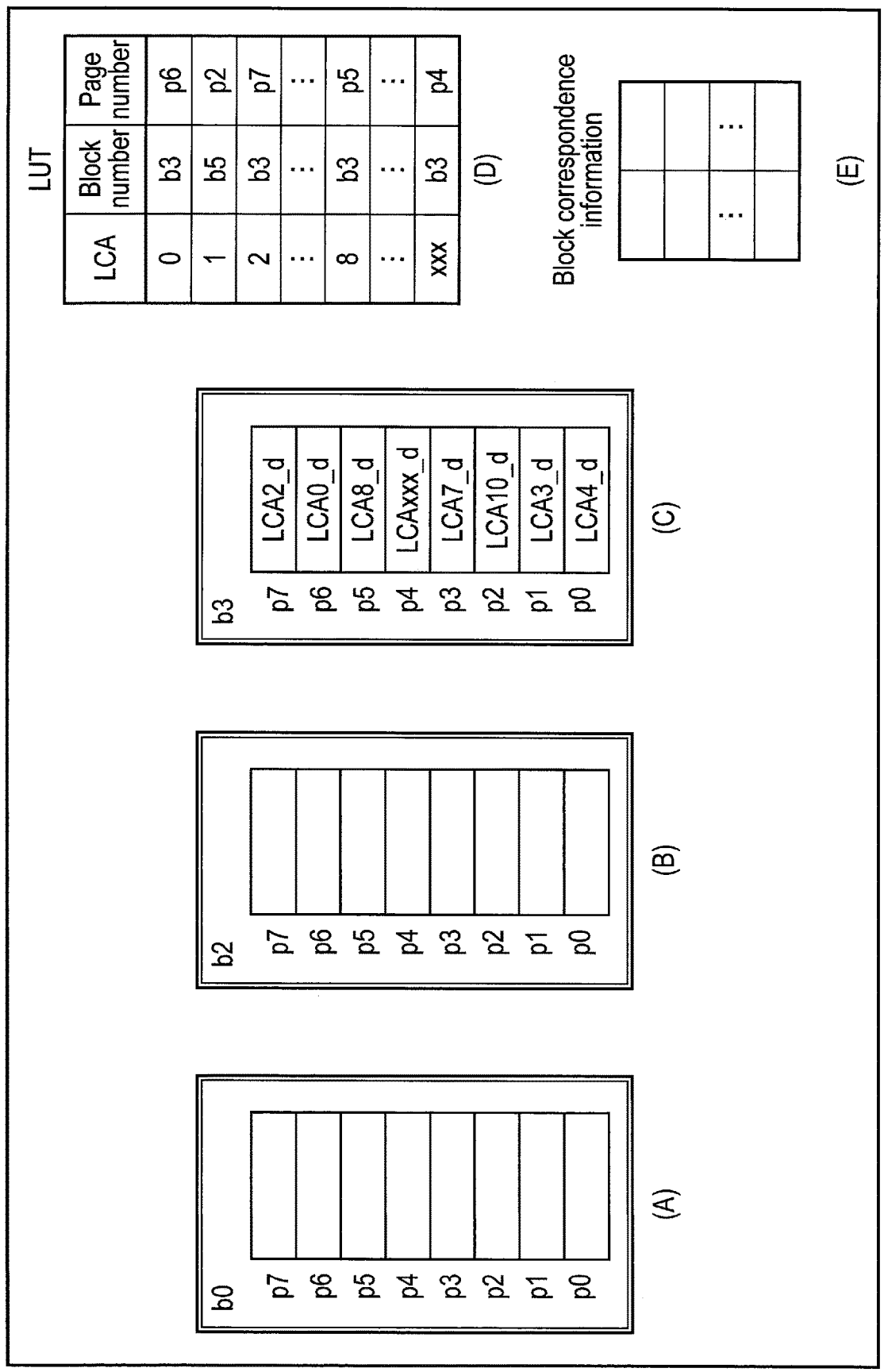
FIG. 14 is a diagram illustrating LUT updating processing executed before writing a new data portion in the third block of FIG. 13.

Note that, when new data is programmed into the block b0 or the block b2, as illustrated in (D) of FIG. 14, the LUT is updated so that the block number (b3) of the block b3 and the page number in the block b3 to which each page data portion is written are associated with each of eight LCAs corresponding to eight page data portions moved to the block b3. The updating of the LUT is performed before the data is programmed into the block b0 or the block b2. Further, as illustrated in (E) of FIG. 14, the block correspondence information associating the block b0 with the block b2 and the block correspondence information associating the block b2 with the block b3 are cleared.

Note that, what needs to be found from the block correspondence information includes (1) which block is a copy destination block to which page data portions in a block number referred to on the LUT are copied, and (2) whether page numbers of these page data portions in the copy destination block are in the reverse order or in the same order as page numbers of these page data portions indicated by the LUT. The block correspondence information may have another data structure other than the data structures illustrated in FIGS. 11 to 14.

In a case where the processing for a write request and the processing for a read request are repeatedly executed as described above, the number of times blocks are used may be biased in some cases. In a case of a memory that has an upper limit on the number of times blocks are used, if use is concentrated on part of the blocks, the number of blocks that can be used decreases due to wear and specified user capacity cannot be satisfied, which causes a system failure. Therefore, it is necessary to control so that the number of times of use of blocks is not as biased as possible.

Therefore, a method of having a shift counter (block shift counter) for each block is conceivable. These block shift counters are information for expressing the degree of wear of these blocks. A value of each block shift counter indicates a cumulative value of the number of times operation of shifting data is performed in a corresponding block. A value of each block shift counter may be incremented by one for each shift in a corresponding block, or may be incremented by one each time an entire corresponding block is accessed.

In the present embodiment, write and read of data to and from a block are executed in a unit of data corresponding to a block size. Even when eight page data portions are written to a block or when eight page data portions are read out from a block, the number of times the data is shifted is 256+β. With this as a unit, a block shift counter may also be incremented by one each time an entire block is accessed.

The memory controller 2 updates a block shift counter of a certain block each time writing processing described with reference to FIG. 6 or FIG. 7 is executed for this block. Moreover, the memory controller 2 updates a block shift counter of a certain block each time read processing described with reference to FIG. 9 or FIG. 10 is executed for this block. Moreover, the memory controller 2 updates a block shift counter of a certain block each time write-back processing described with reference to FIG. 9 or FIG. 10 is executed for this block.

In the present embodiment, the memory controller 2 copies eight page data portions stored in the pages p0 to p7 of a block having a block shift counter value larger than that of each of the other blocks based on a block shift counter value of each block in the nonvolatile memory 3 to one of the other blocks. A copy destination block may be a block having a minimum block shift counter value among available blocks (for example, free blocks).

FIG. 15 illustrates processing of copying page data stored in each page of a block having a large block shift counter value to another block.

In FIG. 15, it is shown that each of eight page data portions of the block b1 having a block shift counter value=200000 are copied to the block b2 having a block shift counter value=1000.

A flowchart of FIG. 16 illustrates a procedure of copying processing executed using a value of a block shift counter of each of a plurality of blocks.

The memory controller 2 checks a value of a block shift counter of a block i. For example, the memory controller 2 may periodically execute patrolling processing for checking a value of a block shift counter of each block. Alternatively, the memory controller 2 may check a value of a block shift counter of a block to which read target data designated by a read request from the host 4 has been written, that is, a block to which page data corresponding to a logical address designated by the read request has been written.

It is determined whether or not a value of a block shift counter of the block i is larger than a reference value (Step S41). This reference value is determined based on values of block shift counters of all blocks. Since a value of a block shift counter of each of all blocks change, this reference value is a variable reference value. This reference value may be, for example, an average value of current block shift counters of all blocks or another value obtained by applying values of current block shift counters of all blocks to a certain function.

When the value of the block shift counter of the block i is larger than the reference value (variable reference value) (Step S42), the memory controller 2 copies eight page data portions stored in the pages p0 to p7 of the block i to the block j having a smaller block shift counter value than the block i (Step S42). As described above, the block j may be a block having a minimum block shift counter value among available blocks (free blocks). Then, the memory controller 2 updates the LUT (Step S43).

A flowchart of FIG. 17 illustrates the procedure of data copying processing performed in Step S42 of FIG. 16.

The memory controller 2 repeatedly executes the processing of Steps S51 to S52 described below while changing the variable L in the order of 7 to 0.

In Step S51, the memory controller 2 reads one page data from the copy source block i. In Step S52, the memory controller 2 decodes the read page data, and corrects an error of the read page data. The decoded page data is put in the data buffer 25.

Upon completion of the processing of Steps S51 to S52 with respect to L=7 to 0, the memory controller 2 re-encodes eight page data portions stored in the data buffer 25, and writes the re-encoded eight page data portions to the copy destination block j (Step S53).

Also in the copying processing, the memory controller 2 updates a block shift counter of each of the copy source block i and the copy destination block j.

The flowchart of FIG. 18 illustrates another procedure of the data copying processing performed in Step S42 of FIG. 16.

The memory controller 2 repeatedly executes the processing of Steps S61 to S65 described below while changing the variable L in the order of 7 to 0.

In Step S61, the memory controller 2 reads one page data from the copy source block i. In Step S62, the memory controller 2 decodes the read page data, and corrects an error of the read page data. In Step S63, the memory controller 2 puts the decoded page data in the data buffer 25. In Step S64, the memory controller 2 re-encodes page data in the data buffer 25. In Step S65, the memory controller 2 writes the re-encoded page data back to the copy destination block j.

In this manner, all page data portions of the copy source block i are read out one by one and the read page data portions are written one by one to the copy destination block j.

Also in the copying processing of FIG. 18, the memory controller 2 updates a block shift counter of each of the copy source block i and the copy destination block j.

Here, the processing of copying all page data portions of a block having a large block shift counter value to a block having a smaller block shift counter value has been described. However, as described above, a block shift counter of each block can be used to select a block to which these eight page data portions read out from a block in which read target page data designated by a read request from the host 4 is stored are to be written back. For example, in the write-back processing in Step S26 in FIG. 9 or the write-back processing in Steps S36 to S38 in FIG. 10, the memory controller 2 writes read eight page data portions back to a block from which the eight page data portions are read out or another block, based on a value of a block shift counter of the block from which the eight page data portions are read out.

In this case, if the value of the block shift counter of the block from which the eight page data portions are read out is greater than the above-mentioned reference value, the memory controller 2 writes the read eight page data portions back to another block. Here, the other block only needs to be a block having a block shift counter value smaller than the block shift counter value of the block from which the eight page data portions are read out, and may be, for example, a block having a minimum block shift counter value.

On the other hand, if the value of the block shift counter of the block from which the eight page data portions are read out is not greater than the above-mentioned reference value (variable reference value), the memory controller 2 writes the read eight page data portions back to the block from which these eight page data portions are read out. In this way, it is possible to recover read eight page data portions without updating the LUT.

As described above, according to the first embodiment, the memory controller 2 changes a code amount (size of parity) of an error correction code added to page data to be written in accordance with a position of a page in the writing destination block where the page data to be written is to be stored. In each block, the number of times page data is shifted varies depending on a position of a page where the page data is stored. In the write operation, the number of shifts applied to page data which is first input to a block and is finally stored in the page p0 is the largest. The number of shifts to be applied to page data which is last input to a block and finally stored in the page p7 is the smallest. In the read operation as well, the number of shifts applied to page data stored in the page p0 is the largest, and the number of shifts applied to page data stored in the page p7 is the smallest. Therefore, by changing a code amount of an error correction code in accordance with a position of a page in a write destination block in which page data to be written is to be stored, it is possible to appropriately distribute a code amount of an error correction code to a plurality of page data portions written to each block.

In this case, if the position of the page in the write destination block where the page data to be written is stored corresponds to the last page p0 corresponding to a set of layers including the layer L0 of a last stage, the memory controller 2 increases a code amount of an error correction code added to the page data. Moreover, if the position of the page in the write destination block where the page data to be written is stored corresponds to the beginning page p7 corresponding to a set of layers including the layer L287 of a first stage, the memory controller 2 decreases a code amount of an error correction code added to the page data.

As a result, while the total size of parity included in entire data recorded in one block is maintained at a', error correction ability for page data which is shifted a larger number of times according to the write operation and the read operation can be improved.

Further, in the first embodiment, basically, write and read of data to and from blocks are executed in a unit of data corresponding to a block size. For this reason, when a plurality of page data portions corresponding to the capacity of a write destination block are written to a write destination block, a code amount of an error correction code to be added to page data to be written is changed according to the order of input of the page data to the write destination block.

Second Embodiment

Next, some other features of the memory system 1 will be described as a second embodiment.

A hardware configuration of the memory system 1 according to the second embodiment is similar to that in FIG. 1, and the configuration of the nonvolatile memory 3 used in the memory system 1 according to the second embodiment is also similar to the configuration described with reference to FIGS. 2A and 2B. Hereinafter, parts different from those in the first embodiment will be mainly explained.

First, an outline of some features of the memory system 1 of the second embodiment will be described. In the following description, specific numerical values will be exemplified for easy understanding. However, the present embodiment is not limited to these numerical values.

<Data Handling Unit>

Basically, write and read of data to and from blocks are executed not in a unit of block size, but in a unit of an ECC frame (4 KB+α'/8).

<Encoding and Decoding>

The memory controller 2 encodes a data portion to be written to a certain block of the nonvolatile memory 3 to generate a data portion to which an ECC (parity) is added, and writes the data portion to which an ECC (parity) is added to the block of the nonvolatile memory 3. The memory controller 2 decodes the data portion using the ECC attached to the data portion read out from a certain block of the nonvolatile memory 3 and corrects an error of the read data portion.

<Data Read>

When read target data designated by the host 4 is only a part of a plurality of data portions stored in a certain block, the memory controller 2 does not read all the data portions in this block from the nonvolatile memory 3, but reads minimum required one or more data portions in this block (partial read). Generally speaking, when a read target data portion designated by a read request received from the host 4 is stored in a certain page of a certain block, the memory controller 2 reads the read target data portion stored in this page and one or more other data portions stored in all of one or more other pages positioned closer to the layer L287 side in a first stage than the above page. The memory controller 2 re-encodes these read data portions and writes each of the re-encoded data portions, that is, each of data portions to which ECCs (parities) are added, back to the same block or a different block. The buffer capacity is assumed to be sufficient. Therefore, basically, reversed copying is not performed.

<Block Shift Counter>

When selecting a block to be used as a write destination block from available blocks (free blocks), the memory controller 2 can select a block having a smaller block shift counter value based on a block shift counter of each of the available blocks.

<Cache Control>

The memory controller 2 handles an upper layer group (such as the page p7) that can be accessed at high speed as a cache, and can handle a lower layer group (such as the page p0) requiring access time as a storage. In order to realize this, the memory controller 2 executes control of maintaining data having a higher access frequency at an upper layer group (the page p7 or the like). For example, in a case where user capacity of the memory system 1 is 2 TB and the block size is 32 KB, the total number of blocks is 64K blocks. The size of the user data stored in the page p7 is, for example, 4 KB. Therefore, a cache control technique handling the page p7 as a cache can realize a cache of 256 MB (=64K×4 KB).

Hereinafter, an example of operation of the memory system 1 will be described.

It is assumed that the memory system 1 has received from the host 4 a write request requesting writing of 4-KB data. The memory controller 2 writes 4-KB data to a certain block (write destination block) in the nonvolatile memory 3, and updates the LUT so that a storage location (block number, page number) where the 4-KB data is written is associated with an LCA of the 4-KB data.

Reference and updating of the LUT may be executed by the control unit 23 in the memory controller 2. In this case, when a write request is input from the host 4 to the memory controller 2 via the host interface 21, the control unit 23 determines to which block in the nonvolatile memory 3 data is to be written.

Further, when a read request is input from the host 4 to the memory controller 2 via the host interface 21, the control unit 23 refers to the LUT and identifies a storage location (block number, page number) where data (read target data) designated by the read request is stored. When the read target data designated by the host 4 is stored in the page p6 of a certain block, the control unit 23 reads not all eight page data portion of the block, but only page data of the page p7 and page data of the page p6, and decodes these page data portions (partial read). The decoded page data of the page p6 is returned to the host 4. Moreover, the control unit 23 determines a block to which the page data (read target data) of the re-encoded page p6 is to be written back. The page data of the re-encoded page p7 is written back to the same block as the block from which these page data portions are read out. The re-encoded page data (read target data) of the page p6 is written back to the same block as the block from which these page data portions are read or written back to another block.

As described above, in the present embodiment, when the read target data designated by the host 4 is only part of a plurality of page data portions stored in a certain block, not all the page data portions in this block, but at least minimum required one or more page data portions necessary for read of the read target data are read.

The number of times page data previously input to a block is shifted tends to be larger than the number of times page data input later to the block is shifted. Moreover, there may be a case where page data input most previously to a block is not designated as a read target for a long time. In this case, the page data is shifted every time reading and writing (including rewriting) of other page data is performed, but is not read out. Therefore, there is possibility that the page data is not re-encoded for a long time. Errors are easily accumulated in such page data due to the shift.

Therefore, similarly to the first embodiment, in the second embodiment as well, the code amount distribution described above for changing a code amount of an error correction code in accordance with the order in which page data is input to a block may also be applied. In this case, it is considered preferable to increase the bias of the distribution of a code amount of an error correction code to be added, depending on the order of page data to be put into a block.

Figure 19:
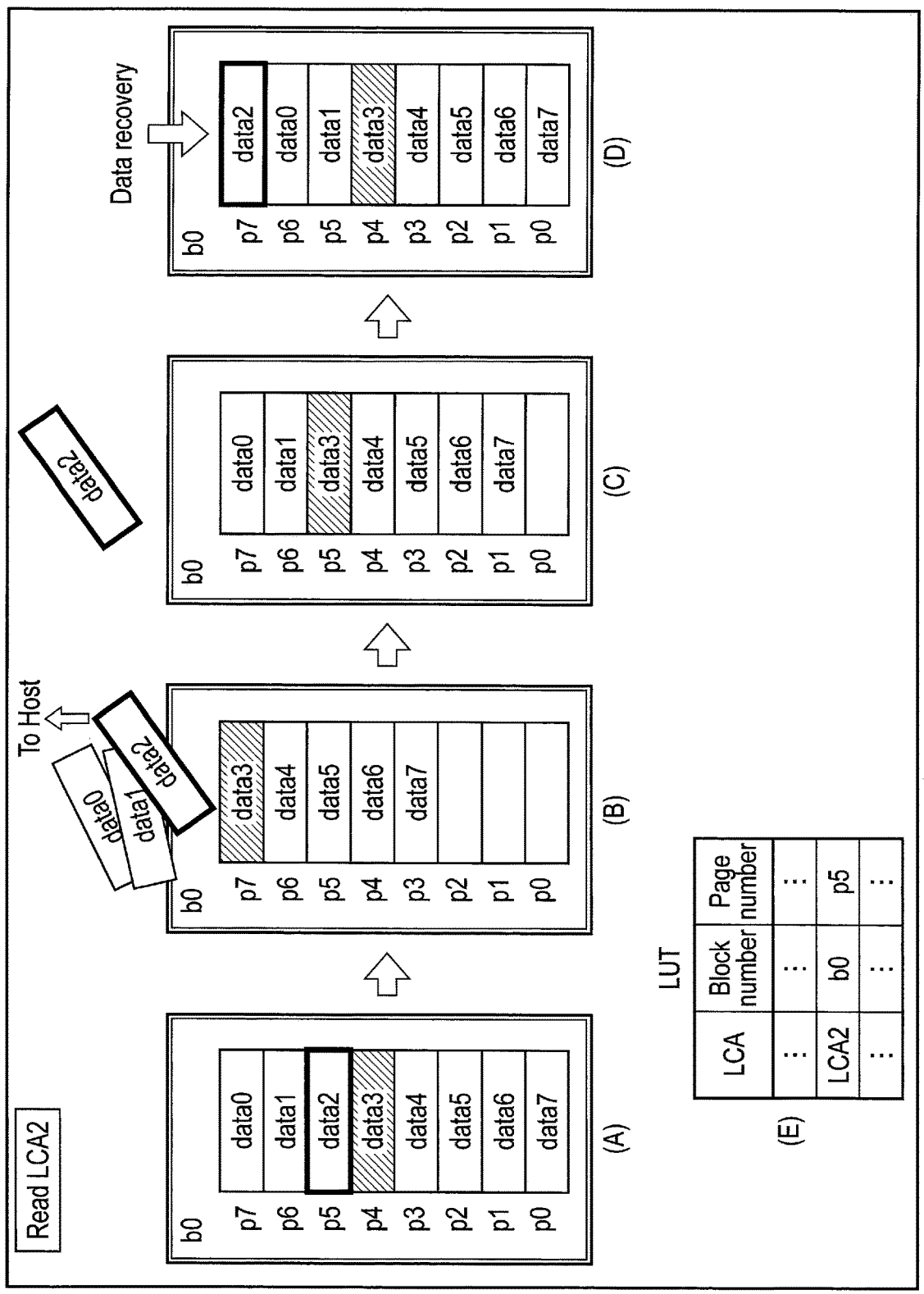
FIG. 19 is a diagram illustrating a read operation and a write-back operation executed in a memory system according to a second embodiment.

Hereinafter, operation of writing each of page data portions read out by partial reading back to the same block as the block from which the page data portions are read out will be described. (A) of FIG. 19 illustrates a state in which eight page data portions (data0 to data7) are written in the eight pages p0 to p7 in the block b0. Here, it is assumed that a read request designating LCA2 is issued from the host 4. By referring to the LUT of (E) of FIG. 19, the memory controller 2 recognizes that data corresponding to LCA2 is page data (displayed as data2) programmed into the page p5 of the block b0. In order to read the page data (data2) of the page p5, it is also necessary to read out page data (data0, data1) of the pages p7 and p6 positioned closer to the layer L287 side than the page p5. Further, it is necessary to write read target page data (data2) and page data (data0, data1), which is not a read target but read out, back to the nonvolatile memory 3. The control unit 23 in the memory controller 2 performs control of determining this write back location.

That is, as illustrated in (B) of FIG. 19, the memory controller 2 reads the page data (data0, data1, data2) of the pages p7, p6, and p5 of the block b0 from the nonvolatile memory 3, and decodes the read page data (data0, data1, data2). The memory controller 2 returns the decoded read target page data (data2) to the host 4. The memory controller 2 re-encodes each of the three page data portions (data0, data1, data2). The memory controller 2 writes the re-encoded page data (data1) and the re-encoded page data (data0) back to the block b0 except for the re-encoded read target page data (data2) ((C) of FIG. 19). The memory controller 2 writes back the re-encoded read target page data (data2) at last to the block b0 ((D) of FIG. 19).

In this way, the memory controller 2 writes back read target page data read out from a read target block to the read target block at last, so that the read target page data is written to the beginning page p7 corresponding to a set of layers including the layer L287 of a first stage of the read target block. As a result, the data recently used by the host 4 (data with high access frequency) is more likely to be stored in a page in a block closer to the layer L287, like the page p7. From the feature of the nonvolatile memory 3 to and from which data writing and read are executed by the last-in first-out method, the read latency of data stored in a page in a block closer to the layer L287 like the page p7 is small. Accordingly, overall performance improvement can be expected.

A flowchart of FIG. 20 illustrates a procedure of the read processing and the writing back processing.

The memory controller 2 determines a storage location (here, a block m and a page pn) of read target data (Step S71).

When n is 7 (YES in Step S72), the memory controller 2 reads page data stored in the page p7 of the block m (Step S73). In the read operation, data of each page is shifted in a unit of a layer in a direction from the layer L0 to the layer L287. For this reason, read of page data is also referred to as "popping page data". The memory controller 2 returns the page data of p7 to the host 4 (Step S74), and writes the page data of p7 back to the block m (Step S75). In the write operation (including the write back operation), write data is written in the page p7, and data stored in each page is shifted in a unit of a layer in a direction from the layer L287 toward the layer L0. Therefore, write of page data is also referred to as "pushing page data". Then, the memory controller 2 updates a data shift counter corresponding to the block m.

Here, a value of a data shift counter corresponding to a certain block is the number of times oldest data written in this block is shifted, in other words, the number of times page data stored in a page closest to the layer L0 in a final stage among pages to which a data portion is written is shifted. When oldest data is read out from this block, a value of a data shift counter corresponding to this block is reset to zero.

When n is not 7 (NO in Step S72), the memory controller 2 reads each of page data portions stored in the pages p7 to pn of the block m (Step S77). In Step S77, the page data of p7, . . . , the page data of pn+2, the page data of pn+1, and the page data of p7 are read from the block m. The memory controller 2 returns the page data of pn to the host 4 among the page data portions of the pages p7 to pn (Step S78). The memory controller 2 writes the page data of pn+1, the page data of pn+2, . . . , the page data of p7 back to the block m (Step S79). The memory controller 2 writes the page data of pn to the block m at last (Step S80). As a result, it is possible to arrange the page data (in this case, page data of pn) recently used by the host 4 in the beginning page p7 in a block that can be accessed at high speed. Then, the memory controller 2 updates a data shift counter corresponding to the block m.

Here, a case where read target page data read out from a read target block is written back to the page p7 of this block has been described, but the read target page data that is read out may be written to the page p7 in another block different from the read target block.

In this case, a block (data recovery block) to which the read target page data is to be written back may be selected from a plurality of blocks including the read target block.

A flowchart of FIG. 21 illustrates a procedure of processing of writing back page data to a block with an oldest page p7 among a plurality of blocks.

The memory controller 2 selects a block with an oldest page data portion written to the page p7 as a data recovery block among pushable blocks included in the plurality of blocks (Step S91). Here, the pushable block means a block to which page data can be newly written without losing page data that has already been written. A block with an oldest page data portion written in the page p7 means a block including the page p7 storing page data for which a longest time period has elapsed since a last access by the host 4 among the pages p7 of pushable blocks. Therefore, in Step S91, the memory controller 2 identifies the page p7 storing the page data for which a longest time has elapsed since a last access by the host 4 among the pages p7 corresponding to a plurality of pushable blocks, and selects a block including the identified page p7 as a data recovery block.

Then, the memory controller 2 writes back the read target page data that is read out to the block selected as the data recovery block (Step S92).

An example of selecting a data recovery block from a plurality of blocks is illustrated in FIG. 22.

There are plural blocks in the memory system 1. Here, an example focusing on the two blocks b0 and b1 is shown.

(A) of FIG. 22 illustrates that eight page data portions are written in the block b0 and seven page data portions are written in the block b1. Here, it is assumed that page data corresponding to LCA designated by a read request from the host 4 is stored in the page p5 of the block b0.

In order to read the page data (data2) stored in the page p5 of the block b0, the memory controller 2 reads the page data (data0) stored in the page p7 of the block b0, the page data (data1) stored in the page p6 of the block b0, and the page data (data2) stored in the page p5 of the block b0. The page data (data0) and the page data (data1) are decoded, and the decoded page data (data0) and the decoded page data (data1) are stored in the data buffer 25. The page data (data2) is also decoded, and the decoded page data (data2) is returned to the host 4 and stored in the data buffer 25.

The memory controller 2 re-encodes the page data (data0), the page data (data1), and the page data (data2). The memory controller 2 writes the re-encoded page data (data1) and the re-encoded page data (data0) back to the block b0. As a result, page data (data1) is stored in the page p6 of the block b0 and page data (data0) is stored in the page p7 of the block b0, as shown in (B) of FIG. 22. The page p0 of the block b0 is a page (blank page) in which valid page data is not stored.

In the present embodiment, for each candidate block to be recovered, information indicating "p7 entry order" and information indicating "push availability" are managed. The "p7 input order" is used to evaluate an elapsed time period from a last access by the host to data currently stored in the page p7. Management of information indicating the "p7 input order" is performed as described below.

Each time host access (read or write) is performed, a value of a management identifier is incremented by one. When write data corresponding to a write request received from the host 4 is written to a certain block or when read target data designated by a read request received from the host 4 is written back to a certain block, a current value of a management identifier is recorded as the "p7 input order" of this block. As a result, the smaller a value of the "p7 input order" corresponding to the block becomes, the earlier input of data to the page p7 of the block is performed.

In (A) of FIG. 22, it is assumed that page data (data10) is programmed into the block b1 when the management identifier is 100. In this case, the "p7 input order" of the block b1 is 100. Next, a host command (write request or read request) is input, and the management identifier is incremented to 101. When the page data (data0) is programmed into the block b0 by the command, as shown in (A) of FIG. 22, the "p7 input order" of the block b0 is 101.

Thus, it is indicated that the page data (data0) is newer than the page data (data10), that is, an elapsed time period from a last access by the host 4 is short.

The "push availability" for a certain block indicates whether or not there is an available page (free area) into which page data can be written in this block. Since the memory controller 2 manages input and output of page data for each block, it is possible to easily manage the "push availability" of each block.

For example, if a difference between the number of input page data portions and the number of output page data portions for a block is equal to eight, eight page data portions have already been input to this block. When page data is written (pushed) to this block, data recorded in the page p0 of this block is lost. That is, there is no free area in this block.

When a read request for reading page data (data2) is input from the host 4 in the state of (A) of FIG. 22, the management identifier is incremented to 102.

In response to this read request, page data (data0), page data (data1), and page data (data2) are read from the block b0 as described above, and the page data (data1) and the page data (data0) is written back to the block b0. Then, the memory controller 2 determines a block (data recovery block) to which the read target page data (data2) is to be written back.

As shown in (B) of FIG. 22, both the block b0 and the block b1 have free space and can be pushed. Among the pushable blocks, one with the earlier p7 entry order (old one) is selected as a data recovery block, so the block b1 is selected as a data recovery block. The page data (data2) is written back to the block b1 as illustrated in (C) of FIG. 22. Since the page data (data2) is read target data designated by a read request from the host 4, the "p7 entry order" of this block b1 is updated to the current value 102 of the management identifier. The "push availability" information of the block b1 is changed to a value indicating that pushing is not available, and the LUT is also updated.

In the above example, the number of candidate blocks can be used for data recovery is not narrowed down to a fixed number. However, in actuality, even a case where processing is simplified by limiting the number of blocks for comparing the p7 input order to a fixed number. Hereinafter, this case will be described.

A set of candidate blocks can be used for data recovery is referred to as an input buffer. In this case, when there is no pushable block in the input buffer, it is not possible to select the data recovery block. Accordingly, processing of replacing a non-pushable block in the input buffer with another block is executed.

Figure 23:
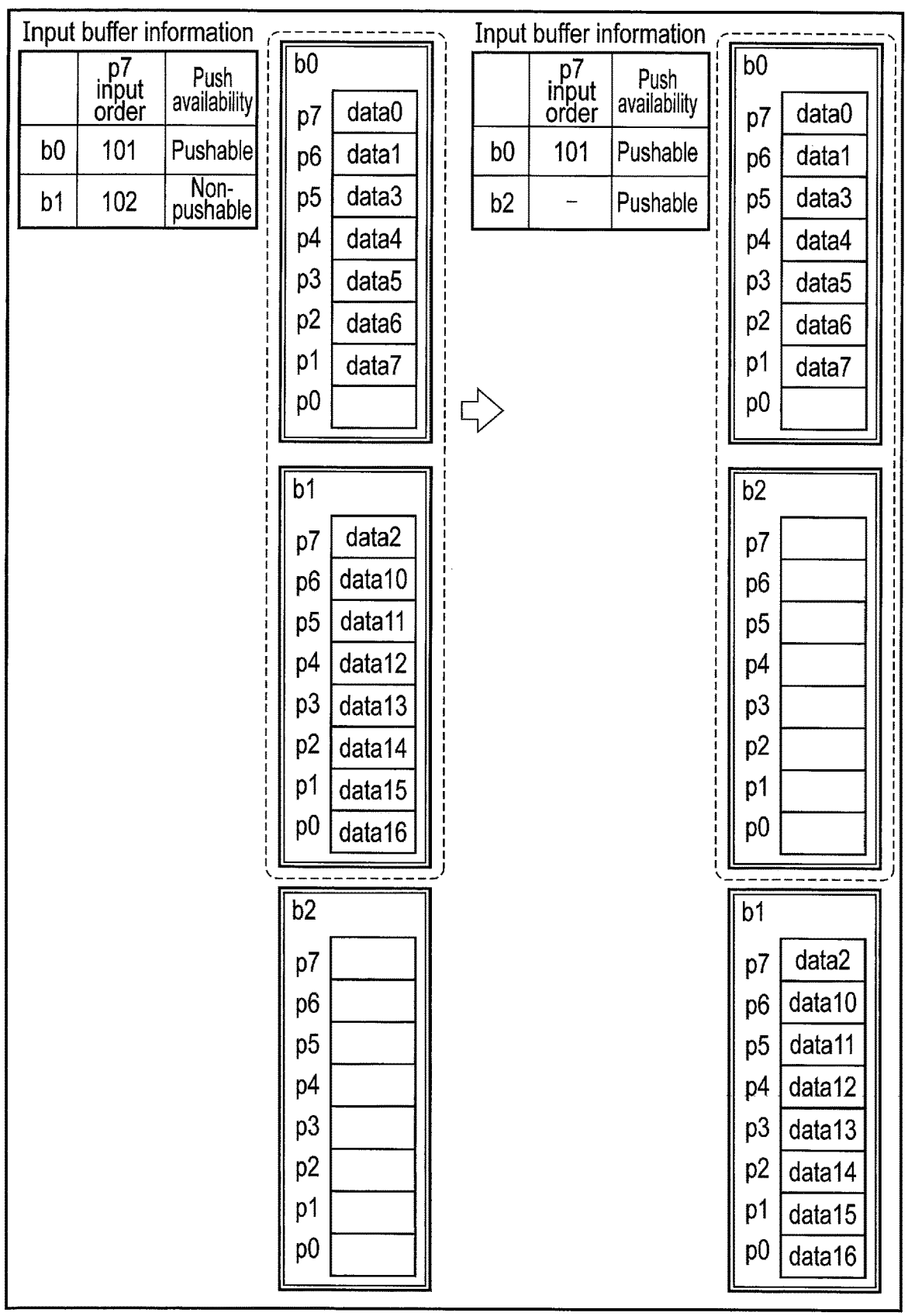
FIG. 23 is a diagram illustrating an operation of writing back a data portion to a write destination block with an oldest page p7 among two or more write destination blocks included in an input buffer.

FIG. 23 illustrates an example of processing of replacing a non-pushable block in the input buffer with another block.

FIG. 23 illustrates a case in which the two blocks h0, b1 surrounded by a broken line among the three blocks b0, b1, b2 are currently used as input buffers. That is, the input buffer includes the two blocks b0 and b1. Note that, although a case where the number of blocks included in the input buffer is two is exemplified here, the number of blocks included in the input buffer is not limited to this.

When eight page data portions are written to a certain block in the input buffer, page data cannot be input to the block. Therefore, this block is replaced with another available block. FIG. 23 assumes a case where, since the block b1 is non-pushable, the block b1 is removed from the input buffer and the block b2 which is a free block is put in the input buffer instead.

In the above description, the read target data that is read out is written back to a data recovery block selected from a plurality of blocks in an input buffer. However, the input buffer may be used as a write destination block to which data associated with a write request received from the host 4 is to be written.

In this case, also when a write request is received from the host 4, the management identifier is incremented by one. Then, based on the "p7 input order" of each of a plurality of blocks included in an input buffer, a block to which page data corresponding to the write request is to be written is selected. As shown in FIG. 23, immediately after the block b2, which is a free block, is put in the input buffer, the "p7 input order" of the block b2 shows that there is no input to the page p7 of the block b2 (shown as "–" in FIG. 23). In this case, the block b2 may be selected and page data corresponding to the write request may be written to the page p7 of the block b2.

As described above, in the present embodiment, among beginning pages (the pages p7) of a plurality of blocks in an input buffer, the page p7 storing the page data having a longest time period since the last access by the host 4, that is, the page p7 in which older data is stored is identified. Then, the page data associated with the write request is written to a block including the identified page p7.

The memory controller 2 may manage a plurality of input buffers each including two blocks selected from a set of available blocks (free blocks) instead of one input buffer.

For example, a plurality of input buffers corresponding to a plurality of logical address groups in which lower bit portions of logical addresses coincide with each other may be prepared. As an example, an input buffer used by a group of odd logical addresses and another input buffer used by a group of even logical addresses may be prepared. Alternatively, logical addresses may be classified into eight logical address groups in which lower three bits match each other, and eight input buffers corresponding to these eight logical address groups may be prepared. In any case, each input buffer always has two pushable blocks, and from these two pushable blocks a block to which page data is to be written is determined. In this case, these input buffers operate like two-way set associative cache using a least recently used (LRU) replacement algorithm. Note that the number of blocks included in each input buffer is not limited to two. For example, when the number of blocks included in each input buffer is set to four, these input buffers operate like a four-way set associative cache. Further, although the method of selecting a block to be used from a plurality of blocks in an input buffer based on the p7 input order has been described here, it is also possible to employ a method of selecting a block to be used from a plurality of blocks in an input buffer so that these blocks are sequentially used. In this case, these input buffers operate as if they are FIFO caches.

Hereinafter, a use form of these input buffers that operate as a two-way set associative cache using the LRU replacement algorithm will be described.

Consider a case where eight input buffers corresponding to eight logical address groups are prepared. Index numbers #0 to #7 are allocated to the eight input buffers. When a write request is received from the host 4, an index number corresponding to a logical address designated by the received write request is calculated according to a value of lower three bits of the logical address. Then, an input buffer corresponding to the calculated index number is selected. Of two blocks included in the selected input buffer, a block whose "p7 input order" is earlier (older) is selected. Then, page data associated with the received write request is input to the selected block, and this page data is written to the page p7 of the selected block.

Note that, in a case where pre-update data (old data) corresponding to the logical address designated by the write request is stored in the page p7 of another block different from the block group in the selected input buffer, the memory controller 2 first reads pre-update data from the page p7 of the other block and writes the page data associated with the write request to the other block. As a result, page data associated with the write request can be arranged in the page p7 without updating the LUT.

As described above, in a case where old data corresponding to a logical address designated by a write request is stored in the beginning page (p7) of another block different from a block group in a selected input buffer, instead of writing to the selected block in the input buffer, operation of reading old data stored in p7 of the other block and operation of writing page data associated with the write request to p7 of the other block from which the old data is read out.

A data recovery block to which read target data corresponding to a logical address designated by a read request from the host 4 is to be written back can also be selected from two blocks in an input buffer selected from the plurality of input buffers.

When a read request is received from the host 4, a location (block number, page number) where read target page data corresponding to a logical address designated by the received read request is stored is obtained from the LUT. The read target page data read out from a block having the obtained block number is returned to the host 4, and processing of determining a data recovery block to which this read target page data is to be written back is performed. In this case, an index number corresponding to this logical address is calculated according to a value of lower three bits of the logical address designated by the received read request. Then, an input buffer corresponding to the calculated index number is selected. Of two blocks included in the selected input buffer, a block whose "p7 input order" is earlier (older) is selected as a data recovery block. Then, the read target page data is input to the selected block, and the read target page data is written to the page p7 of the selected block.

Note that, if a page number in which the read target page data corresponding to the logical address designated by the read request is originally stored is p7, the read target page data is written back to the same block as a block from which the read target page data is read out. As a result, updating of the LUT becomes unnecessary.

If the above processing is continued, the number of free blocks not including valid data gradually decreases. Further, when plural input buffers are used, all blocks in each input buffer needs to be kept pushable.

Therefore, when the number of pieces of valid data is managed for each block, and the number of remaining free blocks not including valid data falls below a threshold value, or when the number of pushable blocks in the input buffer no longer satisfies certain conditions, a block with a small number of pieces of valid data is selected and the valid data is copied from this selected block to another block so that this selected block is reused as a free block not including valid data. Here, the valid data (valid page data) is latest data associated with a logical address (LCA in this case), which is possibly referred to by the host 4 later. Invalid data (invalid page data) is data not associated with any logical address.

Figure 24:
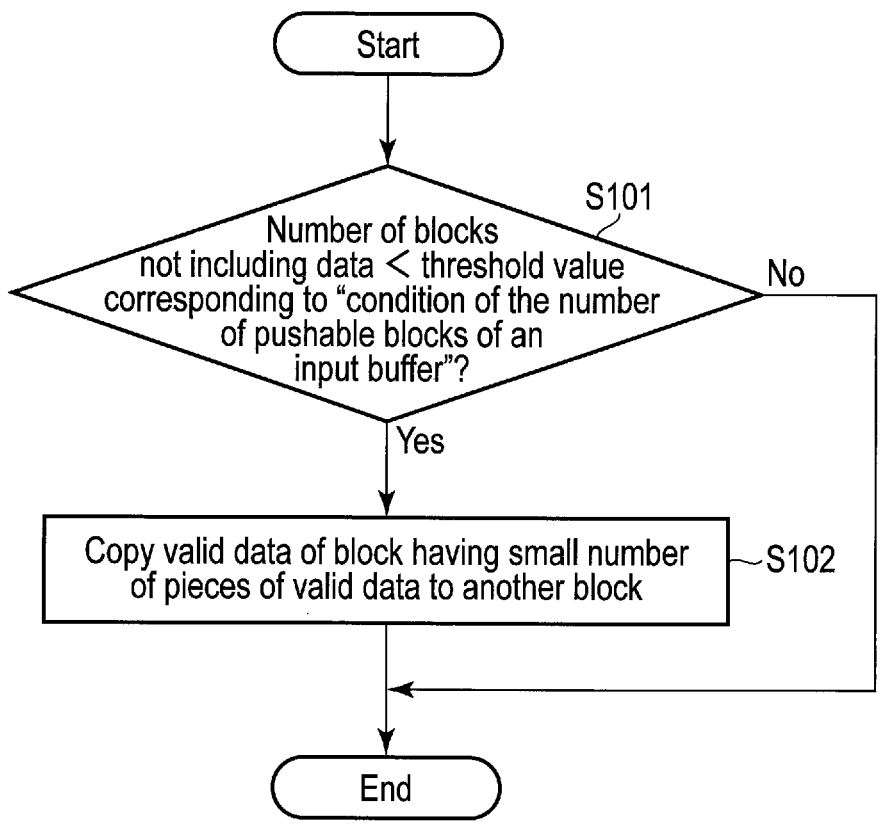
FIG. 24 is a flowchart illustrating a procedure of an operation of copying all valid data portions in a block having few valid data portions to another block.

A flowchart of FIG. 24 illustrates a procedure of an operation of copying all valid data in a block having a few pieces of valid data to another block. This operation corresponds to garbage collection (GC) of a flash memory. GC is an operation for copying all valid data in some blocks in which valid data and invalid data coexist to another block (free block) and increasing the number of remaining free blocks.

The memory controller 2 determines whether or not the number of blocks not including data (that is, the number of remaining free blocks) is smaller than a threshold value corresponding to a "condition of the number of pushable blocks of an input buffer" (Step S101).

As examples of the "condition of the number of pushable blocks of an input buffer", (1) to (3) described below and the like are conceivable.

Condition 1: All blocks included in all input buffers are pushable blocks.

Condition 2: All input buffers have at least one pushable block.

Condition 3: A pushable block is included in a certain ratio or more of input buffers (if this ratio is ½ (=50%), this condition indicates that 50% or more of all input buffers includes a pushable block).

In a case where the condition (1) or (2) is used as the "condition of the number of pushable blocks of an input buffer", when one pushable block of a certain input buffer becomes non-pushable, it is possible to quickly replenish the input buffer with a pushable block by using a free block if there is at least one free block. Then, after the above, in order to increase the number of remaining free blocks, GC may be performed in the background.

In a case where the condition (3) is used as the "condition of the number of pushable blocks of an input buffer", if the number of remaining free blocks is less than the number of input buffers not including the pushable block, there is possibility that data cannot be written to anywhere when the data is to be written. It is too late to start GC at this timing.

As described above, there is a correlation between the "condition of the number of pushable blocks of an input buffer" and a condition of a threshold value regarding the number of remaining free blocks. Therefore, in Step S101, it is determined whether or not the number of remaining free blocks is smaller than a threshold value corresponding to the "condition of the number of pushable blocks of an input buffer".

When the condition that the number of remaining free blocks is smaller than the threshold value corresponding to the "condition of the number of pushable blocks of an input buffer" is satisfied (YES in Step S101), the memory controller 2 selects a block with a small number of valid data portions (valid page data portions), and all valid page data portions in the selected block are copied to another block (Step S102). When all valid page data portions in the selected block are copied to another block, the selected block becomes a free block not including valid page data.

The number of valid data portions included in each block can be managed as described below.

When a page data portions is written to a certain block, the number of valid data portions of this block increases by one. When a page data portions is read out from a certain block, the number of valid data portions of the block decreases by one. When the read page data portion is written back to a certain block, the number of valid data portions of the block increases by one.

When old data corresponding to a logical address (LCA) designated by a write request from the host 4 is stored in a page other than the page p7 of a certain block, the page data associated with the write request is programmed into the page p7 of a pushable block (the pushable block may be the same block as a block in which the old data is stored) and the LUT is updated. The number of valid data portions of the pushable block is incremented by one. Since a storage location of old data is written in the LUT, the number of valid data portions of a block in which the old data is stored is decremented by one.

Figure 25:
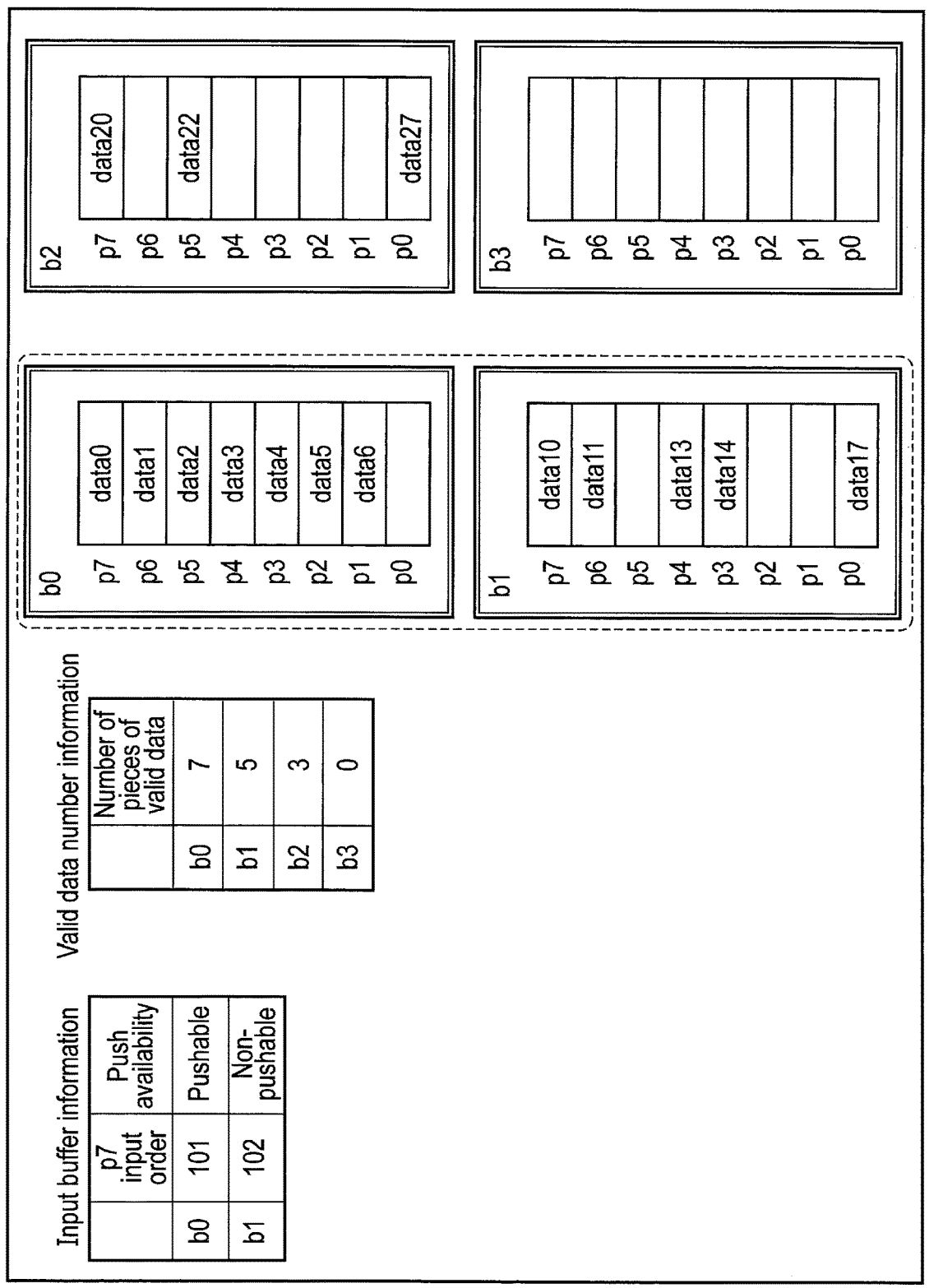
FIG. 25 is a diagram illustrating an operation of managing valid data number information indicating the number of valid data portions for each of a plurality of blocks.

FIG. 25 illustrates an example in which the number of pieces of valid data (the number of valid data portions) of the four blocks b0, b1, b2, and b3 is managed using the above method.

In FIG. 25, a page written as "data . . . " represents a page storing valid data, and a page not written as "data . . . " indicates whether invalid data is stored, or a page in which data is not stored.

In FIG. 25, the number of pieces of valid data in the block b0 is seven, the number of pieces of valid data in the block b1 is five, the number of pieces of valid data in the block b2 is three, and the number of pieces of valid data in the block b3 is zero.

Also, whether or not the data stored in each page of each block is valid data is determined as described below.

In one example, when page data is to be written to a certain block, it is conceivable to write metadata together with this page data. This metadata includes a logical address (LCA) corresponding to this page data. As a storage location of the metadata, the metadata may be written to the same page as the page to which this page data is written. Alternatively, there may be employed a method in which, at a timing at which the processing of writing eight pieces of page data to the pages p0 to p7 of a certain block is completed, eight pieces of metadata corresponding to the pages p0 to p7 are associated with a block identifier of this block and stored in another memory as log information. Each of the eight pieces of metadata includes a logical address (LCA) of the page data written to a corresponding page.

When it is to be determined whether or not the page data stored in a page py in a certain block bx is valid data, metadata corresponding to that page is referred to. If a storage location (block number, page number) corresponding to an LCA included in this metadata matches with bx, py, it is determined that the page data stored in the page py of the block bx is valid data, and if not, it can be determined that the page data is invalid data.

In this manner, valid data is managed, and when the number of blocks (free blocks) in which the number of valid data is zero becomes equal to or less than a threshold value, valid data is copied from a block with a smallest number of pieces of valid data to another block (free block) (equivalent to GC). In this way, a free block in which the number of pieces of valid data is zero is created.

In the case of FIG. 25, since one block b1 of an input buffer is non-pushable, it is necessary to replace the block b1 with another block. In the example of FIG. 25, since only the block b3 is a free block in which the number of valid data portions is zero, GC is executed.

Figure 26:
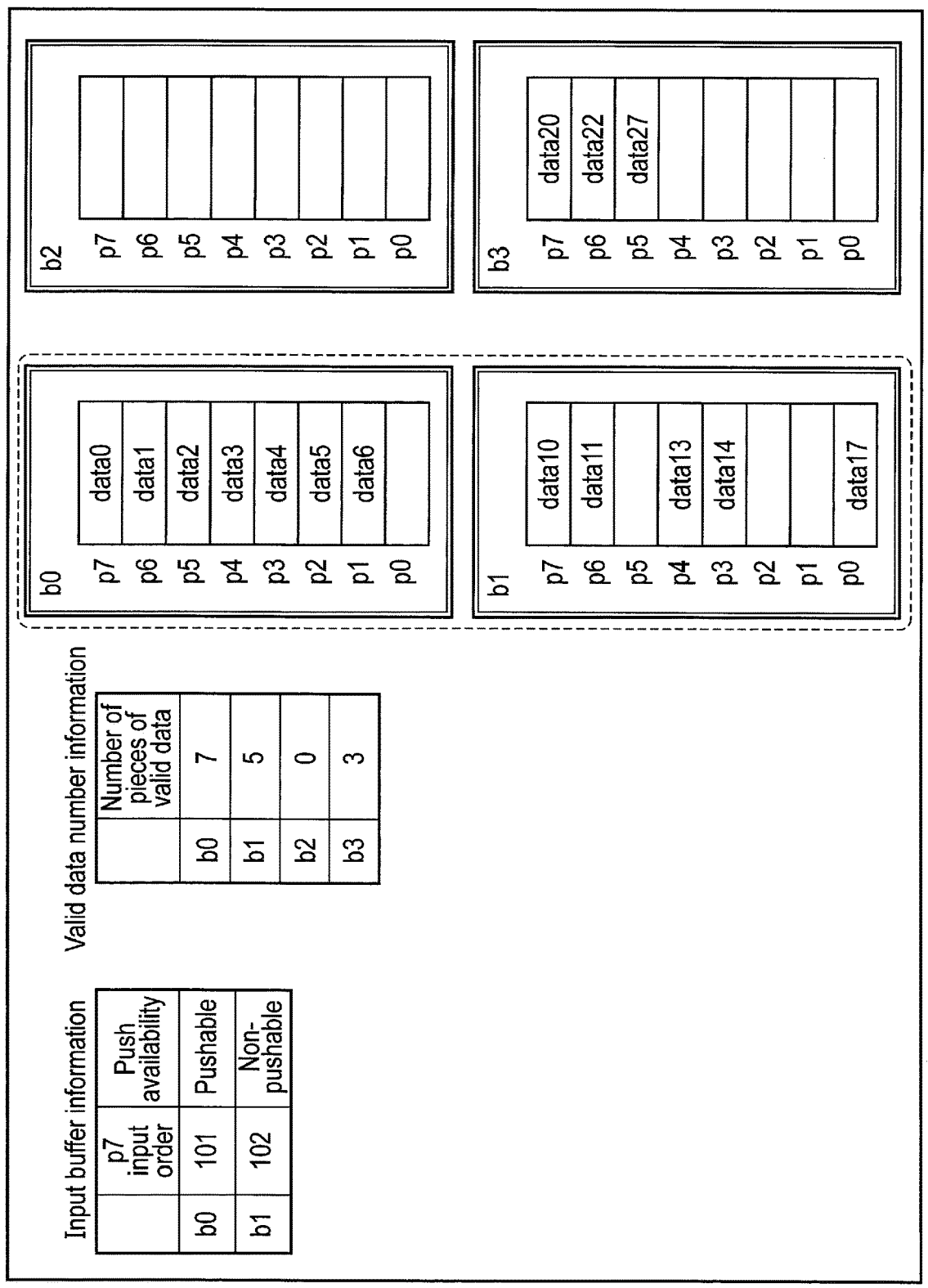
FIG. 26 is a diagram illustrating an operation of copying each valid data portion of a block b2 of FIG. 25 to a block b3 of FIG. 25.

At this time, the block b3 in which the number of valid data portions is zero is used as a data copy destination. Then, valid data portions of the block b2 in which the number of valid data portions is small is copied to the block b3 (FIG. 26).

Here, it is assumed that the valid data whose page number is large is programmed later. This is because there is possibility that page data stored in a page on an upper side in the copy source block (here, the block b2) has been accessed more recently than page data stored in the other pages. For this reason, it has been considered that it is better to preserve this positional relationship. However, it is highly likely that the block selected as the copy source block for GC (the block b2 in this case) is a block accessed relatively earlier, and it can also be considered that maintaining a positional relationship depending on the access frequency is not so important. Further, to maintain this positional relationship, a buffer corresponding to a block size is required as a copy buffer for GC.

FIGS. 27 and 28 illustrate a process of copying data using a buffer for a block size. In FIG. 27, processing of putting valid page data portions in page data portions read out from a copy source block into the data buffer 25 is executed. In FIG. 28, when the number of valid page data portions put in the data buffer 25 becomes eight, processing of writing the valid page data portions to the nonvolatile memory 3 and resetting the number of the valid page data portions is executed. Here, an example in which page data portions put in the data buffer 25 are encoded is shown. However, the configuration is not limited to the example.

<Explanation of FIG. 27>

Steps S111 to S114 shown below are processing for copying valid page data to a data buffer.

The memory controller 2 repeatedly executes the processing of Steps S111 to S114 described below while changing the variable L in the order of 7 to 0. The memory controller 2 reads one page data from the block j (copy source block) (Step S111) and decodes the page data (Step S112). The memory controller 2 determines whether or not the read page data is valid page data (Step S113). When the read page data is valid page data (YES in Step S113), the memory controller 2 put the read page data in the data buffer 25 (Step S114).

<Explanation of FIG. 28>

The memory controller 2 determines whether or not the number of page data portions in the data buffer 25 is eight (Step S121). When the number of page data portions stored in the data buffer 25 is eight (YES in Step S121), each of these eight page data portions is encoded (Step S122). Then, the memory controller 2 writes the eight encoded page data portions to the nonvolatile memory 3 and resets the number of data in the data buffer 25 to zero (Step S123).

Figure 29:
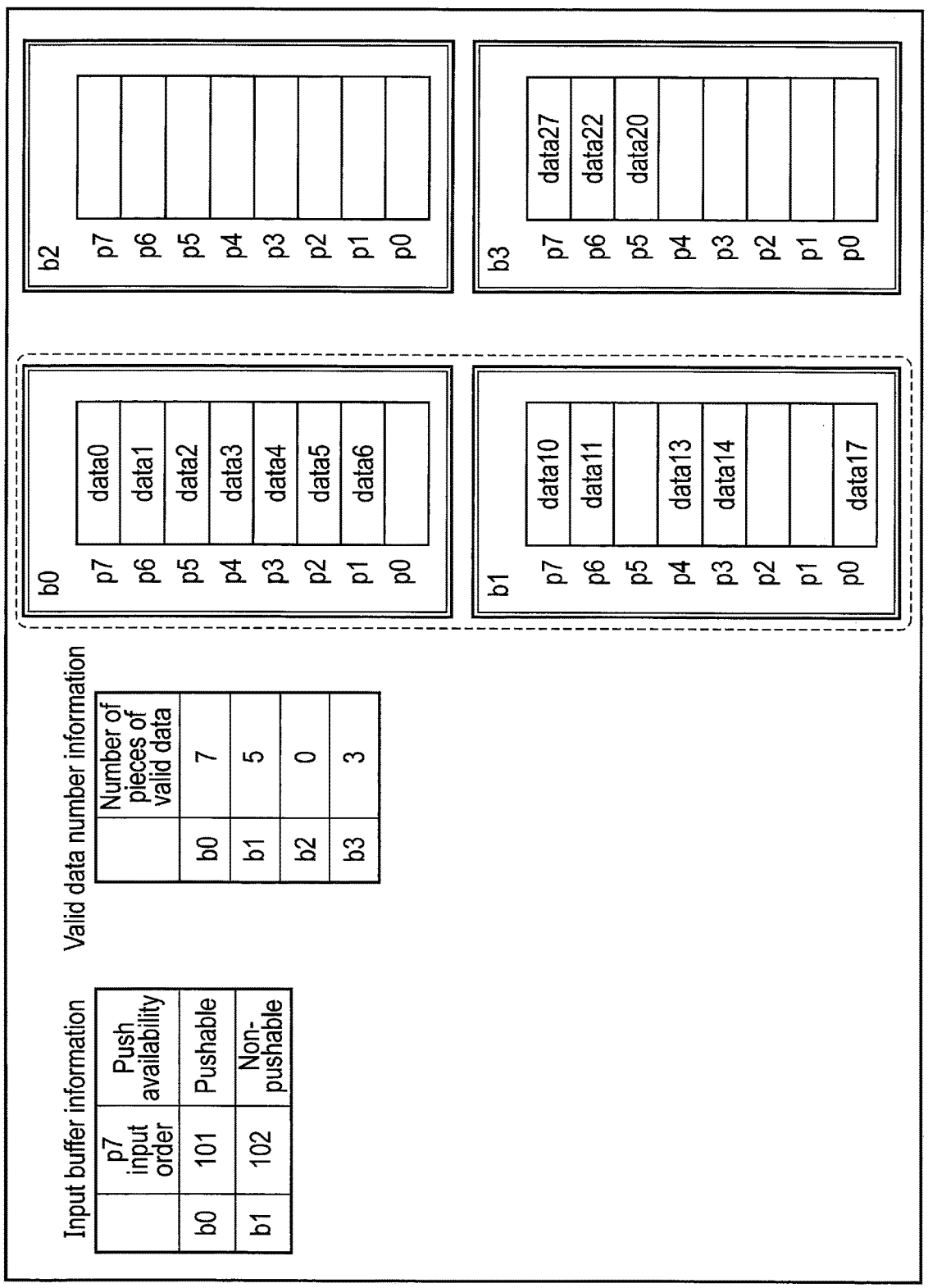
FIG. 29 is a diagram illustrating an operation of reading valid data portions of the block b2 of FIG. 25 one by one and copying the valid data portions read-out one by one to the block b3 of FIG. 25 one by one.

In copy processing for GC, it is also conceivable to perform reading of data from a copy source block and writing of data to a copy destination block in a unit of a page. In that case, the data order is reversed between the copy source block and the copy destination block. FIG. 29 illustrates a case where the above is applied. A process of this case is illustrated in FIG. 30.

Figure 30:
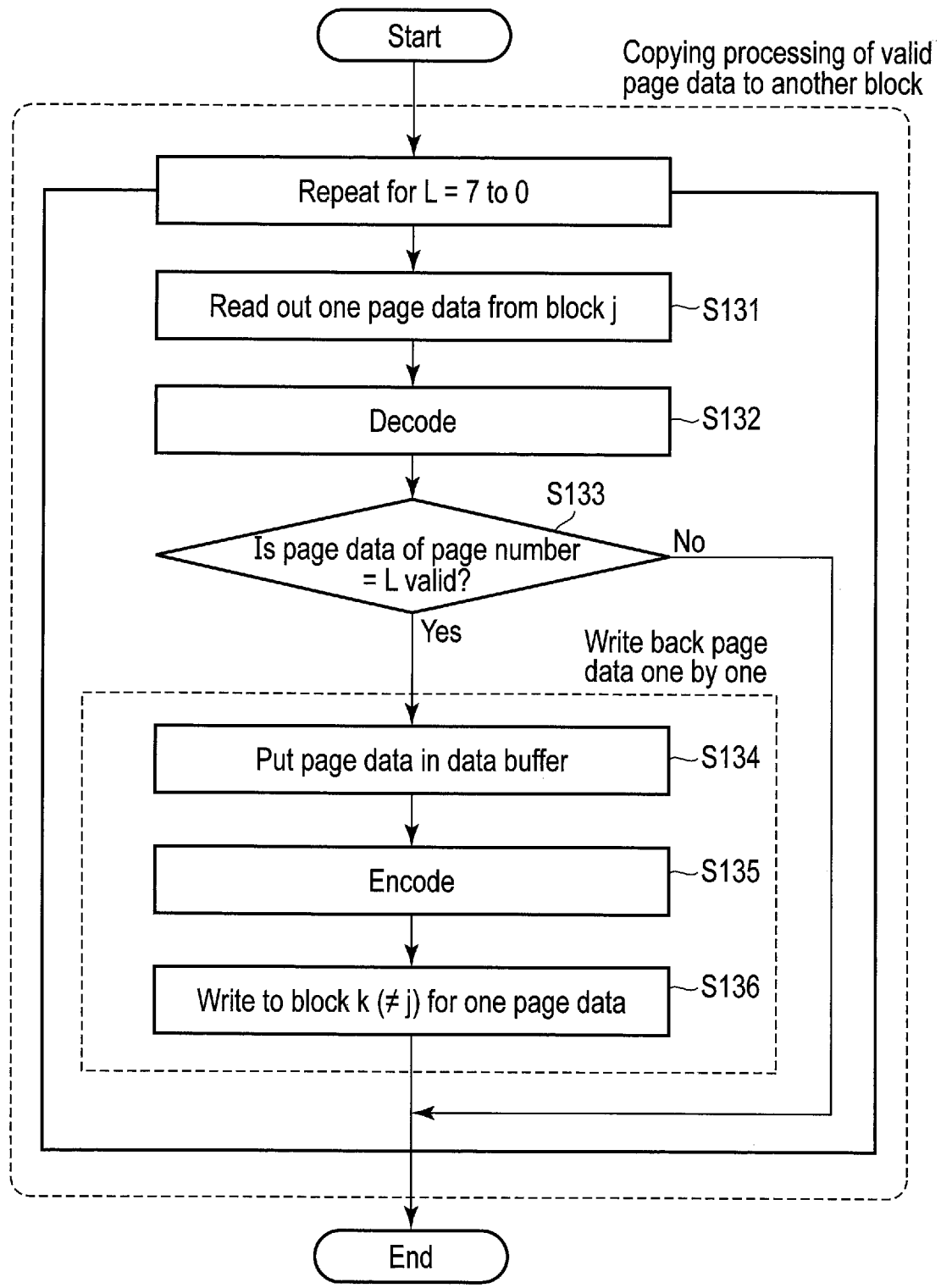
FIG. 30 is a flowchart illustrating a procedure of an operation of reading valid data portions of the block b2 one by one and copying the valid data portions read out one by one to the block b3 one by one.

<Explanation of FIG. 30>

Steps S131 to S136 shown below are processing for copying valid page data to another block.

The memory controller 2 repeatedly executes the processing of Steps S131 to S136 described below while changing the variable L in the order of 7 to 0.

The memory controller 2 reads one page data from the block j (copy source block) (Step S131) and decodes the page data (Step S132). Next, the memory controller 2 determines whether or not the read page data is valid page data (Step S133). If the read page data is valid page data (YES in Step S133), the memory controller 2 puts the read page data into the data buffer 25 (Step S134) and encodes the page data (Step S135). Then, the memory controller 2 writes the encoded page data to another block k (Step S136).

Assuming that GC can continue until the number of free blocks in which the number of valid data portions is zero becomes two or more, the processing described below is executed. Hereinafter, it is assumed that GC is performed in a state in which a vertical position relationship of valid page data portions in a copy source block is maintained.

Figure 31:
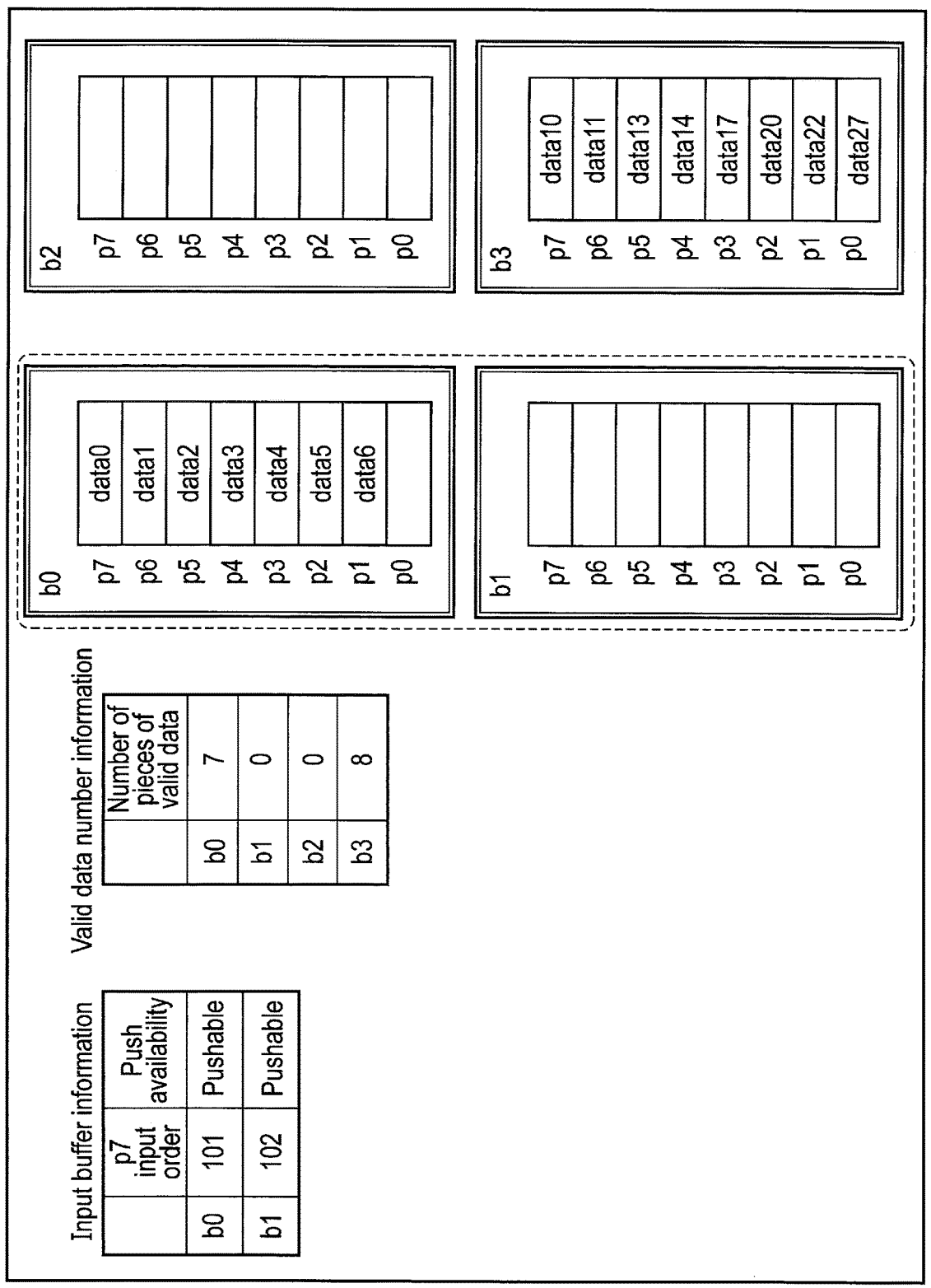
FIG. 31 is a diagram illustrating an operation of copying valid data portions of the block b1 of FIG. 25 to the block b3 of FIG. 25 in order to create two free blocks.

In the state shown in FIG. 26, processing of selecting the block b1 having a small number of valid data portions (valid page data portions) and copying the valid page data portions from the block b1 to the block b3 is executed. As a result, as shown in FIG. 31, since the number of blocks in which the number of valid data portions is zero becomes two and the block b1 can be used as a block for an input buffer, the processing of GC is ended.

Here, since a block in which the number of valid data portions is small is preferentially selected as a copy source block for GC, data is copied in the order of the block b2 and the block b1. It is also conceivable to perform GC so that valid page data portions of blocks including new data are placed on pages on an upper side based on the "p7 input order" of each of the blocks b2 and b1. When considering that the data access frequency of a block used as a copy source for GC is not so high, the method shown here (a block in which the number of valid data portions is small is preferentially selected as a copy source block for GC) may be considered to be used as a method that can be easily managed.

On the other hand, even a block in which the number of valid data portions is not zero is a pushable block if valid data is not stored in the page p0. Therefore, by managing the number of pushable data portions in each block, it is possible to delay a GC start timing for creating a free block.

Figure 32:
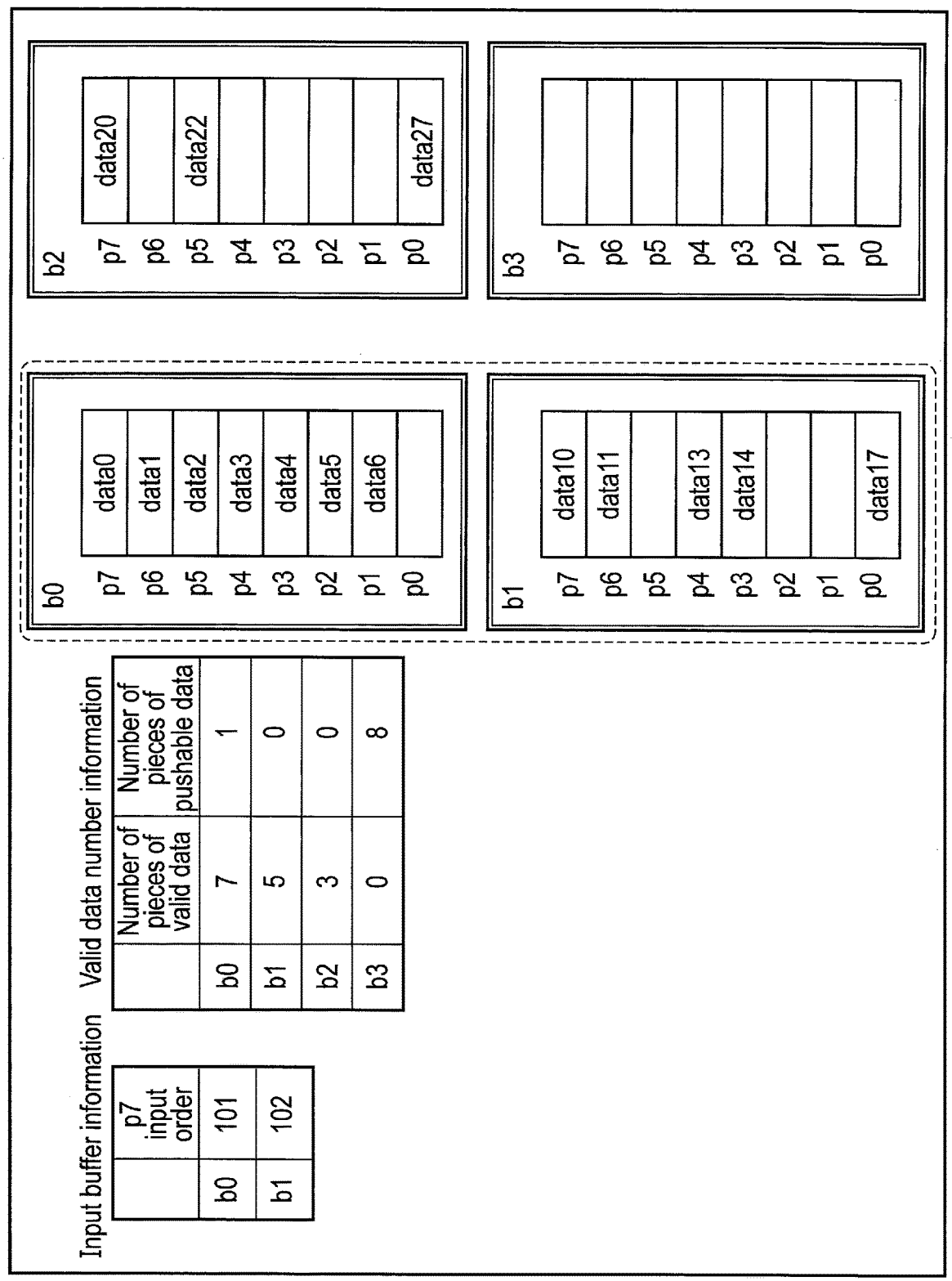
FIG. 32 is a diagram illustrating an operation of managing a pushable number indicating the number of pushable data portions in addition to valid data number information indicating the number of valid data portions, for each of a plurality of blocks.

FIG. 32 illustrates an example in which the number of pieces of valid data (the number of valid data portions) and the number of pieces of pushable data (the number of pushable data portions) are managed for each block. Also in this case, since the block b1 which is one of two blocks in an input buffer has become non-pushable, it is necessary to replace the block b1 with a new block. However, there are only two pushable blocks.

Management of a pushable number is performed as described below. Here, the pushable number of a certain block indicates the number of page data portions that can be newly written to this block without causing loss of data in this block.

When the data of the page p0 of a certain block is invalidated, the pushable number is incremented by one. In addition to the above, when data on a lowermost page among valid page data portions of a certain block becomes invalid, that is, if data of a page number matching with the pushable number becomes invalid, the pushable number is incremented by one. When the number of blocks with non-zero pushable number becomes less than or equal to a threshold value, control is exercised to activate GC. For example, when the number becomes two or smaller, GC is performed.

Figure 33:
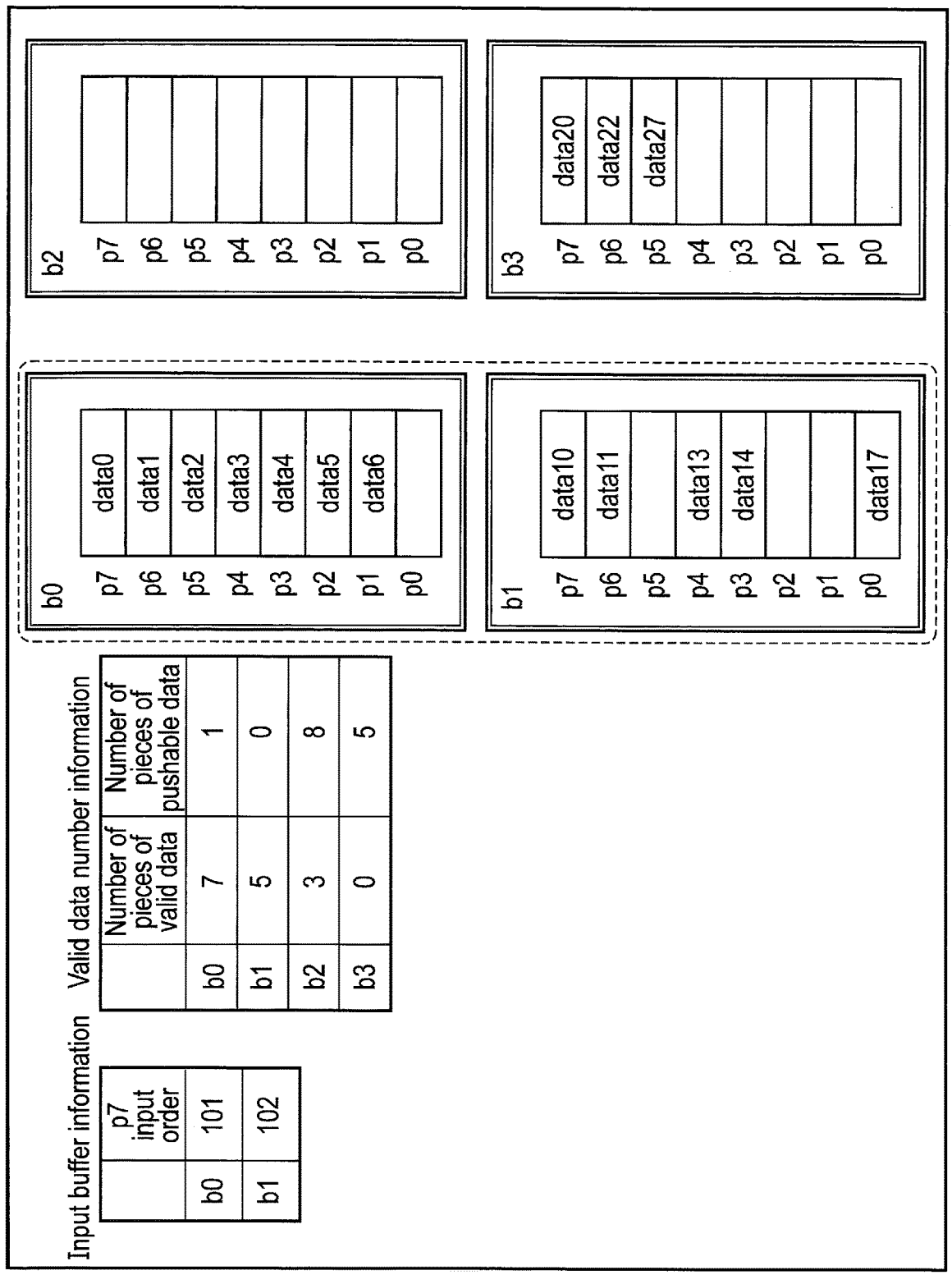
FIG. 33 is a diagram illustrating a result of copying the valid data portions of the block b2 of FIG. 32 to the block b3 of FIG. 32.
Figure 34:
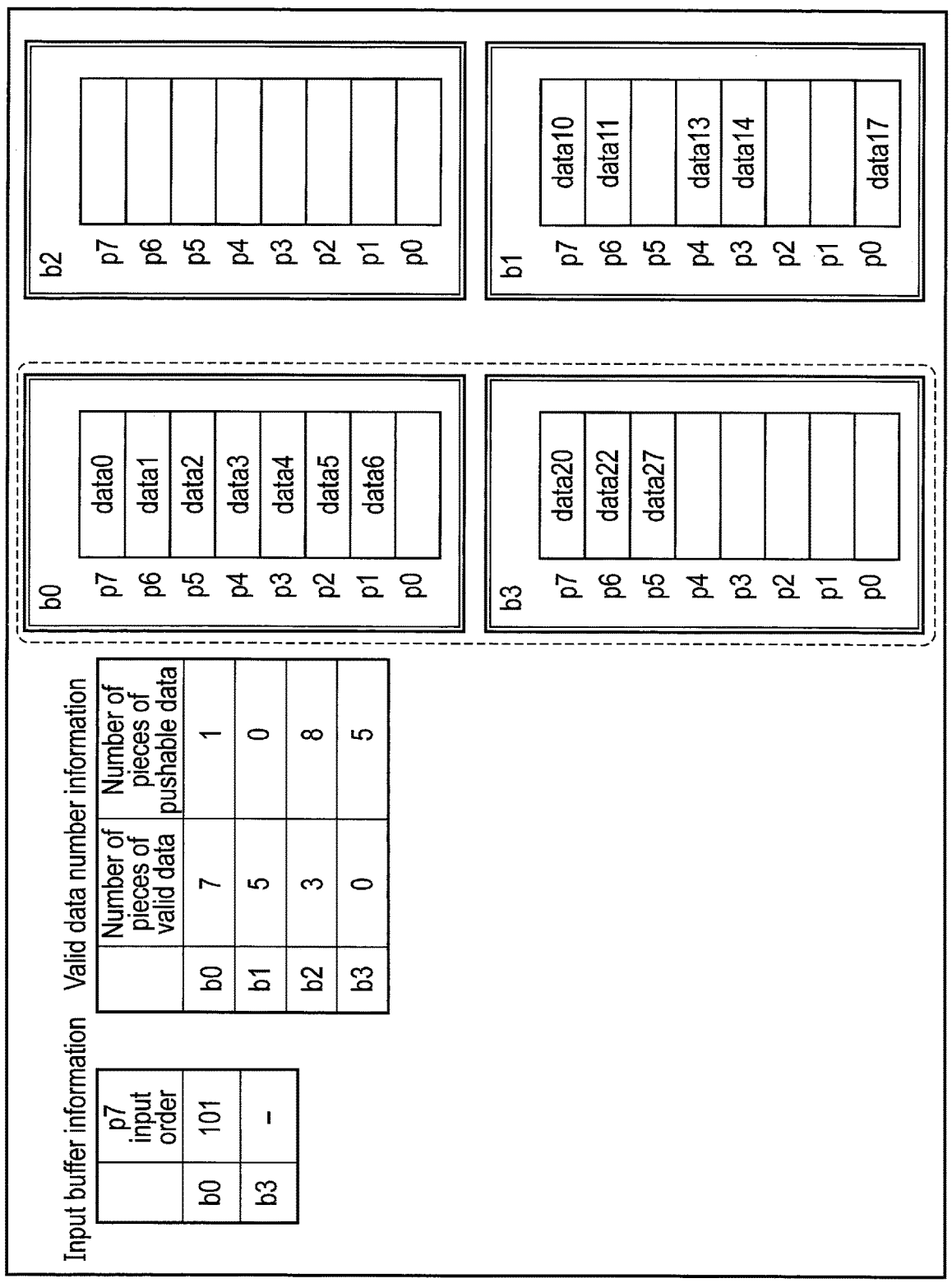
FIG. 34 is a diagram illustrating an operation of replacing a non-pushable block in an input buffer with another block that is pushable so that the number of pushable blocks included in the input buffer becomes two.

In the case of FIG. 32, since there are two blocks having a non-zero pushable number, GC is performed. Valid data portions of the block b2 in which the number of valid data portions is small are copied to the block b3. A subsequent state is shown in FIG. 33. Then, since there are three blocks with a non-zero pushable number, GC is finished. This makes it possible to arrange two pushable blocks in an input buffer (FIG. 34). When the block b3 is given as an input buffer, the p7 input order information of the block b3 should originally be set in the order of input when the data (data20) of the block b2 is inputted. However, when information of the p7 input order is managed not for all blocks, the information is lost. In one example, this p7 data is data copied by GC, and may be handled in a similar manner as when a block is first used ("–" is entered in the diagram) if it is considered not necessary to emphasize input order information as compared with other data.

Figure 35:
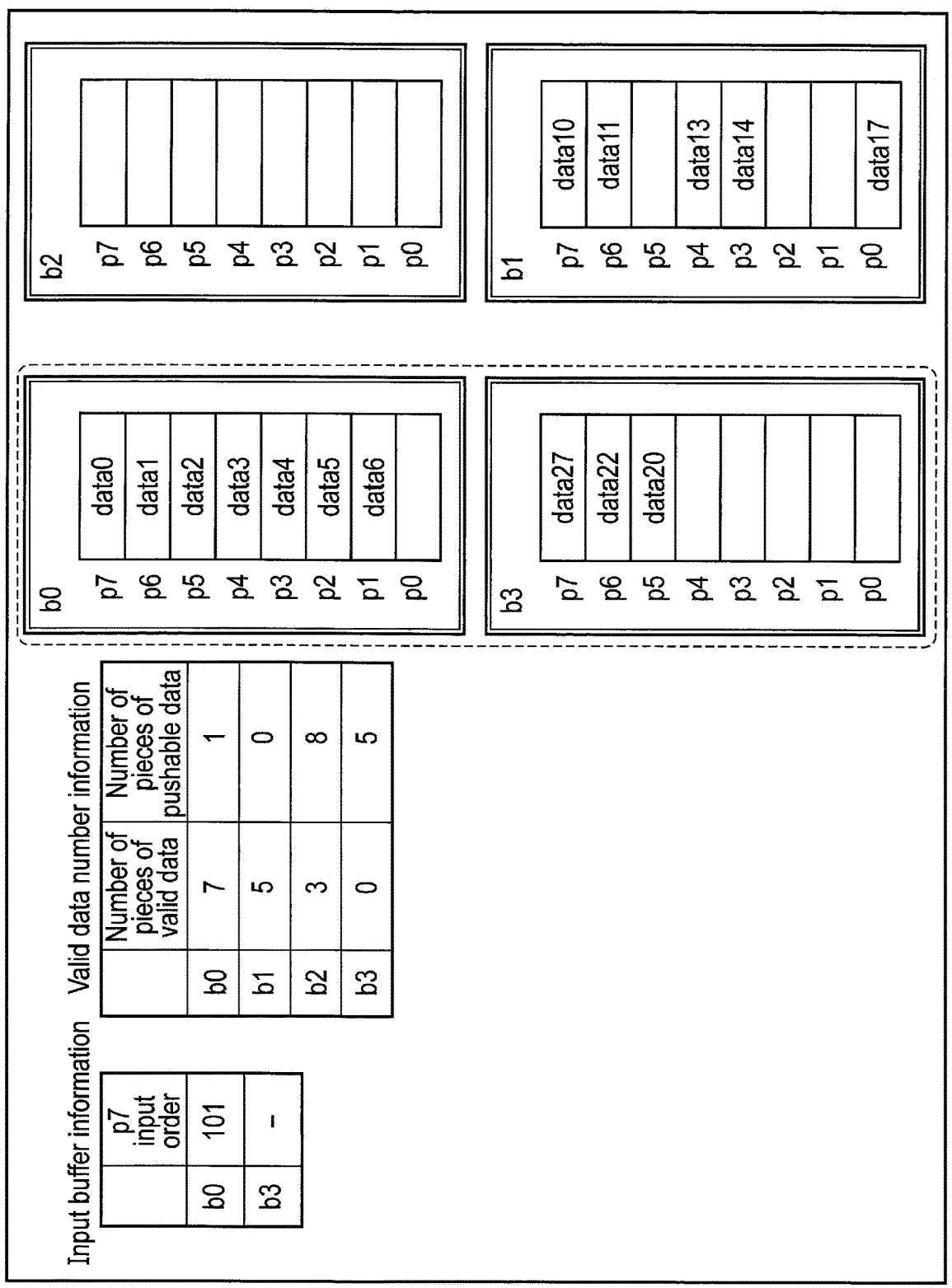
FIG. 35 is a diagram illustrating an example of data placement in another block that is pushable.

Here, it is exemplified that each of valid page data portions is copied from a copy source block to a copy destination block so that the order (a vertical position relationship) of the valid page data portions in the copy source block is maintained. However, when it is necessary to reduce size of a copy buffer for GC, the valid page data portions may be copied one page at a time. In this case, the data order of the copy destination block is reverse to that of the copy source block (FIG. 35, the process is as described in FIG. 30).

Note that, when selecting a free block for an input buffer from a free block group or selecting a copy destination block for GC, by employing a block shift counter similarly to the first embodiment, a block with a smaller block shift counter value is preferentially used, and leveling of wear of each block can be achieved. Since a copy source block for GC is also used as a free block after the GC is finished, it is also conceivable to preferentially select a block with a small block shift counter as a copy source block.

As described above, according to the second embodiment, when read target page data designated by a read request received from the host 4 is stored in a beginning page of a first block, read target page data stored in the beginning page and one or more other page data portions stored in all of one or more other pages positioned closer to the layer L287 side corresponding to a first stage than the beginning page are read, and the read target page data that is read out is returned to the host 4. Then, the read one or more other page data portions are written back to the first block. The read target page data that is read out is written back to the last of the first block so as to be written to the beginning page p7 corresponding to a set of layers including the layer L287 of a first stage of the first block, or the read target page data that is read out is written back to another block different from the first block so as to be written to the beginning page p7 of the other block.

Therefore, it is possible to use the page p7, which can be read out with a smaller number of shifts, as a cache for storing data recently used by the host 4. Therefore, data with high access frequency can be read from the nonvolatile memory 3 at high speed, and read latency can be reduced.

Further, in the second embodiment, a plurality of input buffers each including two or more blocks selected from a set of available blocks (free blocks) are managed. When a write request is received from the host 4, one of a plurality of input buffers is selected according to a logical address designated by the write request. Among beginning pages (the pages p7) corresponding to each of two or more blocks in the selected input buffer, the page p7 storing oldest page data, that is, the page p7 storing page data for which a longest time period has elapsed since a final access by the host 4 is identified. Then, the page data associated with the write request is written to a block including the identified page p7. This makes it possible to handle the page p7 of each of two or more blocks as if it were a set associative cache having two or more ways.

Third Embodiment

Next, still some other features of the memory system 1 will be described as a third embodiment. A hardware configuration of the memory system 1 according to the third embodiment is similar to that in FIG. 1, and the configuration of the nonvolatile memory 3 used in the memory system 1 according to the third embodiment is also similar to the configuration described with reference to FIGS. 2A and 2B. Hereinafter, parts different from those in the first embodiment will be mainly explained.

First, an outline of some features of the memory system 1 of the third embodiment will be described. In the following description, specific numerical values will be exemplified for easy understanding. However, the present embodiment is not limited to these numerical values.

<Data Handling Unit>

Basically, writing and reading of data to and from blocks are executed not in a unit of block size, but in a unit of an ECC frame (4 KB+α'/8), like the second embodiment.

<Encoding and Decoding>

The memory controller 2 encodes a data portion to be written to a certain block of the nonvolatile memory 3 to generate a data portion to which an ECC (parity) is added, and writes the data portion to which an ECC (parity) is added to the block of the nonvolatile memory 3. The memory controller 2 decodes the data portion using the ECC attached to the data portion read from a certain block of the nonvolatile memory 3 and corrects an error of the read data portion.

<Data Read>

As in the second embodiment, the memory controller 2 executes partial read. However, there are cases where the read data portion is not written back. If there is data that needs to be written back among read data, the memory controller 2 re-encodes the data that needs to be written back and writes the re-encoded data back to the same block or a different block. The memory controller 2 can select a block to which read data is to be written back by finding each block's wear based on a block shift counter.

<LUT Management>

When writing write data associated with a write request received from the host 4 to a certain block, the memory controller 2 manages, by using the LUT, a correspondence relationship between a logical address designated by the write request, a block identifier of this block, and data number information indicating the number of page data portions written to this block before the write data is written. When receiving a read request from the host 4, the memory controller 2 identifies a page in which read target data is stored based on the number of page data portions currently written to a block in which the read target data is stored and the number of page data portions indicated by data number information corresponding to the read target data.

<Data Shift Counter>

For each of a plurality of blocks in the nonvolatile memory 3, the memory controller 2 manages a counter value indicating the number of times that an oldest data portion in the block has been shifted. The old data portion is a data portion stored in a page closest to the layer L0 of a final stage among pages to which data portions are written. This counter value is used to estimate an amount of error accumulated in an oldest data portion. This counter is referred to as a data shift counter.

Hereinafter, an example of operation of the memory system 1 will be described.

It is assumed that the memory system 1 has received from the host 4 a write request requesting writing of 4-KB data. The memory controller 2 writes 4-KB data to a certain block (write destination block) in the nonvolatile memory 3. In this case, in the present embodiment, the LUT is managed as described below.

In the nonvolatile memory 3, when a first page data portion is written to a certain block and a second page data portion is written to the block, the second page data portion is written to the page p7 of the block and the first page data portion moves from the page p7 of the block to the page p6. When a third page data portion is further written to the block, the first page data portion moves from the page p6 to the page p5 of the block, and the second page data portion moves from the page p7 of the block to the page p6. Therefore, in a configuration in which mapping information indicating the correspondence between each logical address and each physical address (block number, page number) is managed by the LUT, it is necessary to update many pieces of mapping information each time data is added to a block.

Therefore, in the present embodiment, considering the feature that all page data portions in a block are shifted every time data is added to the block, when a certain data portion is written to a block, a block identifier of the block and data number information indicating the number of page data portions that have been written to the block are managed by the LUT, and, further, information on how many data portions are currently written to this block is managed separately. That is, in the LUT, a correspondence relationship between a logical address (LCA) designated by a write request, a block identifier of a block to which data is written, and data number information (LCAinfo) indicating the number of page data portions that have been written to the block before the data is written is managed.

Figure 36:
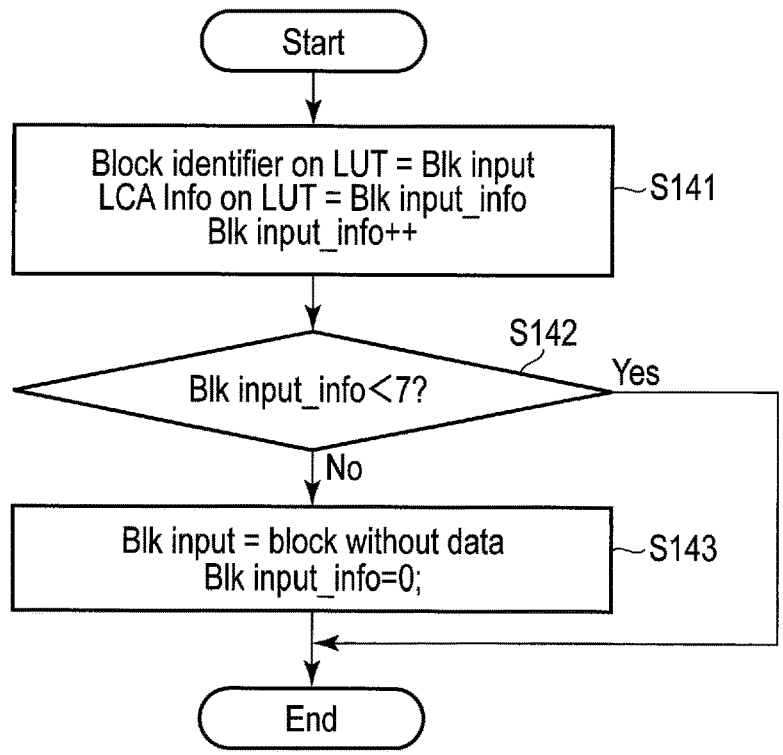
FIG. 36 is a flowchart illustrating a procedure of LUT updating processing in a memory system according to a third embodiment.

A flowchart of FIG. 36 illustrates a process of LUT updating processing when page data corresponding to a logical address (LCA) designated by a write request is written to a certain block. Here, it is assumed that a block to which page data is to be written is Blk input. Further, it is assumed that some of page data portions have already been written to this block. It is assumed that the number of page data portions already written to this block (Blk input) is managed as Blk input_info in a data number information table (info table) different from the LUT.

In Step S141, Blk input is set to a block identifier on the LUT corresponding to the designated LCA, Blk input_info is set to the data number information (LCAinfo) on the LUT corresponding to the LCA, and Blk input_info on the info table is incremented by one. Here, Blk input_info=7 indicates that Blk input stores eight page data portions.

If Blk input_info has reached seven (NO in Step S142), Blk input stores eight page data portions and new page data cannot be stored. Accordingly, a write destination block is switched to a free block having no data, and Blk input_info is initialized. Therefore, in Step S143, a block identifier of this free block is set to a block identifier on the LUT corresponding to the designated LCA, and the data number information (LCAinfo) on the LUT corresponding to the designated LCA is set to zero.

Figure 37:
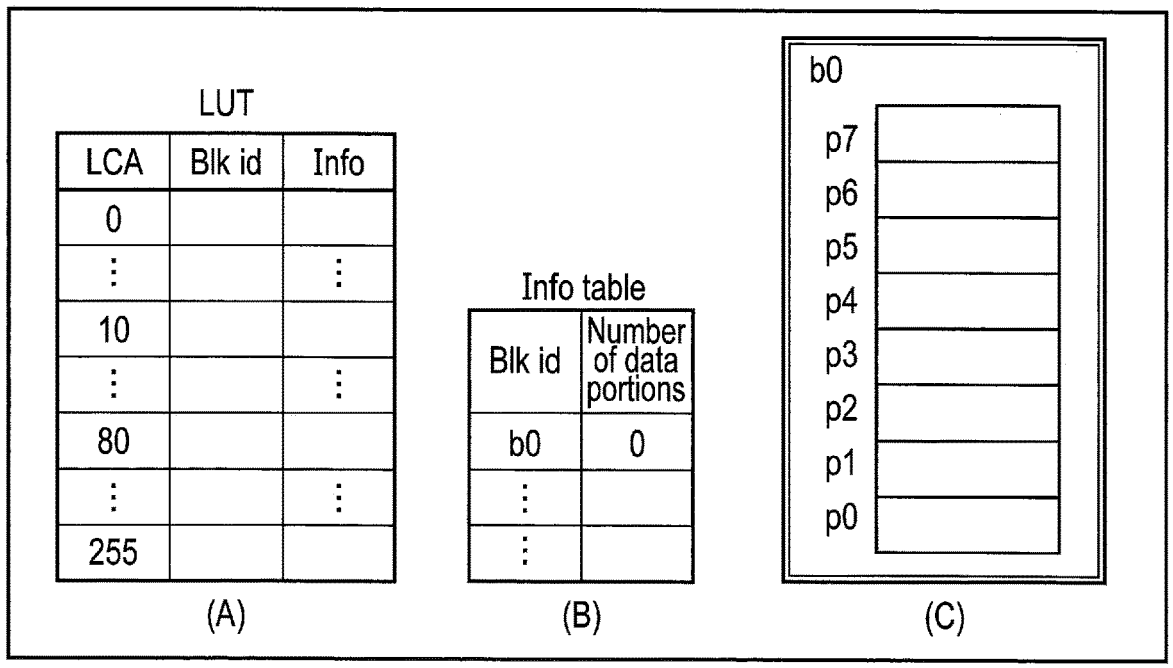
FIG. 37 is a diagram illustrating content of each of an LUT and an info table in an initial state.

It is now assumed that a logical address of page data to be written is LCA0 and this page data is written to the block b0. FIG. 37 illustrates LUT information in an initial state, a data number information table (info table) for each block, and a state of data programmed into the block b0. Here, no data is programmed into the block b0. Therefore, in the info table, the number of data portions corresponding to a block identifier b0 of the block b0 is set to zero.

Page data corresponding to LCA0 is encoded, and the encoded page data is written to the block b0. At this time, the LUT updating processing described below is executed.

Since the number of data portions (info) of the block b0 is zero, as shown in FIG. 38, b0 and 0 are recorded respectively as a block identifier and the number of data portions (info) in an entry on the LUT corresponding to LCA0. Since the page data of LCA0 is written to the block b0, the info of the block b0 is incremented to one in the info table.

Next, it is assumed that writing of data to LCA10 is designated by a second write request (second write command).

At this time, this data is programmed as a second page data portion of the block b0, and b0 and 1 are recorded respectively as a block identifier and the number of data portions (info) in an entry of LCA10 of the LUT. Then, in the info table, the info of block b0 becomes two (FIG. 39).

Figure 40:
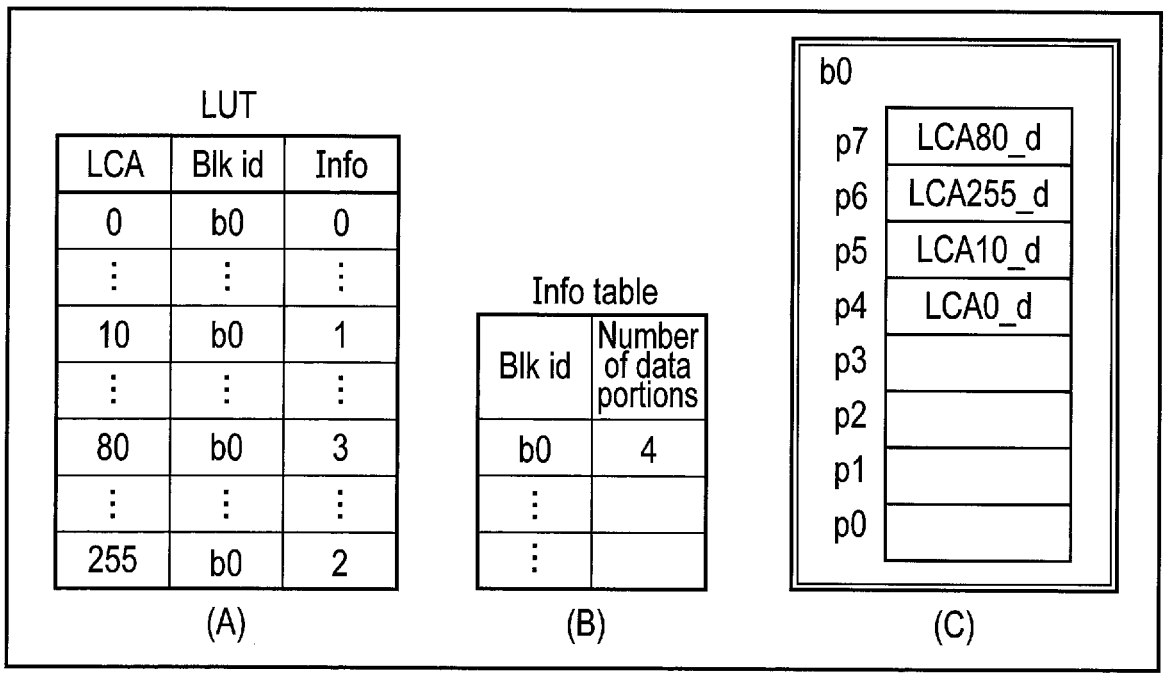
FIG. 40 is a diagram illustrating content of the LUT and the info table in a case where a third data portion and a fourth data portion are written in the block b0.

Subsequently, when writing of data to LCA255 and writing of data to LCA80 are performed in this order, the LUT and the info table are finally updated as shown in FIG. 40. In the block b0, the page data LCA0_*d* corresponding to LCA0 is stored in the page p4, the page data LCA10_*d* corresponding to LCA10 is stored in the page p5, the page data LCA255_*d* corresponding to LCA255 is stored in the page p6, and the page data LCA80_*d* corresponding to LCA80 is stored in the page p7.

At this time, when a read request is input from the host 4 to the memory system 1, the memory controller 2 obtains, from the LUT, a storage location in the nonvolatile memory 3 at which page data corresponding to a logical address designated by the read request is stored. The method is shown as described below.

When this logical address is LCA255, a current storage location of page data can be obtained as described below.

The LUT indicates that page data corresponding to LCA255 is written to the block b0 and the info is two. The number of current page data portions of the block b0 is written as four in the info table. In the present embodiment, the number of pages in a block (the number of pages included in one block) is eight. A page in the block b0 in which the data of LCA255 is stored is calculated from the following equation:

Number of data portions at the time of writing (=info)+(number of pages in a block−number of current data portions)−2+(8−4)=6

As a result, it is found that the data corresponding to LCA255 is stored in the page p6 of the block b0.

Figure 41:
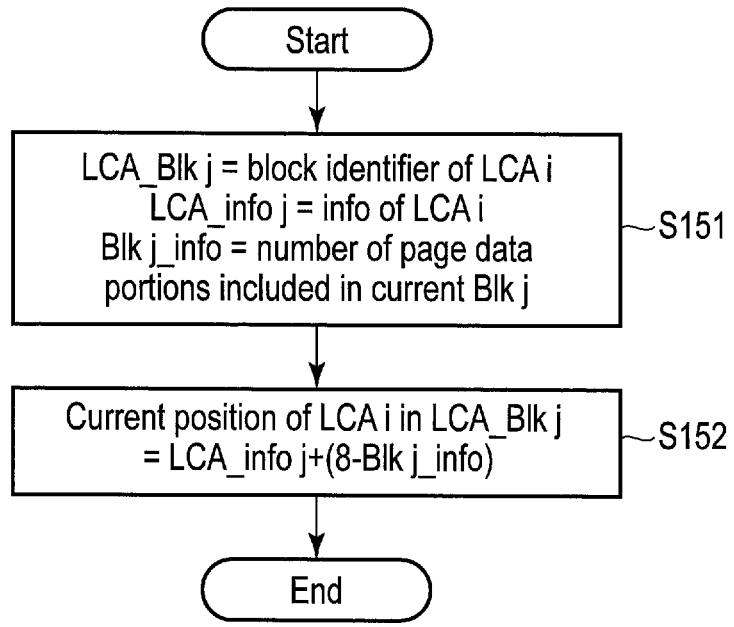
FIG. 41 is a flowchart illustrating a procedure of address resolution processing for logical-to-physical address translation.

A flowchart of FIG. 41 illustrates a procedure of this address resolution processing. Assume that a logical address designated by a read request is LCA*i*.

In Step S151, the memory controller 2 refers to the LUT and acquires a block identifier corresponding to LCA*i* and the info corresponding to LCA*i*. Further, the memory controller 2 acquires, from the info table, the number of page data portions currently stored in a block Blk*j* indicated by the block identifier corresponding to LCA*i*.

Then, the memory controller 2 sets the block identifier corresponding to LCA*i* to a variable LCA_Blk*j*, sets the info corresponding to LCA*i* to a variable LCA_info*j*, and sets the number of page data portions currently stored in the block Blk*j* to a variable Blk*j*_info.

In Step S152, the memory controller 2 obtains a current position (page number) in a block in which data corresponding to LCA*i* is stored, using the following equation:

Current position of LCA*i* in LCA_Blk*j*=LCA_info*j*+ (8−Blk*j*_info)

In the nonvolatile memory 3, when one page data is written to a block, each of all page data portions previously written moves by one page in the direction from the page p7 to the page p0, and, when data of the page p7 of a block is read, each of all of the remaining page data portions moves by one page in the direction from the page p0 to the page p7. For this reason, in order to manage a page in a block each of page data portions designated by host addresses is currently recorded, information update needs to be performed many times. However, in a case where an LUT updating method described here is used, LUT update needs to be performed only once at a timing at which latest data is programmed, and, after that, every time data is written to and read out from a block, only updating of information accompanying each block (the number of current data portions) needs to be performed.

In FIG. 40, the page data (LCA255_*d*) corresponding to LCA255 is stored in the page p6 of the block b0, and by the above address resolution processing, the page number of six in the block b0 in which the data corresponding to the LCA255 is stored is obtained.

When it is found that the page data (LCA255_*d*) corresponding to LCA255 exists in the page p6 of the block b0, the page data (LCA80_*d*) of the page p7 of the block b0 and the page data (LCA255_*d*) of the page p6 the block b0 are read, the page data (LCA80_*d*) of the page p7 and the page data (LCA255_*d*) of the page p6 are decoded.

At this time, if the read page data is the page data (LCA255_*d*) requested from the host 4, the decoded page data is returned to the host 4 and put in the data buffer 25. If the read page data is not the page data (LCA255_*d*) requested from the host 4, the decoded page data is put in the data buffer 25 without being returned to the host 4. The reading of data from the block ends here.

How to write back the page data (LCA80*d*) and the page data (LCA255_*d*) put in the data buffer 25 is not limited in the present embodiment. If all page data portions are returned to locations where all the page data portions have been initially recorded after they are re-encoded in order from one that is most recently read, the update on the LUT is not performed after read processing. When the read page data (LCA255*d*) and the read page data (LCA80*d*) are written back to the block b0 in this order, a state of the block b0 is returned to the same state as the state before these page data portions are read as illustrated in FIG. 40. Therefore, there is no need to update the LUT.

Here, the page data is decoded once and encoded again in order to avoid accumulation of errors. However, if an expected error rate is sufficiently low, lowering the frequency of this decoding and re-encoding can also be considered.

In general, there is possibility that read page data will be read out again. For this reason, all of read page data portions are written back so as to be returned to initially recorded locations.

As described above, if a location to which page data is written back is the same location of the same block as that at the time of read, LUT update is unnecessary. If all of read page data portions are written back to another block, or the same block by changing the order, it is necessary to perform LUT update accordingly. In that case, a value of the info table is decremented as page data is read from a block, and a block identifier and the info corresponding to an LCA of the page data to be written back are updated in accordance with writing (writing back) of the page data to the block, and the value of the info table is incremented.

The page data which can be determined not to be necessarily written back is not written back, a value of the info table corresponding to a block from which this page data is read out is decremented, and a block identifier and the info corresponding to an LCA of the page data are deleted from the LUT.

FIG. 42 illustrates a case where, after the page data (LCA255_d) and the page data (LCA80_d) are written back to the block b0 in this order as illustrated in FIG. 40, the page data (LCA80_d) of LCA80 is read in response to a read request from the host 4, and the page data (LCA80_d) is determined to be unnecessary. For example, an LCA of specific page data that needs to be read only once may be designated in advance by the host 4. In this case, if an LCA designated by a read request from the host 4 matches the LCA of this specific page data, this page data can be determined to be unnecessary after this page data of the LCA designated by this read request is read.

In FIG. 42, after the page data (LCA80_d) of the beginning page p7 in FIG. 40 is read from the block b0, this page data (LCA80_d) is not written back to any block. Therefore, in the LUT, a block identifier and the info corresponding to LCA80 are deleted. Further, in the info table, a value corresponding to block b0 is decremented by one.

Here, a case where page data of the beginning page p7 is not written back to any block has been described. In addition to the above, a value of the info table is decremented in some cases.

For example, in a case where, after read target page data designated by a read request and all the other page data portions stored on an upper page side than the read target page data are read, the read target page data that is read out and all the other page data that are read out are written back to a different block, the number of page data portions decreases in the block, from which these page data portions are read out, by the number of the read page data portions. In this case, a value of the info table corresponding to this block is decremented by the number of the read page data portions.

A flowchart of FIG. 43 shows a procedure of processing of decrementing a value of the info table.

If all of read page data portions are not written back to a block from which these page data portions have been read, the memory controller 2 sets [8−(current position in LCA_Blk)] to a variable k (Step S161), and the number of page data portions (Blkj_info) corresponding to this block is decremented by k (Step S162).

Next, processing executed using a data shift counter will be described.

In preparation for the fact that the greater the number of shifts in a block is, the higher a defective rate of data becomes, it is conceivable to use a data shift counter (for data life) for each block for a refreshing purpose before uncorrectable errors accumulate in oldest data of each block.

That is, in the present embodiment, like the second embodiment, when the read target data designated by the host 4 is only part of a plurality of page data portions stored in a certain block, not all the page data portions in this block, but at least minimum required one or more of page data portions necessary for read of the read target data are read. Therefore, there is possibility that, while page data that is input first to a block is shifted every time reading and writing (including rewriting) of other page data is performed, the page data that is input first to the block is not read out for a long period of time. As the number of shifts of this page data increases, there is possibility that an error amount included in the page data increases. In the present embodiment, in order to protect oldest data in each block, a data shift counter is managed for each block.

The data shift counter for each block is information indicating how many times lowermost page data (oldest data) among one or more page data portions stored in each block is shifted.

The data shift counter is incremented by one for each shift in the block. When page data first written to a certain block is read out from this block and there is no valid page data is this block, a data shift counter corresponding to this block is reset to zero.

When page data is written to a block, a data shift counter of this block is incremented. Moreover, also when page data is read out from this block, the data shift counter of this block is incremented.

A value of a data shift counter may indicate the number of actual shifts performed in a unit of a layer or may indicate the number of times of write or read of 4-KB data (page data).

As writing processing and reading processing are repeatedly executed in response to a read request and a write request received from the host 4, it is assumed that a value of a data shift counter of a certain block satisfies a certain condition (refresh condition). For example, when a value of a data shift counter of a certain block exceeds a certain threshold value, it is determined that the value of the data shift counter of this block satisfies this refresh condition.

The memory controller 2 may periodically execute patrolling processing for checking a value of a data shift counter of each block. In the patrolling processing, a value of a data shift counter of a block to be checked is compared with a threshold value. If the value of the data shift counter of the block to be checked exceeds the threshold value, it is estimated that an error is accumulated in oldest page data written in this block. In this case, the memory controller 2 reads all of page data portions (all of valid page data portions) in this block from the nonvolatile memory 3. Then, the memory controller 2 writes each of page data portions obtained by correcting an error of each of read page data portions back to the same block as a block from which the page data portions are read or another block.

Instead of the patrolling processing or in addition to the patrolling processing, processing described below may be executed.

When receiving a read request from the host 4, the memory controller 2 determines whether or not a value of a data shift counter of a block in which read target data designated by the read request is stored satisfies the refresh condition. In this case, the memory controller 2 may determine whether or not a value obtained by adding the number of shifts required when reading page data portions necessary for reading read target data and writing back of these page data portions are performed to a value of a current data shift counter of this block exceeds a threshold value.

In a case where the added value exceeds the threshold value, if the read processing and the writing back processing are performed in a normal process, the number of shifts of oldest data stored in the block exceeds the threshold value. Therefore, when the added value exceeds the threshold value, the memory controller 2 reads all of page data portions (all of valid page data portions) in this block. Then, the memory controller 2 writes each of page data portions obtained by correcting an error of each of read page data portions back to the same block as a block from which the page data portions are read or another block.

FIG. 44 illustrates operation of managing a data shift counter indicating the number of times that oldest page data among written page data portions is shifted for each of a plurality of blocks.

In FIG. 44, for simplicity of illustration, two blocks b0 and b100 are focused. In the block b0, the page p0 is a page (blank page) in which page data is not stored. The page data (LCA99_$d$) corresponding to LCA99, the page data (LCA40_$d$) corresponding to LCA40, the page data (LCA20$d$) corresponding to LCA20, the page data (LCA0_$d$) corresponding to LCA0, the page data (LCA10_$d$) corresponding to LCA10, the page data (LCA255_$d$) corresponding to LCA255, and the page data (LCA80$d$) corresponding to LCA80 are stored in the pages p1, p2, p3, p4, p5, p6, and p7, respectively. Among these page data portions, the page data (LCA99_$d$) of the page p1 positioned lowermost is oldest data of the block b0.

The block b100 is a free block not including valid data.

It is assumed that LCA40 is designated by a read request received from the host 4. In this case, read target data is the page data (LCA40_$d$) stored in the page p2 of the block b0. When the upper limit of the number of times data is shifted in a block is set to 5000, a value of a current data shift counter of the block b0 is 4700, and the number of shifts performed to read the page data (LCA40$d$) is 216 since it is the configuration of FIG. 3 (the number of layers per page=36). When the page data portions of the pages p7 to p2 are read and written back, twice the number of shifts is required. That is, the number of shifts of LCA99_$d$ positioned lowermost of the block b0 exceeds 5000. Therefore, at the timing of the reading, all of page data portions of the block b0 may be read and copied to the free block b100.

When all of the page data portions of the block b0 are copied to the block b100, the number of shifts required for writing these page data portions is set in a data shift counter of the block b100 as shown in FIG. 45. On the other hand, a value of a data shift counter of the block b0 is reset to zero because oldest data, that is, the page data (LCA99_$d$) of the page p1 is read out.

At this time, with respect to a copy source block, up to how many pieces of page data portions at the maximum from the top need to be copied can be found based on "data number information indicating how many pieces of data are currently written" held for each block. If it is possible to distinguish between invalid data and valid data by referring to LUT information or other information, the number of data portions that need to be actually copied decreases. When copying is finished, the LUT is updated based on movement of these pieces of data.

At this time, as in the first embodiment, it is preferable that a block selected as a copy destination block (write-back destination block) is selected from blocks of comparatively less exhaustion. Therefore, it is conceivable to hold a block shift counter for each block. In the first embodiment, as an example of a block shift counter, it has been described that the block shift counter is incremented by one for each time of read performed in units of blocks or each time of writing performed in units of blocks. However, in the present embodiment, since data is shifted in units of pages, the block shift counter may be incremented by one for each time of reading performed in a unit of a page or each time of writing performed in a unit of a page. Alternatively, the block shift counter may be incremented by one for each time of reading performed in a unit of a layer or each time of writing performed in a unit of a layer.

As in the first to second embodiments, also in the present embodiment, it is possible to suppress unbalance of wear between blocks by control, such as that a block in which a value of a block shift counter is extremely larger than values of the other blocks is not selected as a copy destination block (write-back destination block).

A flowchart of FIG. 46 illustrates a procedure of a refresh operation for reading page data portions in a block in which a value of a data shift counter exceeds a threshold value.

The memory controller 2 determines whether or not a value of a data shift counter of a certain block i exceeds a threshold value (Step S171). If the value of the data shift counter of the block i exceeds the threshold value (YES in Step S171), the memory controller 2 read all of page data portions of the block i (Step S172), and resets the value of the data shift counter of this block i (Step S173). The memory controller 2 decodes each of the read page data portions, corrects errors in each of the page data portions, and re-encodes each of the decoded page data portions (Step S174). The memory controller 2 writes back each of the re-encoded page data portions to the block i or another available block (free block) different from the block i (Step S175). In Step S175, based on a data shift counter of the block i and a data shift counter of each of the other usable blocks, the memory controller 2 selects a block to which these pieces of page data are be written back.

As described above, according to the LUT management in the third embodiment, when page data (a write data portion) associated with a write request received from the host 4 is written to a certain block (first write destination block), a correspondence relationship between an LCA designated by the write request, a block identifier of this block, and data number information indicating the number of page data portions have been written to this block before the page data is written is managed by using the LUT (address translation table). Then, when a read request designating an LCA of read target page data portions is received from the host 4, a block identifier and data number information corresponding to the LCA of the read target page data portion are acquired from the LUT. A block corresponding to the acquired block identifier is identified as a read target block in which the read target page data portion is stored. Further, based on the number of page data portions currently have been written to the block corresponding to the block identifier (the current number of data portions) and the number of pieces page data portions indicated by the acquired data number information, a page in the read target block in which the read target page portion is stored.

Accordingly, the LUT update needs to be performed only once at timing at which latest data is programmed, and, after that, every time data is written to and read from a block, only updating of information accompanying each block (current number of data portions) needs to be performed.

Further, in the third embodiment, a data shift counter is managed for each block. With this data shift counter, it is possible to correct an error of each of page data portions in a block before uncorrectable errors are accumulated in oldest data in the block. Therefore, it is possible to prolong the life of oldest data.

Note that code amount distribution, a block shift counter, cache control, the LUT management, and a data shift counter of an error correction code explained in the first to third embodiments can be used in combination as appropriate.

Note that, in each of the embodiments, a magnetic domain wall memory is exemplified as a nonvolatile memory. However, each of the embodiments can also be applied to various types of nonvolatile memories for which write and read of data are performed by the last-in first-out method.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a nonvolatile memory including a plurality of blocks each including a plurality of layers functioning as a plurality of stages of a shift register, and configured to perform write and read of data for each block by a last-in first-out method by shifting, in a unit of a layer, data stored in individual layers in a first direction from a layer corresponding to a first stage to a layer corresponding to a last stage or in a second direction opposite to the first direction; and
a controller configured to write a plurality of data portions to which error correction codes are added, to write destination blocks in the blocks, wherein
the layers of each block are logically partitioned into a plurality of pages each including a set of adjacent layers, and
the controller is configured to change a code amount of an error correction code added to a first data portion to be written, on the basis of a position of a page in the writing destination block where the first data portion is to be stored.

2. The memory system according to claim 1, wherein the controller is configured to:
increase a code amount of an error correction code added to the first data portion in a case where the position of the page in the write destination block where the first data portion is stored corresponds to a last page corresponding to a set of layers including a layer of the last stage; and
decrease a code amount of an error correction code added to the first data portion in a case where the position of the page in the write destination block where the first data portion is stored corresponds to a beginning page corresponding to a set of layers including a layer of the first stage.

3. The memory system according to claim 1, wherein in a case where a plurality of data portions corresponding to capacity of the write destination block are written to the write destination block, the controller changes a code amount of an error correction code to be added to the first data portion, on the basis of order of input of the first data portion to the write destination block.

4. The memory system according to claim 1, wherein the controller is configured to:
write a plurality of data portions corresponding to capacity of the write destination block to the write destination block;
read data portions stored in all pages of a first block in which a read target data portion designated by a read request received from a host is stored;
return the read target data portion among the read data portions to the host; and
write back the read data portions to the first block or another block different from the first block.

5. The memory system according to claim 4, wherein the controller is configured to:
manage, for each of the blocks, a counter value indicating a cumulative value of the number of times operation of shifting data is performed; and
write back the read data portions to another block having a counter value less than a counter value of the first block when the counter value of the first block is greater than a reference value determined based on counter values of the blocks.

6. The memory system according to claim 1, wherein the controller is configured to:
write a plurality of data portions corresponding to capacity of the write destination block to the write destination block;
read, one by one, data portions stored in all pages of a first block in which a read target data portion designated by a read request received from a host is stored;
return one data portion read from the first block to the host when the one data portion is the read target data portion;
write back data portions read one by one from the first block to another block different from the first block, one by one; and
hold information indicating that data portions is arranged in the other block in reverse order to arrangement of the data portions in the first block.

7. A memory system, comprising:
a nonvolatile memory including a plurality of blocks each including a plurality of layers functioning as a plurality of stages of a shift register, and configured to perform write and read of data for each block by a last-in first-out method by shifting, in a unit of a layer, data stored in individual layers in a first direction from a layer corresponding to a first stage to a layer corresponding to a last stage or in a second direction opposite to the first direction; and
a controller configured to control the nonvolatile memory, wherein
the layers of each block are logically partitioned into a plurality of pages each including a set of adjacent layers, and
the controller is configured to:
when a read target data portion designated by a read request received from a host is stored in a first page of a first block,
read the read target data portion stored in the first page and one or more data portions stored in all of one or more other pages positioned closer to a layer corresponding to the first stage than the first page,
return, to the host, the read target data portion that is read;
write back the read one or more other data portions to the first block; and
write back the read target data portion that is read to the first block at last so that the read target data portion is written to a beginning page corresponding to a set of layers including a layer of the first stage of the first block, or to another block different from the first block so that the read target data portion that is read is written to a beginning page of the other block.

8. The memory system according to claim 7, wherein the controller is configured to:
identify a beginning page storing a data portion for which a longest time period elapsed since a last access by the host among beginning pages corresponding respectively to a plurality of blocks including the first block; and
select a block including the identified beginning page as a block to which the read target data portion that is read is to be written back.

9. The memory system according to claim 8, wherein the controller is configured to:
when a write request is received from the host, identify a beginning page storing a data portion for which a longest time period elapsed since a last access by the host among beginning pages corresponding to a plurality of blocks, and
write a data portion associated with the write request to a block including the identified beginning page.

10. The memory system according to claim 7, wherein the controller is configured to:
manage a plurality of input buffers each including two or more blocks selected from a set of available blocks; and
when receiving a write request from the host:
select one of the input buffers according to a logical address designated by the write request;
identify a beginning page storing a data portion for which a longest time period has elapsed since a last access by the host among beginning pages corresponding to two or more blocks included in the selected input buffer; and
write a data portion associated with the write request to a block including the identified beginning page.

11. The memory system according to claim 10, wherein the controller is configured to execute, in a case where old data corresponding to a logical address designated by the write request is stored in a beginning page of another block different from blocks in the selected input buffer, operation of reading the old data stored in the beginning page of the other block and operation of writing the data portion associated with the write request to the beginning page of the other block from which the old data is read.

12. A memory system, comprising:
a nonvolatile memory including a plurality of blocks each including a plurality of layers functioning as a plurality of stages of a shift register, and configured to perform write and read of data for each block by a last-in first-out method by shifting, in a unit of a layer, data stored in individual layers in a first direction from a layer corresponding to a first stage to a layer corresponding to a last stage or in a second direction opposite to the first direction; and
a controller configured to control the nonvolatile memory, wherein
the layers of each block are logically partitioned into a plurality of pages each including a set of adjacent layers, and
the controller is configured to:
manage, for each of the blocks, the number of data portions currently written;

manage, when writing a write data portion associated with a write request received from a host to a first write destination block in the blocks, a corresponding relationship between a logical address designated by the write request, a block identifier of the first write destination block, and data number information indicating the number of data portions which have been written to the first write destination block before the write data portion is written, by using an address translation table; and
acquire, when receiving a read request designating a logical address of a read target data portion from the host, a block identifier and data number information corresponding to a logical address of the read target data portion from the address translation table, identify a block corresponding to the acquired block identifier as a block where the read target data portion is stored, and identify a page in the identified block storing the read target data portion based on the number of data portions currently written to the block corresponding to the block identifier and the number of data portions indicated by the acquired data number information.

13. The memory system according to claim 12, wherein the controller is configured to store, in the address translation table, the number of data portions currently written to the first write destination block as the number of data portions which have been written to the first write destination block before the write data portion is written.

14. A memory system, comprising:
a nonvolatile memory including a plurality of blocks each including a plurality of layers functioning as a plurality of stages of a shift register, and configured to perform write and read of data for each block by a last-in first-out method by shifting, in a unit of a layer, data stored in individual layers in a first direction from a layer corresponding to a first stage to a layer corresponding to a last stage or in a second direction opposite to the first direction; and
a controller configured to control the nonvolatile memory, wherein
the layers of each block are logically partitioned into a plurality of pages each including a set of adjacent layers, and
the controller is configured to:
manage, for each of the blocks, a counter value indicating a cumulative value of the number of times operation of shifting data is performed; and
copy data portions stored in pages of a first block having a counter value exceeding a reference value determined based on counter values of the blocks to another block having a smaller counter value than the first block.

15. The memory system according to claim 14, wherein the controller is configured to:
write a plurality of data portions corresponding to capacity of each block to a write destination block of the blocks;
read data portions stored in all pages of a read target block in which a read target data portion designated by a read request received from a host is stored;
return the read target data portion among the read data portions to the host; and
write back the read data portions to the read target block or another block different from the read target block.

16. The memory system according to claim 15, wherein the controller is configured to:

write back the read data portions to another block when a counter value corresponding to the read target block exceeds the reference value; and write back the read data portions to the read target block when a counter value corresponding to the read target block does not exceed the reference value.

17. A memory system, comprising:

a nonvolatile memory including a plurality of blocks each including a plurality of layers functioning as a plurality of stages of a shift register and configured to perform write and read of data for each block by a last-in first-out method by shifting, in a unit of a layer, data stored in individual layers in a first direction from a layer corresponding to a first stage to a layer corresponding to a last stage or in a second direction opposite to the first direction; and a controller configured to control the nonvolatile memory, wherein the layers of each block are logically partitioned into a plurality of pages each including a set of adjacent layers, and the controller is configured to:

manage, for each of the blocks, a counter value indicating the number of times an oldest data portion in a block is shifted; and read, when a counter value corresponding to a first block in the blocks exceeds a threshold value, data portions written to pages of the first block and write back data portions obtained by correcting an error of the read data portions to the first block or another block different from the first block.

18. The memory system according to claim 17, wherein the controller is configured to:

when a read target data portion designated by a read request received from a host is stored in a first page of one block among the blocks:

read the read target data portion stored in the first page and one or more other data portions stored in all one or more other pages positioned closer to a layer corresponding to the first stage than the first page;

return the read target data portion that is read to the host; and write back the read data portion that is read and the one or more other data portions that are read to the one block or a block different from the one block.

19. The memory system according to claim 18, wherein the controller is configured to:

read, when a value obtained by adding the number of times of shifting required in a case where read and write back of data portions necessary for reading the read target data portion are performed, to a counter value of the one block including the read target data portion exceeds the threshold value, data portions stored in pages of the one block and write back the read data portions to the one block or a block different from the one block.

\* \* \* \* \*